United States Patent [19]
Handa et al.

[11] Patent Number: 6,067,259
[45] Date of Patent: May 23, 2000

[54] METHOD AND DEVICE FOR REPAIRING ARRAYS WITH REDUNDANCY

[75] Inventors: Keiichi Handa, Tokyo; Kazuhito Haruki, Yokohama, both of Japan

[73] Assignee: Kabushiki Kaisha Toshiba, Kawasaki, Japan

[21] Appl. No.: 09/093,729

[22] Filed: Jun. 9, 1998

[30] Foreign Application Priority Data

| | | | |
|---|---|---|---|
| Jun. 10, 1997 | [JP] | Japan | 9-152593 |
| Dec. 18, 1997 | [JP] | Japan | 9-349350 |
| May 1, 1998 | [JP] | Japan | 10-122138 |

[51] Int. Cl.[7] .................................................. G11C 7/00
[52] U.S. Cl. ...................................... 365/200; 365/230.03
[58] Field of Search ............................... 365/200, 230.03

[56] References Cited

U.S. PATENT DOCUMENTS

| | | | |
|---|---|---|---|
| 4,908,798 | 3/1990 | Urai | 365/230.03 |
| 5,859,804 | 1/1999 | Hedberg et al. | 365/201 |

OTHER PUBLICATIONS

N. Hasan, et al., "Minimum Fault Covering in Reconfigurable Arrays", Integration, the VLSI journal 11(1991), pp. 215–234.

Chor–Ping Low, et al., "Minimum Fault Coverage in Memory Arrays: A Fast Algorithm and Probabilistic Analysis", IEEE Transactions on Computer–aided Design of Integrated Circuits and Systems, vol. 15, No. 6, Jun. 1996, pp. 681–690.

S.Y.Kuo, et al., "Efficient Spare Allocation for Reconfigurable Arrays", IEEE Design & Test, vol. 4, No. 1, Feb. 1987, pp. 24–31.

W.K. Fuchs, et al., "Defect–and Fault–Tolerant Memories– Diagnosis and Repair of Large Memories: A Critical Review and Recent Results", Proc. Int'l Workshop on Defect and Fault Tolerance in VLSI Systems, (1989), pp. 213–225.

*Primary Examiner*—David Nelms
*Assistant Examiner*—Hoai V. Ho
*Attorney, Agent, or Firm*—Oblon, Spivak, McClelland, Maier & Neustadt, P.C.

[57] ABSTRACT

A fault repair method including the steps of providing second memory cells as spare lines for repairing faulty elements of first memory cells for storing data therein, setting virtual third memory cells with respect to a repair target including said first memory cells and the second memory cells, and repairing the faulty elements of the first memory cells and the second memory cells by using the virtual third cells.

16 Claims, 39 Drawing Sheets

FIG. 9

|    | C1 | C2 | C3 | C4 | C5 | C6 | C7 | C8 |
|----|----|----|----|----|----|----|----|----|
| R1 | 0  | 0  | 0  | 0  | 0  | 1  | 1  | 0  |
| R2 | 0  | 0  | 0  | 0  | 0  | 0  | 0  | 0  |
| R3 | 0  | 0  | 1  | 0  | 0  | 0  | 0  | 0  |
| R4 | 0  | 0  | 0  | 1  | 0  | 0  | 0  | 0  |
| R5 | 0  | 1  | 0  | 0  | 1  | 1  | 1  | 1  |
| R6 | 1  | 0  | 0  | 1  | 0  | 0  | 0  | 0  |

FIG. 10

LINES OF MATRIX A TO BE REPAIRED
R3, R5, C4, C6,
SPARE LINES USABLE FOR REPAIR
R1, R6, C2, C8,
(SPARE LINES OF MATRIX A UNUSABLE FOR REPAIR; C1, C7)

(R5, C4: LINE FAILS)

FIG. 11

|    | C1 | C2 | C3 | C4 | C5 | C6 | C7 | C8 |
|----|----|----|----|----|----|----|----|----|
| R1 | 0  | 0  | 0  | 0  | 0  | 1  | 1  | 0  |
| R2 | 0  | 0  | 0  | 0  | 0  | 0  | 0  | 0  |
| R3 | 0  | 0  | 1  | 0  | 0  | 0  | 0  | 0  |
| R4 | 0  | 0  | 0  | 1  | 0  | 0  | 0  | 0  |
| R5 | 0  | 1  | 0  | 0  | 1  | 1  | 1  | 1  |
| R6 | 1  | 0  | 0  | 1  | 0  | 0  | 0  | 0  |

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| 1 | 0 | 1 | 0 | 0 | 0 | 0 | 0 | 0 | 0 | 0 | 0 | 0 | 0 | 0 | 0 | 0 | 0 | 0 | 0 | 0 | 0 | 1 | 1 | 0 | 0 | 0 | 0 | 0 | 0 | 0 |
| 2 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 4 | 0 | 0 | 0 | 1 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 0 | 0 | 0 | 0 |
| 5 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 6 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 7 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 8 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 9 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 10 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 0 | 0 |
| 11 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 12 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 16 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 17 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 |
| 18 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| 19 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 20 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 21 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 22 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| 23 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 24 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 25 | 0 | 1 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 26 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 27 | 0 | 0 | 0 | 1 | 0 | 1 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| 28 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 29 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 30 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 16

| | |
|---|---|
| row: 1 | column: 2 |
| row: 1 | column: 22 |
| row: 1 | column: 23 |
| row: 2 | column: 17 |
| row: 4 | column: 4 |
| row: 4 | column: 10 |
| row: 4 | column: 19 |
| row: 7 | column: 17 |
| row: 10 | column: 7 |
| row: 10 | column: 24 |
| row: 10 | column: 25 |
| row: 10 | column: 26 |
| row: 10 | column: 27 |
| row: 10 | column: 28 |
| row: 12 | column: 17 |
| row: 14 | column: 14 |
| row: 16 | column: 10 |
| row: 17 | column: 6 |
| row: 17 | column: 10 |
| row: 18 | column: 27 |
| row: 21 | column: 17 |
| row: 22 | column: 27 |
| row: 25 | column: 2 |
| row: 25 | column: 15 |
| row: 27 | column: 4 |
| row: 27 | column: 6 |
| row: 27 | column: 19 |
| row: 29 | column: 22 |

FIG. 17

| TYPE | UPPER SPARE ROW | LOWER SPARE ROW | LEFT SPARE COLUMN | RIGHT SPARE COLUMN |
|---|---|---|---|---|
| REMAINDER | 3 | 3 | 3 | 3 |

FIG. 18A

| TYPE | UPPER SPARE ROW | LOWER SPARE ROW | LEFT SPARE COLUMN | RIGHT SPARE COLUMN |
|---|---|---|---|---|
| REMAINDER | 2 | 3 | 3 | 3 |

FIG. 18B

| LINE | r10 |
|---|---|

FIG. 18C

| TYPE | UPPER SPARE ROW | LOWER SPARE ROW | LEFT SPARE COLUMN | RIGHT SPARE COLUMN |
|---|---|---|---|---|
| REMAINDER | 2 | 3 | 3 | 2 |

FIG. 18D

| LINE | r10, c17 |
|---|---|

FIG. 18E

| TYPE | UPPER SPARE ROW | LOWER SPARE ROW | LEFT SPARE COLUMN | RIGHT SPARE COLUMN |
|---|---|---|---|---|
| REMAINDER | 1 | 2 | 3 | 1 |

FIG. 18F

| LINE | r10, c17, r1, r25, c27 |
|---|---|

FIG. 18G

| TYPE | UPPER SPARE ROW | LOWER SPARE ROW | LEFT SPARE COLUMN | RIGHT SPARE COLUMN |
|---|---|---|---|---|
| REMAINDER | 1 | 1 | 2 | 1 |

FIG. 18H

| LINE | r10, c17, r1, r25, c27 r29, c14 |
|---|---|

FIG. 18I

| TYPE | UPPER SPARE ROW | LOWER SPARE ROW | LEFT SPARE COLUMN | RIGHT SPARE COLUMN |
|---|---|---|---|---|
| REMAINDER | 0 | 0 | 0 | 1 |

FIG. 18J

| LINE | r10, c17, r1, r25, c27 r29, c14, r4, r27, c6, c10 |
|---|---|

| FAULTY ELEMENTS | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| ROW ADDRESS | 1 | 1 | 1 | 4 | 4 | 4 | 14 | 16 | 17 | 17 | 18 | 22 | 25 | 25 | 27 | 27 | 27 | 29 |
| COLUMN ADDRESS | 2 | 22 | 23 | 4 | 10 | 19 | 14 | 10 | 6 | 10 | 27 | 27 | 2 | 15 | 4 | 6 | 19 | 22 |
| SUBBLOCK NUMBER | 1 | 3 | 3 | 1 | 1 | 3 | 1 | 2 | 2 | 2 | 4 | 4 | 2 | 2 | 2 | 2 | 4 | 4 |

FIG. 21

|    | 2 | 4 | 6 | 10 | 14 | 15 | 19 | 22 | 23 | 27 |
|----|---|---|---|----|----|----|----|----|----|----|
| 1  | 1 | 0 | 0 | 0  | 0  | 0  | 0  | 1  | 1  | 0  |
| 4  | 0 | 1 | 0 | 1  | 0  | 0  | 1  | 0  | 0  | 0  |
| 14 | 0 | 0 | 0 | 0  | 1  | 0  | 0  | 0  | 0  | 0  |
| 16 | 0 | 0 | 0 | 1  | 0  | 0  | 0  | 0  | 0  | 0  |
| 17 | 0 | 0 | 1 | 1  | 0  | 0  | 0  | 0  | 0  | 0  |
| 18 | 0 | 0 | 0 | 0  | 0  | 0  | 0  | 0  | 0  | 1  |
| 22 | 0 | 0 | 0 | 0  | 0  | 0  | 0  | 0  | 0  | 1  |
| 25 | 1 | 0 | 0 | 0  | 0  | 1  | 0  | 0  | 0  | 0  |
| 27 | 0 | 1 | 1 | 0  | 0  | 0  | 1  | 0  | 0  | 0  |
| 29 | 0 | 0 | 0 | 0  | 0  | 0  | 0  | 1  | 0  | 0  |

FIG. 22

| ROW ADDRESS | 1 | 4 | 14 | 16 | 17 | 18 | 22 | 25 | 27 | 29 |
|---|---|---|---|---|---|---|---|---|---|---|
| COLUMN ADDRESS | 2, 22, 23 | 4, 10, 19 | 14 | 10 | 6, 10 | 27 | 27 | 2, 15 | 4, 6, 19 | 22 |

| ROW ADDRESS | 2 | 4 | 6 | 10 | 14 | 15 | 19 | 22 | 23 | 27 |
|---|---|---|---|---|---|---|---|---|---|---|
| COLUMN ADDRESS | 1, 25 | 4, 27 | 17, 27 | 4, 16, 17 | 14 | 25 | 4, 27 | 1, 29 | 1 | 18, 22 |

| FAULTY ELEMENTS | 3 | 4 | 7 | 8 | 9 | 11 | 13 | 17 | 18 |
|---|---|---|---|---|---|---|---|---|---|
| ROW ADDRESS | 1 | 4 | 14 | 16 | 17 | 18 | 25 | 27 | 29 |
| COLUMN ADDRESS | 23 | 4 | 14 | 10 | 6 | 27 | 2 | 19 | 22 |

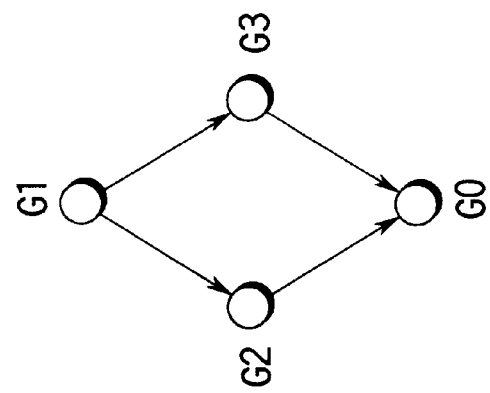
FIG. 27C CONTRACTED GRAPH GPM
FIG. 27B DM DECOMPOSITION
FIG. 27A

```
      23 2 15 4 19 6 10 14 22 27
   1   1 1  1 0  0 0  0  0  0  0
  25   0 1  1 0  0 0  0  0  0  0
   4   0 0  0 1  1 0  1  0  0  0
  27   0 0  0 1  1 1  0  0  0  0
  17   0 0  0 0  0 1  1  0  0  0
  16   0 0  0 0  0 0  1  0  0  0
  14   0 0  0 0  0 0  0  1  0  0
  29   0 0  0 0  0 0  0  0  1  0
  22   0 0  0 0  0 0  0  0  0  1
  18   0 0  0 0  0 0  0  0  0  1
```

| ENTRY | 1 | 2 | 3 | 4 | 5 | 6 | 7 |
|---|---|---|---|---|---|---|---|
| INDEX i OF Gi | 1 | 2 | 3 | 4 | 5 | 6 | 0 |
| ADJACENT VERTICES | 6 | 3,4 | 4 | null | null | null | null |
| REVERSELY ADJACENT VERTICES | null | null | 2 | 2,3 | null | 1 | null |
| ROW NUMBER OF Gi | 1,8 | 2,9 | 5 | 4 | 3 | 10 | 7,6 |
| COLUMN NUMBER OF Gi | 9,1,6 | 2,7 | 3 | 4 | 5 | 8 | 10 |

FIG. 31A

|    | 23 | 2 | 15 | 4 | 19 | 6 | 10 | 14 | 22 | 27 |
|----|----|---|----|---|----|---|----|----|----|----|
| 1  | 1  | 1 | 0  | 0 | 0  | 0 | 0  | 0  | 1  | 0  |
| 25 | 0  | 1 | 1  | 0 | 0  | 0 | 0  | 0  | 0  | 0  |
| 4  | 0  | 0 | 0  | 1 | 1  | 0 | 1  | 0  | 0  | 0  |
| 27 | 0  | 0 | 0  | 1 | 1  | 1 | 0  | 0  | 0  | 0  |
| 17 | 0  | 0 | 0  | 0 | 0  | 1 | 1  | 0  | 0  | 0  |
| 16 | 0  | 0 | 0  | 0 | 0  | 0 | 1  | 0  | 0  | 0  |
| 14 | 0  | 0 | 0  | 0 | 0  | 0 | 0  | 1  | 0  | 0  |
| 29 | 0  | 0 | 0  | 0 | 0  | 0 | 0  | 0  | 1  | 0  |
| 22 | 0  | 0 | 0  | 0 | 0  | 0 | 0  | 0  | 0  | 1  |
| 18 | 0  | 0 | 0  | 0 | 0  | 0 | 0  | 0  | 0  | 1  |

FIG. 31B

|    | 23 | 2 | 15 | 4 | 19 | 6 | 10 | 14 | 22 | 27 |
|----|----|---|----|---|----|---|----|----|----|----|
| 1  | 1  | 1 | 0  | 0 | 0  | 0 | 0  | 0  | 1  | 0  |
| 25 | 0  | 1 | 1  | 0 | 0  | 0 | 0  | 0  | 0  | 0  |
| 4  | 0  | 0 | 0  | 1 | 1  | 0 | 1  | 0  | 0  | 0  |
| 27 | 0  | 0 | 0  | 1 | 1  | 1 | 0  | 0  | 0  | 0  |
| 17 | 0  | 0 | 0  | 0 | 0  | 1 | 1  | 0  | 0  | 0  |
| 16 | 0  | 0 | 0  | 0 | 0  | 0 | 1  | 0  | 0  | 0  |
| 14 | 0  | 0 | 0  | 0 | 0  | 0 | 0  | 0  | 0  | 0  |
| 29 | 0  | 0 | 0  | 0 | 0  | 0 | 0  | 0  | 1  | 0  |
| 22 | 0  | 0 | 0  | 0 | 0  | 0 | 0  | 0  | 0  | 1  |
| 18 | 0  | 0 | 0  | 0 | 0  | 0 | 0  | 0  | 0  | 1  |

FIG. 31C

|    | 23 | 2 | 15 | 4 | 19 | 6 | 10 | 14 | 22 | 27 |
|----|----|---|----|---|----|---|----|----|----|----|
| 1  | 1  | 1 | 0  | 0 | 0  | 0 | 0  | 0  | 1  | 0  |
| 25 | 0  | 1 | 1  | 0 | 0  | 0 | 0  | 0  | 0  | 0  |
| 4  | 0  | 0 | 0  | 1 | 1  | 0 | 1  | 0  | 0  | 0  |
| 27 | 0  | 0 | 0  | 1 | 1  | 1 | 0  | 0  | 0  | 0  |
| 17 | 0  | 0 | 0  | 0 | 0  | 1 | 1  | 0  | 0  | 0  |
| 16 | 0  | 0 | 0  | 0 | 0  | 0 | 1  | 0  | 0  | 0  |
| 14 | 0  | 0 | 0  | 0 | 0  | 0 | 0  | 1  | 0  | 0  |
| 29 | 0  | 0 | 0  | 0 | 0  | 0 | 0  | 0  | 1  | 0  |
| 22 | 0  | 0 | 0  | 0 | 0  | 0 | 0  | 0  | 0  | 1  |
| 18 | 0  | 0 | 0  | 0 | 0  | 0 | 0  | 0  | 0  | 1  |

FIG. 37C INCIDENCE MATRIX K

FIG. 37B BIPARTITE GRAPH G

FIG. 37A MATRIX B

FIG. 39A → FIG. 39B
FIG. 39D ← FIG. 39C

FIG. 40A

| LOT ID | WAFER ID | CHIP ID | BLOCK ID | ADDRESS DATA OF FAULTY ELEMENTS |
|---|---|---|---|---|

FIG. 40B

| LOT ID | WAFER ID | CHIP ID | BLOCK ID | ADDRESS DATA OF FAULTY ELEMENTS EXCEPT FOR LINE FAILS | ADDRESS DATA OF LINE FAILS |
|---|---|---|---|---|---|

FIG. 40C

| TYPE ID | DATA OF WAFER | DATA OF CHIP | DATA OF BLOCK |
|---|---|---|---|
| ○○○ | ○○○CHIPS/WAFER | ○×○BLOCKS/CHIP | ADDRESS RANGE OF EACH OF MEMORY BLOCK, SPARE LINE AND LIMBO, AND INFORMATION INDICATING CONSTRAINT FOR SPARE LINES, ETC. |

FIG. 47
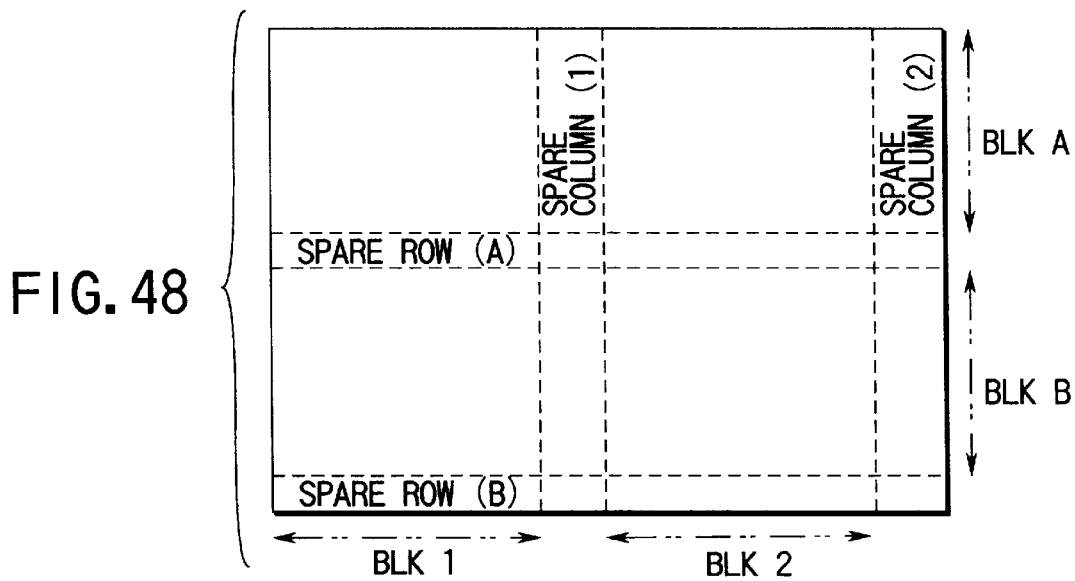
FIG. 48
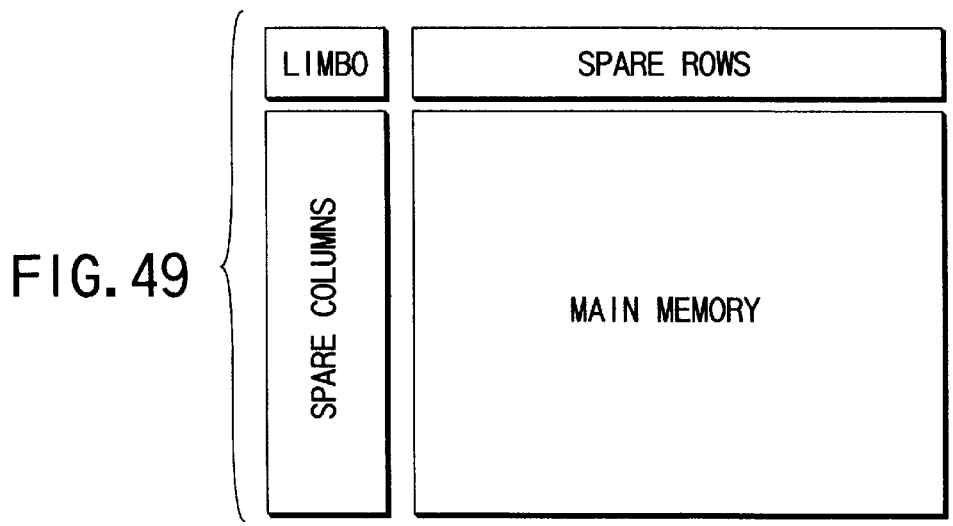
FIG. 49

METHOD AND DEVICE FOR REPAIRING ARRAYS WITH REDUNDANCY

BACKGROUND OF THE INVENTION

The present invention relates to method and device for repairing arrays with redundancy, in which the repair solution for repairing the faults of memory cells by the use of spare cells (lines) is obtained.

Conventionally, when the density of semiconductor memories known as Random Access Memories (RAMs) was not so high, even if some bit faults took place, such inconveniences were overcome by the improvement of the manufacturing conditions etc.

However, as semiconductor memories were increased in capacity, there has come to be developed the technique according to which, not only the elimination of bit faults is intended, but also, on the premise that some bit faults will take place, spare lines are provided for repairing such bit faults (replacing the lines containing the bit faults). It is because, if spare lines are provided, the substantial density is deceased, but, after all, it is advantageous in view of productivity etc.

In case of utilizing this spare technique, first faulty elements are detected by the use of a memory-tester (or a bit fail tester apparatus or the like). Thereafter, the process of determining, which faulty lines are to be repaired, by the use of a predetermined number of spare rows and a predetermined number of spare columns, is performed, taking into consideration constraints, if any on the way of using of the spare lines. In accordance with the result of the above-mentioned process, for instance, a switching address setting fuse provided on the chip is blown out by a laser in the repair apparatus, whereby address of the line to be replaced by each spare is set.

The problematic points of the above-mentioned conventional processing technique will be described in detail. As mentioned above, a semiconductor memory includes, in addition to the essential memory array, spare lines. These spare lines are ordinarily assigned in a state divided and grouped for the respective memory array areas for taking charge of repair. If faulty elements are detected, the lines (rows or columns) containing the faulty elements are decided as faulty lines, so that those lines are replaced by spare lines taking charge of the repair for this area. In this way, until all the faulty elements are repaired by the spare lines, the replacement of the faulty lines with the spare lines is continued. If all the faulty elements can thus be repaired by the spare lines, the repair/replacement of the semiconductor memory turns out to be successful. On the other hand, in case, even if the spare lines were all used, some faulty elements still exist (or in case, even if all the spare lines in a certain area to be repaired thereby were used, faulty elements still exist in the area), it is decided that the faults are unrepairable. As for the above-mentioned repair process, criteria pertaining to an optimum repair method in view of the manufacturing costs, such as for instance the criterion that the number of spare lines used in case the faults are repairable should desirably be minimum, in many cases.

According to the conventional repair methods, in view of the fact that, concerning the establishment of the correspondence between faulty lines and spare lines, it takes a large amount of calculation time if all the combinations thereof are evaluated by calculation, so that there was employed the method according to which, for instance, the spare lines are successively allocated to the faulty lines successively in a manner first allocating a spare line to the line containing largest number of faults, even if all the spare lines are allocated, all the faulty lines are unrepairable, the allocation of the spare lines is changed from the beginning thereof. Or, there was adopted the method according to which the spare lines were successively allocated in such a manner that first a spare line is allocated to the fault column at the left side (or the fault row at the upper side), and, even if all the spare lines were allocated, all the faulty lines could not be repaired, the allocation of the spare lines was changed from the beginning thereof.

However, according to these conventional methods, even in case a relationship of correspondence exists between the repairable faulty lines and the spare lines, all the combinations cannot be confirmed within the limited calculation time, and thus, it happened that the limit time was reached and it was decided that the faulty lines were unrepairable before all the repairable combinations could be confirmed, or, even if all the faulty lines were repaired, a repair solution far from the optimum repair solution was presented (outputted) in some cases.

In particular, in case a faulty element exists in a spare line, the combination in application of the spare line is added, and further, in case a spare line can take charge of a plurality of memory array areas, the plurality of areas scramble for one spare line, so that, in such a case, the number of combinations further increases, and thus, it becomes harder to obtain the repair solution, which is a problem.

As mentioned above, recently semiconductor memories are being more and more enhanced in the density and architectural complication thereof, as a result of which, in case of using the conventional repair methods, the optional combination in line replacement by spare lines become huge in number, and thus, it takes much time for the calculation thereof, so that the cases where faults are unrepairable within the limited time are further increased, resulting in the lowering in productivity.

Further, even in case there is a repair solution, it was often decided that the faults could not be repaired. In particular, in case faulty elements exist in a spare line, the search for a repair solution became far more difficult, which was a problem.

BRIEF SUMMARY OF THE INVENTION

It is an object of the present invention to provide method and device for repairing arrays with redundancy, wherein it can be decided in a short time whether or not all the faulty elements are repairable by the spare lines and, in case the faults are unrepairable, an optimum (or quasi-optimum) solution concerning the way of using the spare lines can be presented. Further, the present invention also includes a recording medium which stores therein a program readable by a computer which can realize such a function.

A first fault repair method according to a first aspect of the present invention comprises the steps of: providing second memory cells as spare lines for repairing faulty elements of first memory cells for storing data therein, setting virtual third memory cells with respect to a repair target including the first memory cells and the second memory cells; and repairing the faulty elements of the first memory cells and the second memory cells by using the virtual third cells. Here, the term "repair" is used as having such a meaning that a faulty element caused in the first cell can be replaced by a second cell.

A second fault repair method according to the first aspect of the present invention comprises the steps of: providing spare lines and limbos for repairing faulty elements in a memory block; setting virtual spare lines with respect to a repair target including the memory block, the spare lines, and the limbos; and repairing the faulty elements of the memory block, the spare lines and the limbos by using the virtual spare lines.

A third fault repair method according to the first aspect of the present invention comprises the steps of: acquiring information indicative of the positions of faulty elements in a memory block, spare lines and limbos; setting virtual spare lines with respect to a repair target including the memory block, the spare lines and the limbos; evaluating through the virtual spare lines a repair solution for repairing the faulty elements in the memory, the spare lines and the limbos; and evaluating a solution for repairing the faulty elements of the memory block by means of the spare lines and limbos on the basis of the repair solution.

Preferred manners of the first aspect of the present invention are as follows:

(1) In the third fault repair method, of the repair solution, every line of the memory block which has been repaired by the virtual spare line is set as a line to be repaired by a spare line; and of the repair solution, the spare lines excluding the spare lines which have been repaired by the virtual spare lines are set as spare lines usable for repair.

(2) In the item (1), the relationship of correspondence between the lines to be repaired in the memory block and the spare lines used for the repair thereof is determined on the basis of the setting.

(3) In the above-mentioned fault repair method, with reference to the case of evaluating the solution for repairing the repair target including the memory block, the spare lines and the limbos by the use of the virtual spare lines, in repairing the memory block, the constraints corresponding to the constraints imposed on the spare lines are applied to the virtual spare lines, whereby the repair solution is evaluated.

(4) In the above-mentioned fault repair method, in case the repair solution satisfies the constraints, the repair solution is determined to be a solution.

(5) In the above-mentioned fault repair method, in the case of evaluating the repair solution, a bipartite graph is formed, which expresses the position information specified by two coordinate elements of, row identifier data and column identifier data, with reference to all the faulty elements contained in the memory block, the spare lines and the limbos; a DM decomposition of the bipartite graph is evaluated, and on the basis of the DM decomposition, the relationship of correspondence between the virtual spare lines and the lines containing faulty elements in a repair target including the memory block, the spare lines and the limbos is evaluated.

(6) In the above-mentioned fault repair method, in the case of evaluating the repair solution, a first process is performed in such a manner that a bipartite graph is formed which expresses the position information specified by two coordinate elements of, row identifier data and column identifier data, concerning all the faulty elements contained in the memory block, the spare lines and the limbos, a DM decomposition of the bipartite graph is evaluated, a contracted graph is calculated on the basis of the DM decomposition, and, on the basis of the contracted graph, the repair solution is evaluated; and in case the repair solution has not been obtained through the first process, a second process is performed in such a manner that the position information of all the faulty elements contained in the memory block, the spare lines and the limbos, the constraints pertaining to the way of using the spare lines and the number of the spare lines, and the minimization of the number of the spare lines to be used are expressed in an integer programming problem, so that the repair solution is evaluated as an integer solution of the integer programming problem.

(7) In the item (6), the second process is executed in cases such as the case where, in the first process, no repair solution can be obtained and the case where the calculation is not terminated in spite of the fact that a predetermined time has elapsed.

(8) In the above-mentioned fault repair method, in the case of evaluating the repair solution, the position information of all the faulty elements contained in the memory block, the spare lines and the limbos, the constraints pertaining to the way of using the spare lines and the number of the spare lines, and the minimization of the spare lines to be used are expressed in an integer programming problem, so that the repair solution is evaluated as an integer solution of the intger programming problem.

(9) In the items (6) to (8), the integer programming problem is solved as a linear programming problem by relaxing the integer condition into the real number condition, and, in case an integer solution has been obtained, this is determined as the repair solution to be evaluated.

(10) In the above-mentioned fault repair methods, the repair solution includes such a solution as in the case where there exists no solution which can repair all the faulty elements.

(11) In the above-mentioned fault repair method, in the case of evaluating the repair solution, a plurality of repair solutions are evaluated, and, of the thus evaluated repair solutions, the repair solution in which the number of spare lines to be used is minimum is determined as the repair solution to be evaluated.

(12) In the above-mentioned fault repair method, such a repair subsolution which repairs all line fails is evaluated as a first repair subsolution in a preprocessing, and a subsolution which repairs faulty elements other than the faulty elements which have been repaired by the preprocessing is evaluated as a second repair subsolution, and the repair solution resulting from composing the first and the second repair subsolutions is determined as the repair solution to be evaluated.

The fault repair method according to a second aspect of the present invention comprises the steps of: dividing a memory block into a plurality of subblocks: dividing spare lines provided for repairing the faulty elements in the memory block so as to correspond to the subblocks; evaluating a candidate repair solution with respect to each of the subblocks; and composing the candidate repair solutions obtained with respect to each of the subblocks to generate the repair solution.

The repair solutions for the partial processing units can be obtained by, e.g., the method according to the first aspect.

Preferred manners of the second aspect of the present invention are as follows:

(1) The subblocks each share a set of spare lines with at least one other subblock; and in the case of composing the candidate repair solutions of the respective subblocks, the repair solution is generated by taking into consideration the manner of sharing the spare line set between the plurality of subblocks.

(2) It is also possible to constitute the method in such a manner that, in the case of evaluating the candidate repair solutions, a predetermined number of candidate repair solutions for each of the plurality of subblocks are evaluated, and, in the case of generating the repair solution of the processing unit, one candidate repair solution to be composed is selected in a predetermined procedure from each of the subblocks, so that it is decided whether or not the repair solution of the processing unit can be obtained through the combination of the candidate repair solutions concerned; this series of processes are repeatedly performed, so that, when the repair solution of the processing unit is obtained for the first time, the repair solution is adopted.

(3) The method may alternatively be constituted in such a manner that, in the case of evaluating the candidate repair solutions, a predetermined number of candidate repair solutions are evaluated for each of the plurality of subblocks, and, in the case of generating the repair solution of the processing unit, one candidate repair solution to be composed is selected from each of the subblocks, and, in the case where, concerning all or part of the combinations, one repair solution which can become the repair solution of the processing unit is obtained, this repair solution is determined as candidate repair solution of the processing unit; and in case a plurality of the processing unit candidate solutions are obtained, one candidate repair solution selected in accordance with a predetermined criterion is adopted as the repair solution of the processing unit.

(4) In the case of composing the candidate repair solutions, the repair solution pertaining to the spare line group is evaluated in such a manner that, concerning the spare line group shared between the plurality of subblocks, the union of those spare lines of the spare line group is determined as the set of unusable spare lines in the spare line group in at least one of the candidate repair solutions of the subblocks which share the spare line group.

(5) As for a spare line set not shared by or between a plurality of subblocks mentioned above, the portion pertaining to the spare line set concerned in a candidate repair solution of the subblock which has the spare line set can be adopted as the processing unit solution.

(6) In the case of composing the candidate repair solutions, the repair solution is evaluated in such a manner that the repair process of faulty elements in the memory block using spare lines other than the unusable spare lines is performed successively with respect to the respective subblocks, and further in each the process, the union of the spare lines which have been turned to be unusable in the candidate repair solution of the subblock concerned and the spare lines which have been used in the repair processes so far performed is determined as unusable spare lines in each of the subblocks.

The fault repair method according to the present invention can also be realized as an invention relating to a device. Conversely, the present invention relating to the device can also be realized as an invention relating to a method.

Further, the present invention relating to a device and the present invention relating to a method can also be realized as an invention relating to a recording medium in which a program for realizing this is stored.

The fault repair method is realized as a fault repair device as stated below:

The first fault repair device according to the first aspect of the present invention comprises first memory cells for storing data therein, and second memory cells provided as spare lines for repairing faulty elements of the first memory cells, wherein, for target elements to be repaired included in the first memory cells and the second memory cells, virtual third cells are set, whereby faulty elements of the first memory cells and the second memory cells are repaired.

The second fault repair device according to the first aspect of the present invention comprises spare lines and limbos provided for the repair of faulty elements in a memory block, virtual spare lines set for target elements to be repaired included in the memory block, the spare lines and the limbos, and a means for repairing the bit faults in the memory block, the spare lines and the limbos through the virtual spare lines.

The third fault repair device according to the first aspect of the present invention comprises spare lines and limbos provided for the repair of faulty elements in a memory block, a means for acquiring information indicative of the positions of the faulty elements in the memory block, the spare lines and the limbos, virtual spare lines set for target elements to be repaired included in the memory blocks, the spare lines and the limbos, a means for evaluating a repair solution for repairing the faulty elements on the memory block, the spare lines and the limbos, and a means for repairing the faulty elements of the memory block by the use of the spare lines and the limbos on the basis of the repair solution.

Preferred embodiments of the fault repair device according to the first aspect are identical with the fault repair method according to the first aspect and thus omitted.

The fault repair device according to the second aspect of the present invention comprises a memory block divided into a plurality of subblocks which are the target elements to be repaired, spare lines provided for repairing the faulty elements of the memory block and divided so as to correspond to the subblocks, a means for evaluating a candidate repair solution for repairing faulty elements in each of the subblocks, and a means for generating a repair solution by composing the candidate repair solutions obtained for each of the subblocks.

Preferred embodiments of the second aspect are identical with the method according to the second aspect and thus omitted.

The above-mentioned fault repair device holds as a recording medium, as described below, in which a program readable by a computer for executing the fault repair method.

The recording medium in which stores a computer-readable program for executing the first fault repair method according to the first aspect of the present invention stores therein a program for executing the steps of: providing second memory cells as spare lines for repairing faulty elements of first memory cells for storing data therein, setting virtual third memory cells with respect to a repair target including the first memory cells and the second memory cells; and repairing the faulty elements of the first memory cells and the second memory cells by using the virtual third cells.

The recording medium in which stores a computer-readable program for executing the second fault repair method according to the first aspect of the present invention stores therein a program for executing the steps of: providing spare lines and limbos for repairing faulty elements in a memory block; setting virtual spare lines with respect to a repair target including the memory block, the spare lines, and the limbos; and repairing the faulty elements of the memory block, the spare lines and the limbos by using the virtual spare lines.

The recording medium which stores therein a computer-readable program for executing the third fault repair method according to the first aspect of the present invention stores therein a program for executing the steps of: acquiring information indicative of the positions of faulty elements in a memory block, spare lines and limbos; setting virtual spare lines with respect to a repair target including the memory block, the spare lines and the limbos; evaluating through the virtual spare lines a repair solution for repairing the faulty elements in the memory, the spare lines and the limbos; and evaluating a solution for repairing the faulty elements of the memory block by means of the spare lines and limbos on the basis of the repair solution.

Preferred embodiments of the recording medium which stores therein a computer-readable program for executing the fault repair method according to the first aspect are identical with the fault repair method according to the first aspect and thus omitted.

The recording medium which stores therein a computer-readable program for executing the fault repair method according to the second aspect of the present invention stores therein a program for executing the steps of: dividing a memory block into a plurality of subblocks: dividing spare lines provided for repairing the faulty elements in the memory block so as to correspond to the subblocks; evaluating a candidate repair solution with respect to each of the subblocks; and composing the candidate repair solutions obtained with respect to each of the subblocks to generate the repair solution.

Preferred embodiments of the recording medium which stores therein a computer-readable program for executing the fault repair method according to the second aspect are identical with the method according to the second aspect and thus omitted.

The present invention is constituted in such a manner that, on the basis of the fact that a fixed relationship exists between the solution for repairing faulty elements in a memory block by the use of spare lines and the solution for repairing faulty elements in a virtual memory block by the use of virtual spare lines assumed in case the memory block, the spare lines and the limbos are set as the virtual memory block, a repair solution for repairing faulty elements in the virtual memory block by the use of virtual spare lines in which no faulty element exists is obtained, instead of directly obtaining a solution for repairing the faulty elements in the actual memory block by the use of the actual spare lines in which faulty elements can exist, so that, on the basis of the fixed relationship, an actual repair solution is obtained from the above-mentioned repair solution.

Here, the "repair solution" means, in case of the virtual spare lines, information indicative of the set of the lines repaired by the virtual spare lines.

Further, the "repair solution" means, in case the actual spare lines are concerned, information indicative of the correspondence between the lines of the memory block repaired by the virtual spare lines and the spare lines used for the repair of the lines.

Further, the "repair solution" means, in case the actual spare lines are concerned, for instance information indicative of the lines of the memory block repaired by the spare lines and of the spare lines usable for the repair of the lines. In this case, if a plurality of usable spare lines exist, then the actual correspondence is determined on the basis of this information prior to the repair step later.

More concretely, for instance, by assuming or imagining the spare lines having no faulty elements equal in number to the actual spare lines, these virtual spare lines having, as the repair target thereof, the whole bit matrix comprising the memory block, the spare lines and limbos, so that a repair solution is evaluated for the repair target. In case, in the repair solution thus evaluated, there is a relationship of correspondence such as an actual spare line being repaired by a virtual spare line, it is to be construed that the actual spare line is not used. In this case, even if a faulty element exists in an actual spare line, no special treatment need not be made for the allocation of the spare line, so that the processing for obtaining the repair solution is simplified and enhanced in speed.

Further, the existence of a relationship of correspondence between the virtual spare lines and the faulty lines in the virtual memory block to be repaired is in a necessary and sufficient relationship to the existence of a relationship of correspondence between the actual spare lines and the faulty lines in the actual memory block to be repaired. As a result, in case the whole bit matrix comprising the memory block, the spare lines and limbos is repairable by the virtual spare lines, it becomes possible to repair all the faulty elements in the actual memory block by the actual spare lines, while on the other hand, in case the whole bit matrix are unrepairable by the number of virtual spare lines, it becomes impossible to repair all the faulty elements in the memory block by the actual spare lines.

According to the present invention, in stead of directly obtaining a repair solution for repairing faulty elements in the actual memory block by the actual spare lines in which faulty elements can exist, a repair solution for repairing the faulty elements in a virtual memory block by virtual spare lines in which no faulty elements exists, so that, in case faulty elements exist in a spare line, it becomes unnecessary to take such an action as to evaluate a repair solution, taking it into consideration to repair the faulty elements in this spare line by another spare line; and thus, it can relatively easily and quickly realized to obtain the repair solution or to detect that no repair solution exists.

Further, for instance in case faulty elements appear in a uniformly dispersed state or in case many of the faults left after the repair of line fails are in the form of single faults, the necessity of making search for a time exceeding the time limit can be decreased as much as possible; and thus, it can be expected that the cases where the relationship of correspondence between the faulty lines and the spare lines realized in the minimum number or a semi-minimum number is evaluated will be increased.

Further, according to the present invention, the information on the positions of faulty elements in the whole memory including the spare lines and limbos is expressed in the form of a bipartite graph to calculate the maximum matching thereof, whereby it can be decided in a short time that the faulty elements are unrepairable by the number of spare lines provided. Further, by the use of the DM decomposition calculated from the maximum matching, the optimum or quasi-optimum relationship of correspondence between the faulty lines and the spare lines can be determined in a short time. In particular, in cases such as, e.g., in case faulty elements take place in a uniformly dispersed state or in case many of the faults left after a line fail has been repaired are in the form of single faults, it can be expected to calculate the relationship of correspondence realized in the minimum number.

Further, according to the present invention, the position information of the faulty elements in the whole memory including the spare lines and limbos, the range of application of the spare lines, and the constraints on the number of spare lines are expressed in the form of an integer programming problem. Then, the linear programming problem obtained by relaxing the integer condition of the integer programming problem into a real number condition is solved, whereby, in case no feasible solution exists, the decision of "unrepairable" is made, or in case an integer solution is obtained, the optimum relationship of correspondence between the faulty lines and the spare lines can be calculated.

Further, according to the present invention, it is ensured that, even in case the processing unit including the memory block which is a repair target, and spare lines and limbos do not satisfy the condition that the spare columns each can be allocated, as one line having the length in the vertical direction of the memory block, to a faulty line belonging to a given vertical block, and the spare rows each can be allocated, as one line having the length in the horizontal direction of the memory block, to a faulty line belonging to a given horizontal block, the repair solution of the processing unit can be obtained in such a manner that a candidate repair solution for repairing, by spare lines, the faulty elements in the memory block of each of a plurality of subblocks formed by dividing the processing unit so as to satisfy the condition is evaluated, and the candidate repair solutions of the respective subblocks are composed.

According to the present invention, even in case faulty elements are detected in spare lines, the decision whether the faulty elements are repairable or not and the relationship of correspondence between the faulty lines and the spare lines can be obtained fast and stably. Further, even in case a time limit is provided on the processing, it can be expected to obtain the above-mentioned result within the time limit. Moreover, for instance, in case faulty elements take place in a uniformly dispersed state or in case many of the faults left after line fails have been repaired are single faults, it is decreased as much as possible to execute searches exceeding the time limit, and it can be expected that it is increased to obtain the relationship of correspondence between the spare lines and the faults lines which have been realized in the minimum number or in approximately the minimum number.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 9 is a diagram showing an example of the matrix B;

FIG. 10 is a diagram showing an example of the repair solution of the matrix B;

FIG. 11 is a diagram showing an example of the repair solution in the matrix A;

FIG. 16 is a diagram showing an example of the matrix B;

FIG. 17 is a diagram showing an example of the input data corresponding to the matrix B shown in FIG. 16;

FIGS. 18A to 18K are diagrams showing an example of the method of holding the information on the lines to be repaired by the remainders of the spare lines and the B spare;

FIG. 20 is a diagram showing the lines of the rows and columns in the matrix B to be repaired by the B spare lines;

FIG. 21 is a diagram showing an example of the form of the input data storing file;

FIG. 22 is a diagram showing the contracted matrix B after the processing of line fails;

FIGS. 27A to 27C are diagrams for explaining the DM decomposition and the contracted graph thereof;

FIGS. 31A to 31C are diagrams for explaining the spare allocation processing based on the DM decomposition shown in FIG. 28;

FIG. 33 is a diagram showing an example of the matrix B;

FIG. 34 is a diagram showing the DM decomposition matrix with respect to the matrix B after the calculation of the line fails in the matrix B shown in FIG. 33;

FIGS. 39A to 39D are diagrams for explaining the fault repair method according to a further embodiment of the present invention;

FIGS. 40A to 40C show an example of the data form given to the fault repair device;

FIG. 47 is a diagram for explaining an example of the application of the same embodiment;

FIG. 48 is a diagram showing an example of the constitution of the memory block, the spare lines and the limbos;

FIG. 49 is a diagram for explaining the processing unit constituting a basic form;

DETAILED DESCRIPTION OF THE INVENTION

Figure 1:
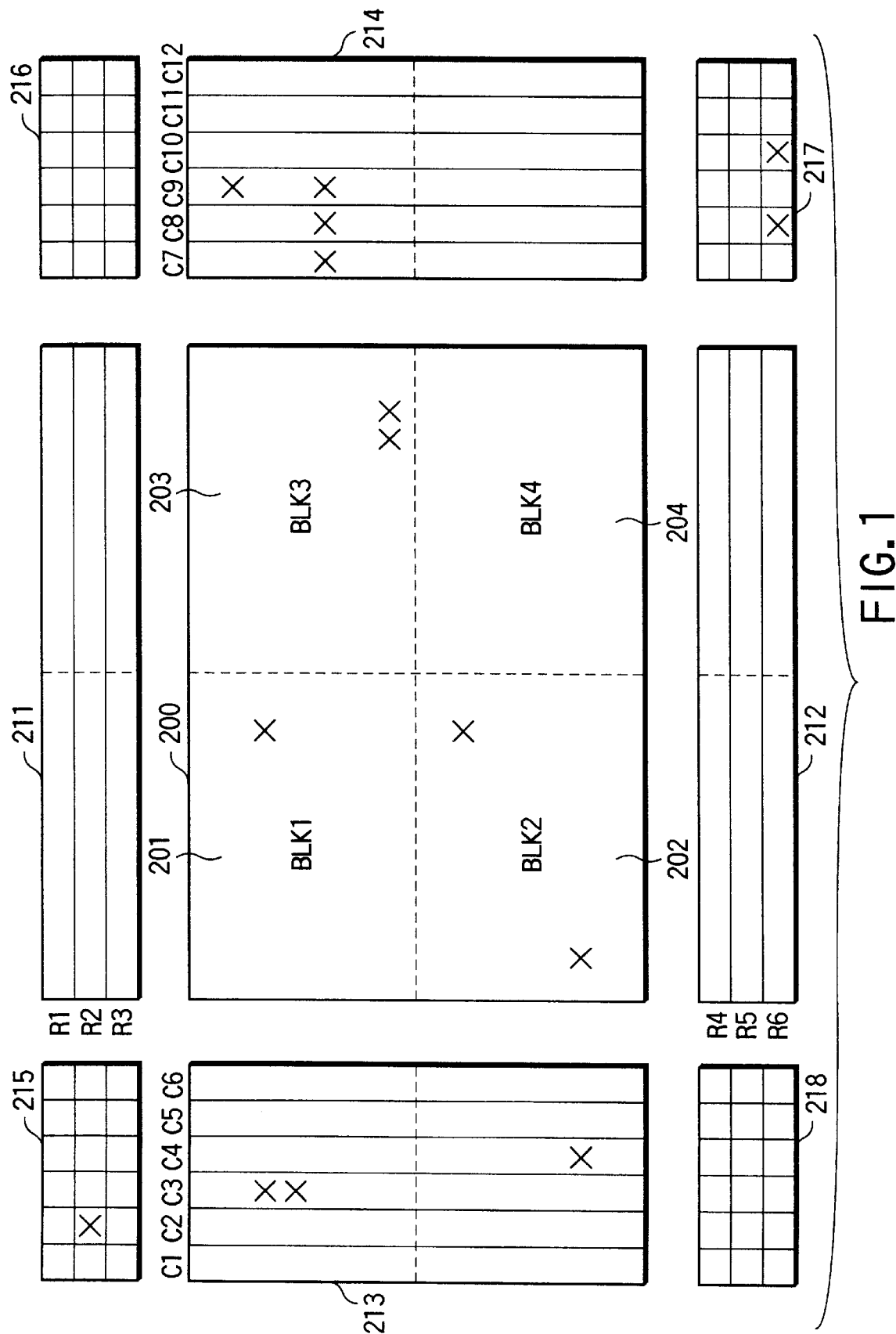
FIG. 1 is a diagram showing an example of the constitution of the memory block and the spare lines and the limbos.

An embodiment of the present invention will now be described, referring to the drawings.

With reference to this embodiment, description will be made concerning several examples of the fault repair device which can be applied to, for example, a repair apparatus which repairs faulty elements by steps such as the step of obtaining a method (solution) for repairing faulty elements in the memory block by spare lines on the basis of the faulty elements information (including not only the information on faulty elements in the memory block but also the information on faulty elements in the spare lines and the limbos) or deciding that the faulty elements are unrepairable, and, the step of burning out a fuse by a laser on the basis of the result (repair solution) thereof. The fault repair device according to this embodiment can be realized by means of a software and can be provided independently of the memory test apparatus or the repair apparatus or can be built in the memory test apparatus or the repair apparatus, but, in the following description, the fault repair device will be described as provided independently. Further, the description will be made by reference mainly to the case where, from the memory test apparatus, the information of faulty elements which are not subjected to a line fail processing to be described later is given. Further, as for the information given to the repair apparatus, the description will be made with reference mainly to the case where information specifying the way of making repair (the relationship of correspondence between the lines to be repaired and the spare lines used) is outputted.

In the manufacturing line, the steps from the memory test step to the repair step are carried out ordinarily by the lot unit (for instance, 25 wafers/lot, 200 chips/wafer), so that the fault repair device operates by the wafer unit as the basic processing unit but operates by the lot unit in view of the link to the manufacture management system in many cases. On the other hand, in the off-line, the fault repair device can be arbitrarily used ranging over the lot unit to the memory block unit in many cases. However, in either case, one chip of a semiconductor memory comprises a plurality of memory blocks (such as, e.g., 4×8 memory blocks) which are of the same constitution, and the spare lines and the limbos for the repair of faulty elements are provided for each of the memory blocks, so that the fault repair method according to this embodiment is performed by this memory block unit. The processing for one memory block will mainly be described below.

The present invention is applicable to semiconductor memories of any constitution or other devices having memories, but first, in order to explain this embodiment, the constitution pertaining to the faulty elements repair of a semiconductor memory (hereinafter referred to as RAM) used as an example will be described.

FIG. 1 shows an example of the arrangement of a memory block 200, spare lines 211 to 214 and limbos 215 to 218 within a RAM which is a repair target by the fault repair device. The number of bits in the row direction and the number of bits in the column direction of the memory block can be determined arbitrarily, but of course, the number of bits in the row direction of the memory block and the number of bits in each spare row are the same, and the number of bits in the column direction of the memory block and the number of bits in each spare column are the same. Further, as for the limbos, one bit is provided corresponding to each pair of a spare row and a spare column.

In the case of the RAM shown in FIG. 1, examination is made with reference to the case where one memory block 200 is divided vertically into two subblocks and (divided) in the right-left direction into two subblocks (divided into four subblocks in all: the dot lines in FIG. 1 indicate the boundary lines). In other words, a subblock BLK1 (the left upper quarter 201 in the drawing), a subblock BLK2 (the left lower quarter 202 in the drawing), a subblock BLK3 (the right upper quarter 203 in the drawing) and a subblock BLK4 (the right lower quarter 204 in the drawing) put together correspond to one memory block.

Above and below, left and right of the memory block, three and three spare lines and six and six spare lines 211, 212, 213 and 214 are disposed, respectively.

The elements of the 3×6 matrixes 215, 216, 217 and 218 disposed at the four corners are memory cells known as limbos, which replace the bits positioned at the intersecting points of the spare lines in the horizontal direction used for repair and the spare lines in the vertical direction used for repair. As will be described in detail, in case faulty elements exist in the limbos, it results in imposing (a constraint pertaining to the limbos) on the use of the spare lines.

The mark × shown in FIG. 1 indicates faulty elements.

In the following description, the BLK1 and the BLK3 of the memory block matrix put together will be called as the upper rows of the memory block matrix. Similarly, the BLK2 and the BLK4, the BLK1 and the BLK2, and the BLK3 and the BLK4 will be called the lower rows, the left columns, and the right columns of the memory block matrix, respectively.

Further, the spare lines positioned above, below, left and right of the memory block will respectively be called upper spare rows (R1 to R3 in FIG. 1), lower spare rows (R4 to R6 in FIG. 1), left spare columns (C1 to C6 in FIG. 1), and right spare columns (C7 to C12 in FIG. 1).

Here, it is to be understood that, in the memory block of the RAM shown in FIG. 1, the following constraint pertaining to the spare lines is provided in connection with the repair method for the respective BLKi (i=1 to 4):

The faulty elements in the BLK1 are repairable only by the upper spare rows or the left spare columns.

The faulty elements in the BLK2 are repairable only by the lower spare rows or the left spare columns.

The faulty elements in the BLK3 are repairable only by the upper spare rows or the right spare columns.

The faulty elements in the BLK4 are repairable only by the lower spare rows or the right spare columns.

These constraints are peculiar to the constitution of the RAM shown in FIG. 1; such constraint pertaining to the spare lines is provided corresponding to the constitution of the semiconductor memory (there can be the case where no such constraint exists in some semiconductor memories).

Further, in the case of FIG. 1, the upper limit number of usable spare lines is three in case of the upper spare rows, three in case of the lower spare rows, six in case of the left spare columns, and six in case of the right spare columns, respectively. Ordinarily, the number of spare lines in the horizontal direction and in the vertical direction is smaller than the number of rows or columns in the memory block, so that the constraint on the upper limit number of usable spare lines generally exists.

Further, according to the present invention, it is assumed that the semiconductor memory has limbos, but, in this case, a constraint pertaining to the limbos generally exists. As will be described in detail later, there is imposed the constraint that, if there is a faulty element in a limbo, the spare lines in only one of the horizontal direction and the vertical direction corresponding to the limbo can be used for the repair of the memory block. Therefore, also in the case of the RAM shown in FIG. 1, a constraint pertaining to the limbos is imposed.

Now, in the case of the fault repair device according to this embodiment, under the constrain for the spare lines and the constraint for the limbos, the process for evaluating the solution for repairing by replacing faulty lines (rows or columns) by spare lines is executed. In the repair apparatus, in order to replace the faulty lines (rows or columns) in the memory block by spare lines in accordance with this repair solution, processes such as the process of burning out the fuse by means of a laser are performed. This process for replacement costs high, so that, ordinarily, a criterion for deciding whether the repair solution obtained is good or bad is defined. In the case of this embodiment, the total number of the spare lines used is used as the criterion for evaluation. That is, it is assumed that, the less the total number of the spare lines used is, the better the repair method is. A feasible solution of a fault repair problem is called a "repair solution"; and a repair solution according to which the number of spare lines is minimum is called an "optimum repair solution". Further, spare lines used for a repair solution are called "repair lines". Moreover, the case where there is no repair solution is called "unrepairable" in some cases. As unrepairable cases, there is the case, besides the case where the combination of spare lines which can repair all the faulty elements existing in the memory block cannot be obtained, where, in case, a limit is provided on the processing time, the time limit is already reached before the repair solution can be obtained.

Further, concerning this embodiment, description is made in accordance mainly with the form according to which, when one repair solution has been obtained concerning a certain repair unit or when it is decided that the faults are unrepairable, the operation proceeds to the repair process for the next repair unit, but it is also possible to adopt the form according to which several repair solutions are evaluated, and a better repair solution is selected in accordance with an evaluation function based on the evaluation criterion and outputted.

Figure 2:
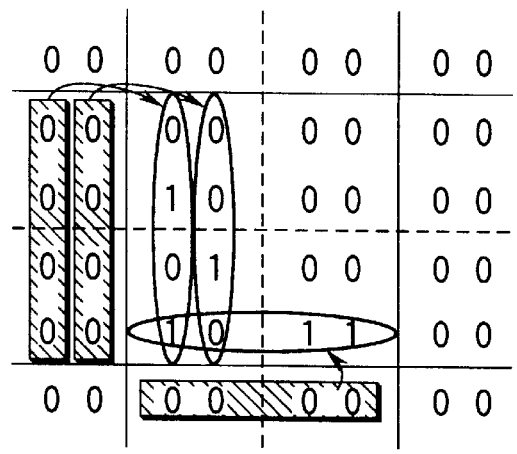
FIG. 2 is a diagram for explaining the repair of the faulty elements in case the faulty elements exist only in the memory block.

FIG. 2 shows an example of the case where faulty elements in a memory block having the same structure as shown in FIG. 1 are repaired. In this example, the size of the block and the number of spare lines are decreased for simplicity's sake.

In the case of FIG. 2, the faulty elements are represented by "1", while the normal elements are represented by "0". This way of representing the fault and normal elements is the same throughout the other drawings referred to in the following description.

In the case of FIG. 2, according to a certain repair solution, the spare lines positioned at the starting points of arrow marks replace the rows and columns positioned at the terminal points of the arrow marks. This repair solution is an optimum repair solution, wherein the number of repair lines is three. For instance, as another repair method, the two faulty elements in the BLK4 can also be repaired by the use of two of the right spare columns, but in this case, the total number of four spare lines are needed, and thus, this is not an optimum repair solution.

In the case of the example shown in FIG. 2, faulty elements exist only in the memory block, but no faulty elements exists in the spare lines or the limbos, but, in general, faulty elements can exist also in the spare lines and the limbos.

In case faulty elements exist in a spare line which is a candidate for the repair line, spare lines orthogonal to the spare line can be used to repair the faulty elements of the spare line. The limbo matrix gives the information on the orthogonal spare lines usable in such a case. The role of the limbo matrixes will be described below by reference to the example shown in FIG. 1. Here, concerning the limbo matrix at the left upper end, the description is made, but the roles of the other three limbo matrixes are the same as the role.

First, the (i, j) component of the limbo matrix at the left upper end is to be called (i, j) limbo for convenience' sake. Here, $1 \leq i \leq 3$, and $1 \leq j \leq 6$.

In case this (i, j) limbo has a fault, only one of the upper spare row $R_i$ and the left spare column $C_j$ (in other words, both spare lines cannot be used together).

On the other hand, in case the (i, j) limbo is normal (in other words, in case the limbos has no fault), the corresponding upper spare row $R_i$ and the corresponding spare column $C_j$ can be used jointly (in other words, one or both of them can be used).

The (i, j) limbo is used as a substitute memory cell at the intersecting point when both spare lines $R_i$ and $C_j$ are actually used. Therefore, if the (i, j) limbo is normal, then it does not matter even if a fault exists (remains/is generated) at the intersecting point when both spare lines $R_i$ and $C_j$ were actually used.

As described above, the faulty elements existing on a spare line are repairable only by the other spare line orthogonal to the spare line, but in case such a repair is executed, the limbo corresponding to this pair of two spare lines must be normal. Further, components that actually repair the faulty elements existing on a spare line are the limbo components as substitute memory cells, but not components of the orthogonal spare line.

Figure 3:
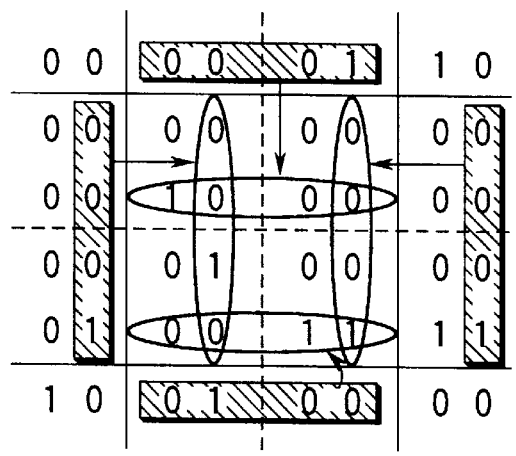
FIG. 3 is a diagram for explaining the repair of the faulty elements in case the faulty elements exist also in the spare lines and limbos.

FIG. 3 shows an example of the case where faults exist in limbos and spare lines in the same memory block structure as that shown in FIG. 2. In this example, the size of the memory block and the number of spare lines are likewise decreased for simplicity's sake. In the case of this example, in a certain repair solution, the spare lines positioned at the starting points of arrow marks shown in FIG. 3 relieve the rows and columns positioned at the terminal points of the arrow marks. This repair solution is an optimum repair solution, wherein the number of repair lines is four. In the case of FIG. 3, for instance the rightmost spare column repairs the fault of the upper spare row (in actuality, the fault is repaired by the corresponding component of the limbos).

The number of spare lines and the size of the limbos shown in FIGS. 1 to 3 are shown merely by way of example; these numerical values are not intrinsic. Further, the structure (that is, the structure made in such a manner that, above, below, at the left and at the right of the memory block, spare lines are disposed, the memory block is divided into four BLKi, and there is provided a constraint pertaining to the positions of the spare lines usable for the repair of the respective BLKi, etc.) shown in FIGS. 1 to 3 are also shown merely by way of example. The present invention can be applied to semiconductor memories having variously different structures; that is, the present invention is applicable to semiconductor memories of variously different structures such as for instance the structure in which the memory block is divided into eight subblocks as well as divided into four subblocks, the structure in which the memory block is divided into two subblocks in only one direction, the structure in which the memory block is not divided (the structure in which there is no limit on the application of spare lines to the subblocks), the structure in which the positions of the spare lines above, below, right and left of the memory block differ from one another, etc. of course, the present invention is applicable not only to RAM but also various other semiconductor memory devices.

Next, the basic principle underlying the repair method (problem solution method) according to the present invention, etc. will be described.

Figures 4A, 4B:
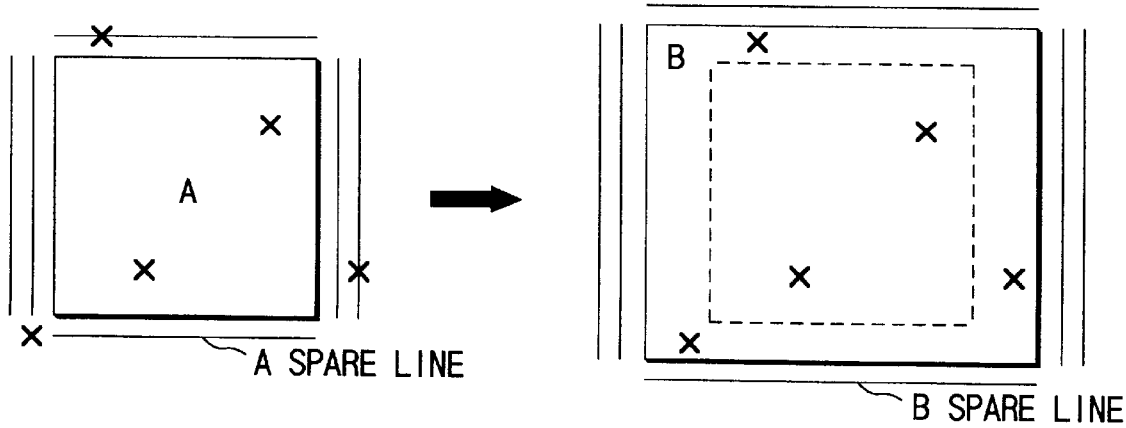
FIGS. 4A and 4B are diagrams for explaining a matrix A including a memory block and a matrix B including the memory block, spare lines and limbos.

It is to be understood that the memory block matrix (which contains neither spare lines nor limbos) is expressed as a a matrix. On the other hand, such a matrix as shown in FIG. 4B which is obtained by attaching all the spare lines and all the limbos (not shown) to such a matrix A as shown in FIG. 4A is considered. Such a matrix is represented as a matrix B below. For instance, the memory block 200 shown in FIG. 1 corresponds to the matrix A, and what are shown in FIG. 1 are all put together to regard the resulting whole as one matrix, which corresponds to the matrix B.

The upper rows, the lower rows, the left columns and the right columns of the matrix B are defined in the same way as in the case of the matrix A. For instance, the upper portion and the lower portions positioned above and below the horizontal dotted line shown in FIG. 1 are the upper rows and the lower rows of the matrix B, respectively, and the left side and the right side of the vertical dotted line are the left columns and the right columns of the matrix B, respectively.

Further, according to the present invention, it is assumed that, with respect to the matrix B, new spare lines having no fault exist, the spare lines being the same in number as the spare lines of the matrix A and having the same constraint as that in the case of the matrix A. For instance, it is assumed that three "spare lines having no faulty elements" exist above and below the matrix B, respectively, and six "spare lines having no faulty elements" at the right and left sides, respectively, of the matrix B shown in FIG. 1. Further, since it is assumed that the spare lines of the matrix B have no fault, the provision of no limbos is needed for the matrix B. Further, it is to be understood that no constraint for limbos is provided to the thus assumed spare lines.

Further, in order to avoid a confusion concerning the spare lines in the following description, the spare lines in the case of the matrix A are referred to as A spare lines, and the spare lines assumed to exist in the case of the matrix B are referred to as B spare lines to clearly distinguish between them in some cases.

The following theorem is to indicate the relationship of correspondence between the repair solution of the matrix A and the repair solution of the matrix B and thus to guarantee the validity of expanding the original problem of fault repair to the matrix B.

(Theorem)

"The necessary and sufficient condition for a repair solution of the matrix A to exist is that a repair solution of the matrix B exists".

(Proof of the Necessity)

First, the proof of the necessity is shown.

The repair line set of A be represented as L(A). Of the row and column vectors of B, the whole of the row and column vectors which contain no element of A be represented as X (in other words, the set comprising whole of the row and column vectors existing outside A be represented as X). Further, the subset of X which is obtained by extending the respective rows and respective columns of L(A) is represented as $L(A)^e$, and the set of the rows and columns obtained by extending the row and columns of matrix A which are repaired by L(A) be $L'(A)^e$.

Figure 5:
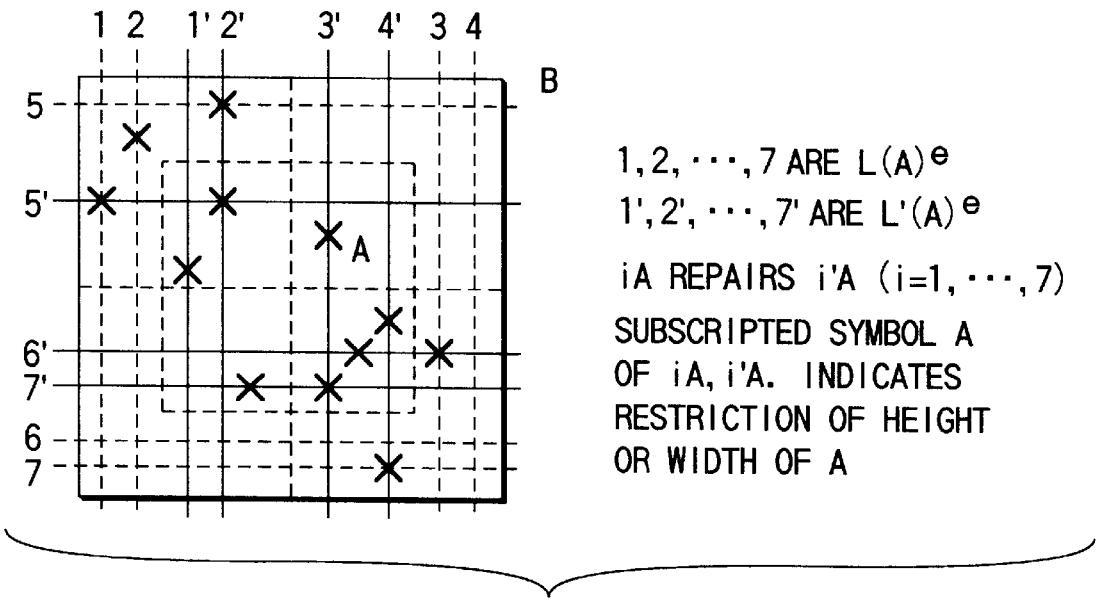
FIG. 5 is a diagram for explaining the relationship between the repair solution of the matrix A and the repair solution of the matrix B.

FIG. 5 shows an example thereof. In FIG. 5, lines 1, 2, ..., 7 correspond to $L(A)^e$, lines 1', 2', ..., 7' correspond to $L'(A)^e$, respectively, and $i_A$ repairs $i'_A$ (i=1, 2, ..., 7), wherein the subscripted symbol A of $i_A$, $i'_A$, etc. indicates the restriction to height or width of A.

Then, it can be shown that the faulty elements belonging to B-A exist on the lines of $L'(A)^e$ or $X-L(A)^e$. More concretely, it is sufficient to check the components which lies on the lines of $L(A)^e$ but does not exist on the lines of $L'(A)^e$.

(i) The intersecting point of two lines of $L(A)^e$ which are orthogonal to each other: This is a good limbo and thus normal.

(ii) The limbos other than (i) on $L(A)^e$: In case there is a fault, this exists on the line of $X-L(A)^e$.

(iii) The components on $L(A)-L'(A)^e$: No defect can exist (If any fault exists, then the orthogonal spare line of A for repairing the fault become necessary, and thus, after all, the fault turns out to belong to $L'(A)^e$, which is contradictory).

$$L(B) \equiv L'(A)^e U (X-L(A)^e) \qquad (1)$$

Thus, it becomes clear that L(B) represented by the expression (1) covers (repairs) all the faults of the matrix B.

Further, the numbers of lines of the upper rows, lower rows, left columns and right columns of the matrix B covered by L(B) are respectively smaller than (in actually, equal to) the number of the upper horizontal, the lower horizontal, the left vertical and the right vertical B spare lines, so that this L(B) provides the repair line set of B.
(End of the Proof of Necessity)
(Proof of Sufficiency)

Next, the proof of the sufficiency is shown.

The repair line set of B be represented as L(B). The set of A spare lines which are not covered by L(B) be represented as $L_0(A)$. The set of rows and columns of A which are not covered by L(B) be represented as $L_A$.

Figure 6:
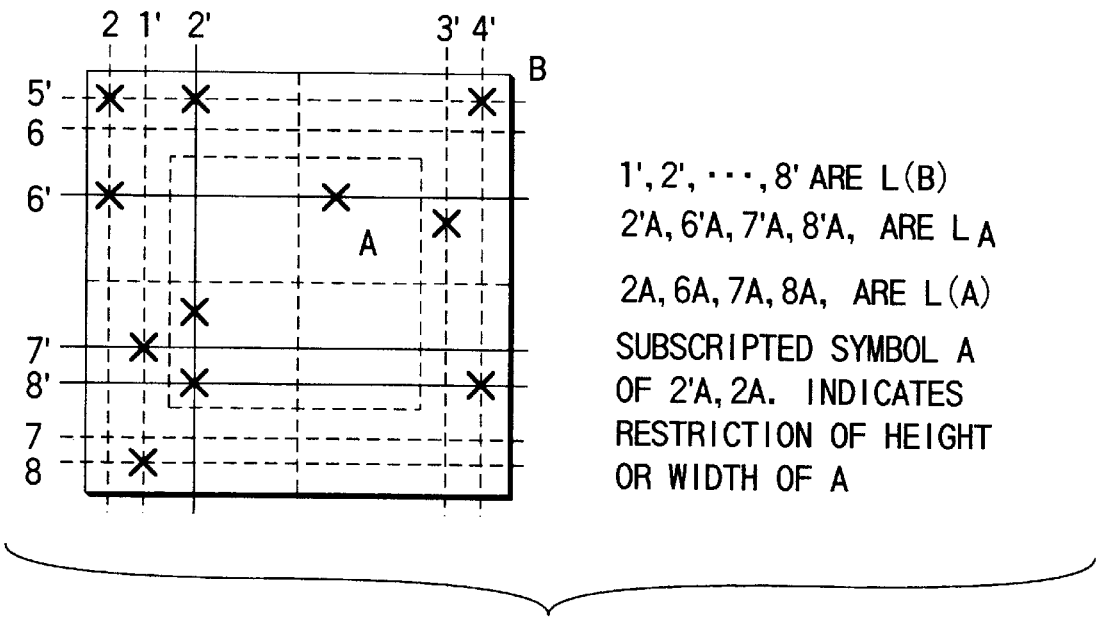
FIG. 6 is a further diagram for explaining the relationship between the repair solution of the matrix A and the repair solution of the matrix B.

FIG. 6 shows an example thereof. In FIG. 6, lines 1', 2', ..., 8' correspond to L(B), and $2'_A$, $6'_A$, and $8'_A$ correspond to $L_A$, respectively, wherein the subscripted symbol A of $2'_A$ etc indicates the constraint to height or width of A.

If it is assumed that the numbers of upper horizontal, lower horizontal, left vertical and right vertical B spare lines which cover $L_A$ are represented as u, d, l, and r, respectively, then at least u upper horizontal, at least d lower horizontal, at least l left vertical and at least r right vertical spare lines exist in $L_0(A)$. If it is assumed that the subset of $L_0(A)$ obtained by arbitrarily picking up the concerned numbers (that is, u, d, l and r) of them is L(A), then L(A) repairs A. $2_A$, $6_A$, $7_A$ and $8_A$ shown in FIG. 6 are an example of L(A).

In order to set forth this, first a one-to-one correspondence is arbitrarily set between the lines of $L_A$ and the spare lines of L(A) (wherein it is to be assumed that conditions such as the condition that the upper spare rows are made to correspond to the upper portion of A are satisfied). Now, in case some fault exists on a line (say k) of L(A), the fault lies on the extension of a line of $L_A$ (because all the faults are covered by the lines of L(B)). If it is assumed that the line of L(A) corresponding to the line is h, then the intersecting point (limbo) formed when k and h are extended is not covered by any line of L(B), and thus normal (good). That is, by this limbo, the above-mentioned fault is repaired. Thus, the faults on the lines of L(A) are all repaired when A is covered by L(A). Thus, by allocating the spare lines of L(A) to the respective lines of $L_A$ under the one-to-one correspondence, A is repaired.
(End of the Proof of Sufficiency)

Further, this theorem is valid not only with reference to the structure exemplarily shown in FIG. 1 (that is, the structure made in such a manner that, above, below, at the left side and at the right side of the memory block, spare lines are disposed, the memory block is divided into four BLKi, and a constraint on the positions of the spare lines usable for the repair of the respective BLKi, etc. is imposed), but also holds with reference to a memory block having any other structure. That is, the theorem holds without depending on the number of subblocks obtained by dividing the memory block and the locations at which the spare lines are disposed.

The practical significance of this theorem is indicated in the above-mentioned proof. That is, the set of faulty lines of matrix A which are repaired by the repair line set L(A) of matrix A can be naturally expanded to the set of faulty lines of matrix B which are repaired by the repair line set of matrix B. Conversely, to the respective faulty lines of matrix A which are covered by the repair line set L(B) of matrix B, the spare lines of matrix A which are not covered by L(B) can be made to correspond; and thus, the repair solution of matrix A can be constituted from L(B).

The fault repair device according to the present invention is to evaluate the repair solution on the basis of this point.

The basic structure of the fault repair device according to the embodiment of the present invention will be described below.

The fault repair device according to this embodiment is based on the above-mentioned theorem and is constituted in such a manner that, roughly speaking, first, on the basis of the address data of faulty elements of a given memory block, spare lines and limbos and a constraint pertaining to the spare lines which constraint corresponds to a RAM which is the repair target, a repair solution of the matrix B (a matrix comprising the memory block, the spare lines and the limbos). As the repair solution, the row address and the column address (there is the case where one of the addresses is used in some cases) of the matrix B to be repaired are given.

Here, as the rows and the columns repaired by the B spare lines in the matrix B, there are those which contain elements of the memory block (that is, the matrix A) and those which do not contain such elements. Of them, (the row or column addresses of) those lines which contain elements of the memory block indicate the rows or columns repaired by the matrix A. Further, (the row or column addresses of) those lines which do not contain elements of the memory block provide those spare lines—of the actual spare lines (A spare lines) for the matrix A—which cannot be used (that is, the other A spare lines are usable).

Next, on the basis of the repair solution of the matrix B, a repair solution for the matrix A, that is, the memory block is evaluated. That is, to the respective faulty lines of the memory block which are covered by the B spare lines, those A spare lines which are not covered by the B spare lines are arbitrarily made to correspond, whereby the repair solution of A is constituted.

Figure 7:
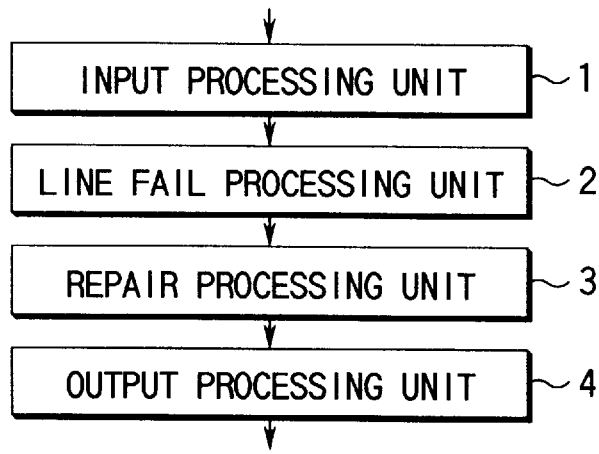
FIG. 7 is a diagram showing the basic constitution of the fault repair device according to an embodiment of the present invention.
Figure 8:
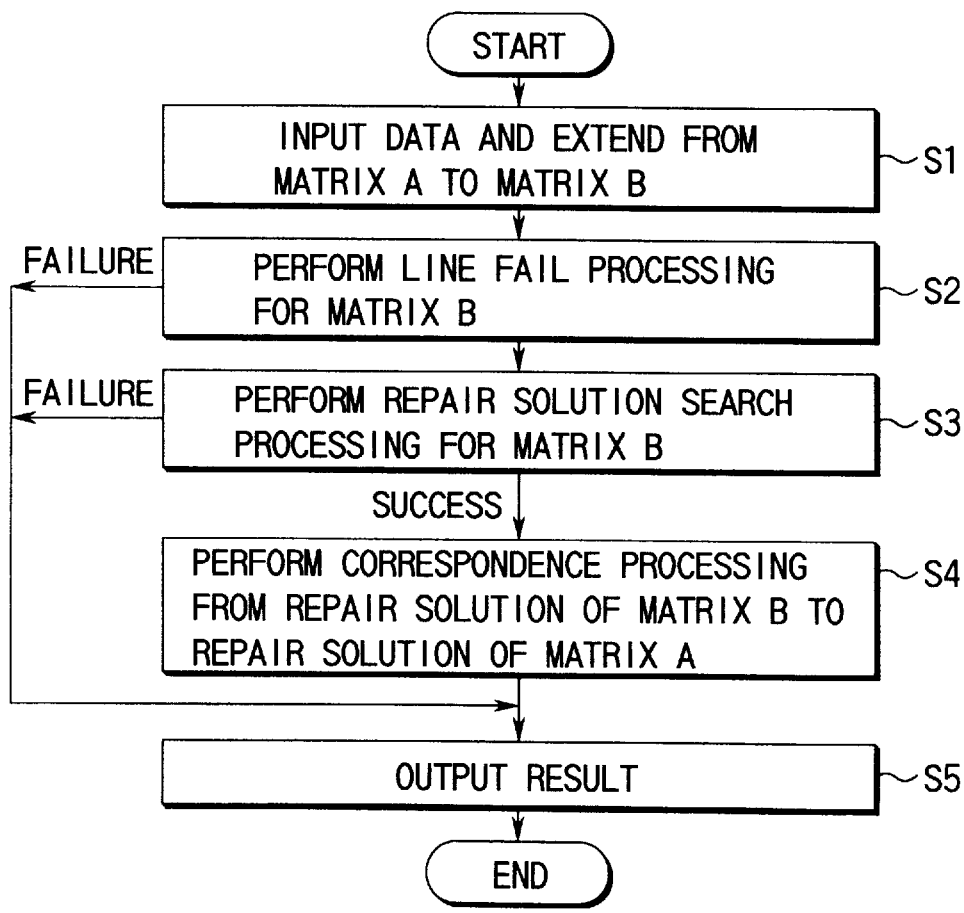
FIG. 8 is a flowchart showing an example of the processing procedure of the fault repair device according to the embodiment of the present invention.

FIG. 7 shows the basic structure of the fault repair device according to the present embodiment together with the flow of the message. This fault repair device comprises an input processing unit 1, a line fail processing unit 2, a repair processing unit 3, and an output processing unit 4. FIG. 8 shows an example of the processing procedure of this fault repair device.

The input processing unit 1 is given, as input, address data (the pair of row address and column address) of faulty elements from a memory-tester and stores it therein at Step S1. This data is held as the matrix B.

The line fail processing unit 2 performs a line fail processing and contracts the matrix B at Step S2. The "line fail", means the state in which, due to the fact that a large number of faulty elements exist on a line, the allocation of a spare line to the line is inevitably determined. For instance, in the case where, in the structure shown in FIG. 1, faulty elements exceeding the remainder of the left spare columns exist in the components belonging to the left columns of same row (say R) belonging to the upper rows of the matrix B, these faults are unrepairable by the left spare columns, so that, in order to repair the RAM, the row R cannot but be repaired by an upper spare row. Such a state is line fail. A line in the state of line fail is called a line fail for short (For instance, the row R above is a line fail). If, in the above mentioned case, the remainder of the upper spare rows is zero, the RAM turns out to be unrepairable. The line fail processing is performed simultaneously with the processing of the input processing unit 1 and/or after the processing is completed.

The repair processing unit 3 evaluates the repair solution for the matrix B by a predetermined procedure at Step S3 or decides that the fault is unrepairable.

The output processing unit 4 evaluates, at Step S4, the repair solution for the matrix A from the repair solution for the matrix B and outputs it. Further, in case, in the line fail processing unit 2 or in the repair processing unit 3, it is decided that the fault is unrepairable, the output processing unit 4 further outputs a message to the effect.

Here, the fault repair method is described by reference to the simple concrete examples shown in FIGS. 9 to 11.

FIG. 9 shows an example of a memory block which has a structure similar to that shown in FIG. 1. In this example, the memory block comprises 4 rows×4 columns and one upper spare row, one lower spare row, two left spare columns, and two right spare columns. Further, in FIG. 9, R1 to R6 designate lines which have row addresses 1 to 6, respectively, and C1 to C8 designate lines which have column addresses 1 to 8, respectively.

In the case of the example shown in FIG. 9, if the address data of the faulty elements is represented in the form of (row address, column address), then the information of (1, 6), (1, 7), (3, 3), (4, 4), (5, 2), (5, 5), (5, 6), (5, 7), (5, 8), (6, 1), and (6, 4) is inputted.

FIG. 10 shows an example of the repair solution corresponding to the example shown in FIG. 9. In this case, R5 and C4 are subjected to line fail. In the case of FIG. 10, the lines of the matrix B which are repaired by the B spare lines are R3, R5, C1, C4, C6 and C7.

As a result, the lines of the matrix A which are repaired are R3, R5, C4, and C6, and the spare lines usable for the repair of the matrix A are R1, R6, C2 and C8 (the spare lines unusable for the repair of the matrix A are C1 and C7).

Further, if correspondence is arbitrarily set (In this case, however, there is no degree of freedom for the correspondence setting), then there is obtained the repair solution in which the line R3 of the matrix A is repaired by the spare row R1, the line R5 is repaired by the spare row R6, the line C4 is repaired by the spare column C2, and the line C6 is repaired by the spare column C8. This is shown in FIG. 11.

In this way, the repair solution can be obtained.

Here, some modifications of the above-mentioned embodiment will be described.

Figure 12:
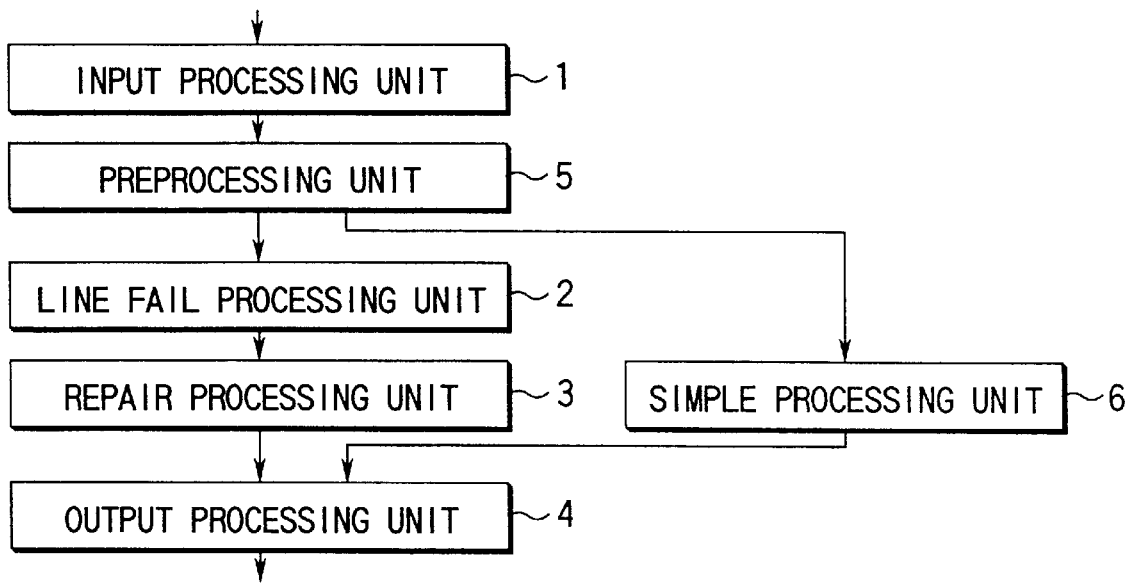
FIG. 12 is a flowchart showing another example of the processing procedure of the fault repair device according to the embodiment of the present invention.
Figure 13:
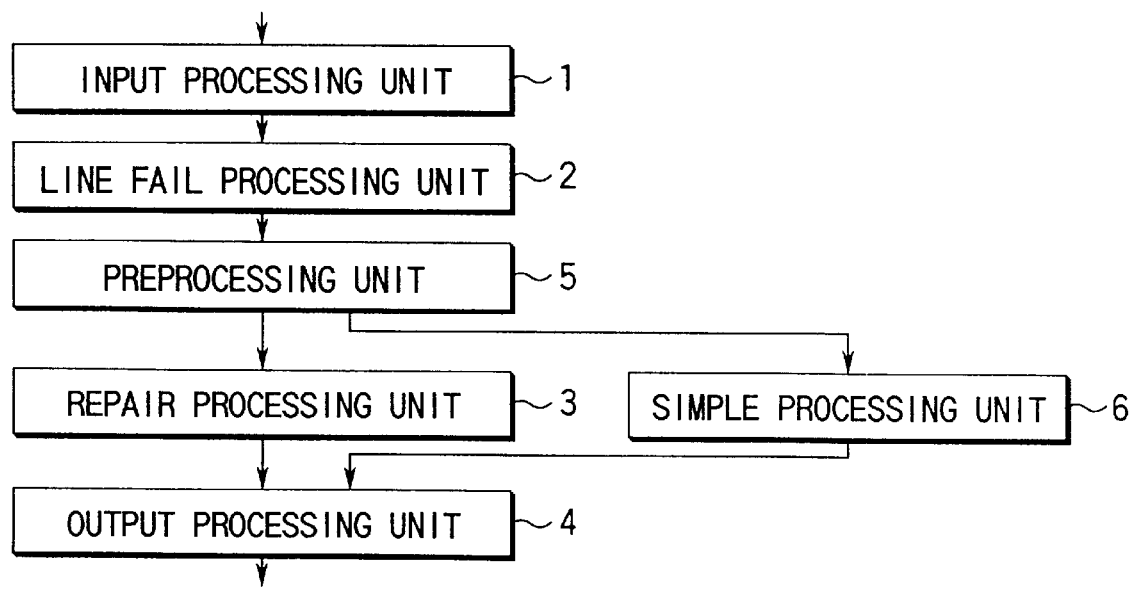
FIG. 13 is a flowchart showing another example of the processing procedure of the fault repair device according to the embodiment of the present invention.

Depending on the distributed state of faulty elements, there is a case where the repair solution can be obtained very easily (by a simple processing). For instance, there are such various cases as the case where the total number of faulty elements is small, the case where the total number of faulty elements excepting the line fails is small, the case where no faulty element exists in the spare lines or the limbos, and the number of faulty elements in the memory block is also small, the case where the number of the faulty elements in the memory block is very small, etc. For instance, in an extreme case where no faulty element exists in the spare lines, and only one faulty element exists in the main block, it is sufficient to select only one arbitrary spare which has this faulty element as the repair target. In such a case, for instance, a simple processing unit 6 may be further provided, besides the repair processing unit 3, as shown in FIG. 12 and FIG. 13, which (simple processing unit 6) performs a simple process corresponding to a previously prescribed condition when the distributed state of faulty elements, etc. satisfy the previously prescribed condition, so that, before and/or after the line fail processing, it is decided in the preprocessing unit 5 whether or not a simple processing can be performed; and, in case it is decided that a simple processing can be performed, a simple processing is carried out.

Further, it is also possible to set a constraint on the processing time for one memory block, so that, in case a repair solution cannot be obtained within this time limit, it is decided that the faulty elements are unrepairable.

Moreover, it is still alternatively possible to constitute the device in such a manner that a line fail processing is performed by the memory-tester, and the address data excepting the faulty elements of the line fails and the address data of the lines to be repaired due to the line fails are inputted. Further, the device can also be constituted in such a manner that the line fail processing may be not performed neither at the memory-tester side nor at the fault repair device side.

Further, it is also possible to arrange the device in such a manner that the fault repair device side (the output processing unit 4) does not go so far as to specify the correspondence of the faulty lines to be repaired with the A spare lines used, on the basis of the repair solution of the matrix B, but evaluates the information (a repair solution in a wider sense) indicative of all the faulty lines to be repaired in the memory block and the A spare lines usable for the repair of the respective faulty lines and outputs the information, while, at the repair apparatus side, the final correspondence is determined.

Several more detailed embodiments which are indicative in more detail of the above-mentioned line fail processing and repair method will be described below. First, an embodiment utilizing the graph theory for the repair method will be described; then an embodiment utilizing the linear programming method for the repair method; and further, various other embodiments and modifications thereof will be described.

First, the fault repair device according to a first embodiment of the present invention will be described.

Figure 14:
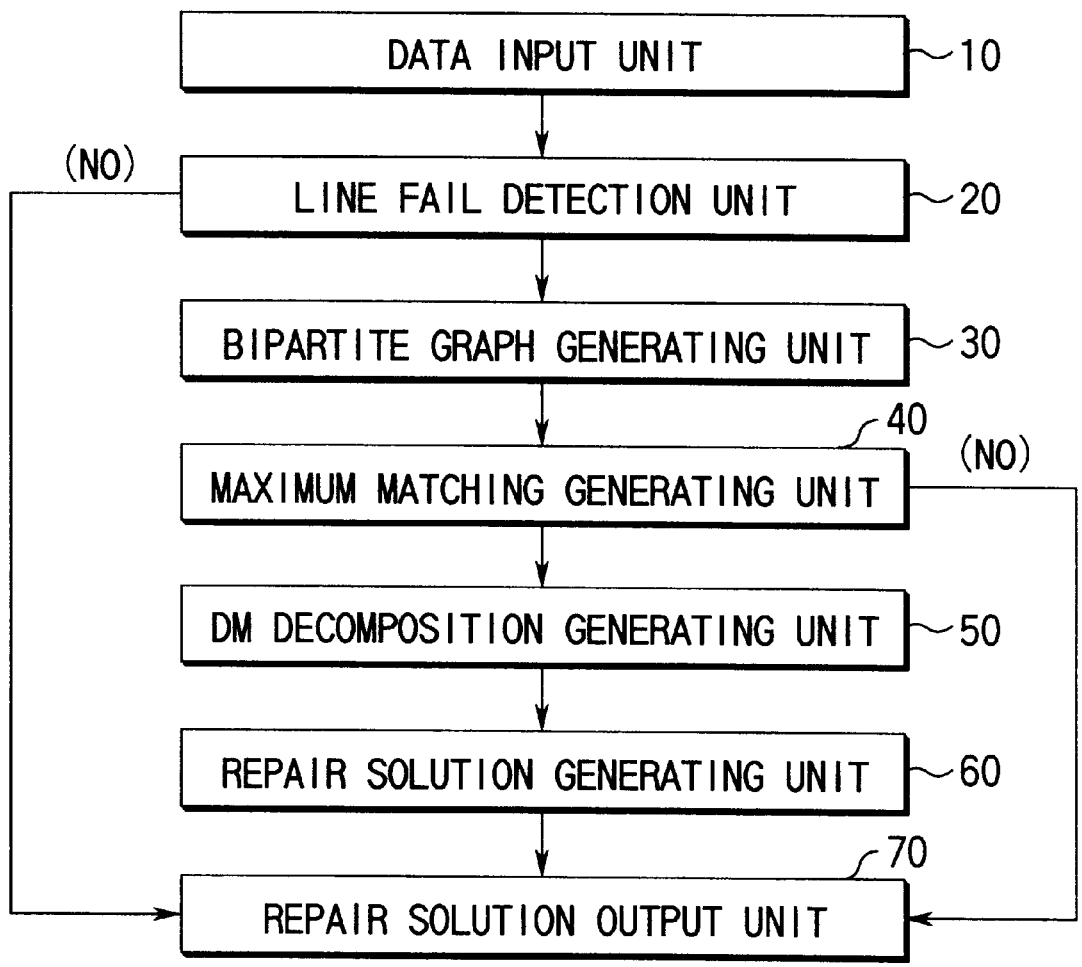
FIG. 14 is a diagram showing an outline of the constitution of the fault repair device according to a first embodiment of the present invention.

FIG. 14 is a block diagram showing an outline of the constitution of the fault repair device according to this embodiment together with the flow of data.

This fault repair device comprises a data input unit 10, a line fail detection unit 20, a bipartite graph generating unit 30, a maximum matching generating unit 40, a DM decomposition unit 50, a repair solution generating unit 60, and a repair solution output unit 70.

The data input unit 10 reads the data relating to the faulty elements in the memory block, the spare lines and the limbos of the RAM.

The line fail detection unit 20 performs the inevitable spare line allocation to lines which have many faults. Further, the line fail detection unit 20 also makes a decision on the unrepairability inevitably determined depending on the sizes of the respective blocks (the overlap portion of the upper part and the left part of the matrix B, etc.) of the matrix.

The bipartite graph generating unit 30 generates a bipartite graph on the basis of the data of the faulty elements contracted through the line fail detection unit 20.

The maximum matching generating unit 40 evaluates the maximum matching of the bipartite graph generated and, further, makes an "unrepairable" decision on the basis of this maximum matching.

The DM decomposition generating unit 50 evaluates a DM decomposition by the use of the data of the maximum matching thus obtained and the contracted graph thereof.

The repair solution generating unit 60 determines the relationship of correspondence between the faulty lines and the spare lines on the basis of the DM decomposition and the contracted graph thereof and, at the same time, detects an "unrepairable".

The repair solution output unit 70 evaluates and outputs the relationship of correspondence between faulty lines in the original memory block and original (actual) spare lines in case a repair solution has been obtained. On the other hand, in case, in the line fail detection unit 20, the maximum matching generating unit 40 or the repair solution generating unit 60, it has become clear that no repair solution which satisfies the constraint pertaining to the number of spare lines exists or in case no repair solution could be obtained within the time limit, the repair solution output unit 70 outputs a message to the effect that "no repair solution exists". However, the repair solution output unit 70 may alternatively be constituted in such a manner that, in case no repair solution could be obtained, the unit 70 outputs, for later analysis etc. information indicative of "in which process faulty lines have proved to be unrepairable for a reason other than the reason why time was up" or "at what processing time the time was up".

As for the operation of the extension from the matrix A to the matrix B, the extension operation is substantially performed, in the data input unit 10, by treating the faulty elements without providing any distinction between them after, the faulty elements of the memory block, the spare lines and the limbos are read in. The process ranging from the line fail detection unit 20 to the repair solution generating unit 60 is an operation directed to the extended matrix B. In the repair solution output unit 70, the operation of calculating, for the first time, the relationship between the faulty lines in the original memory block matrix A and the original spare lines (A spare lines) by discriminating between them.

Figure 15:
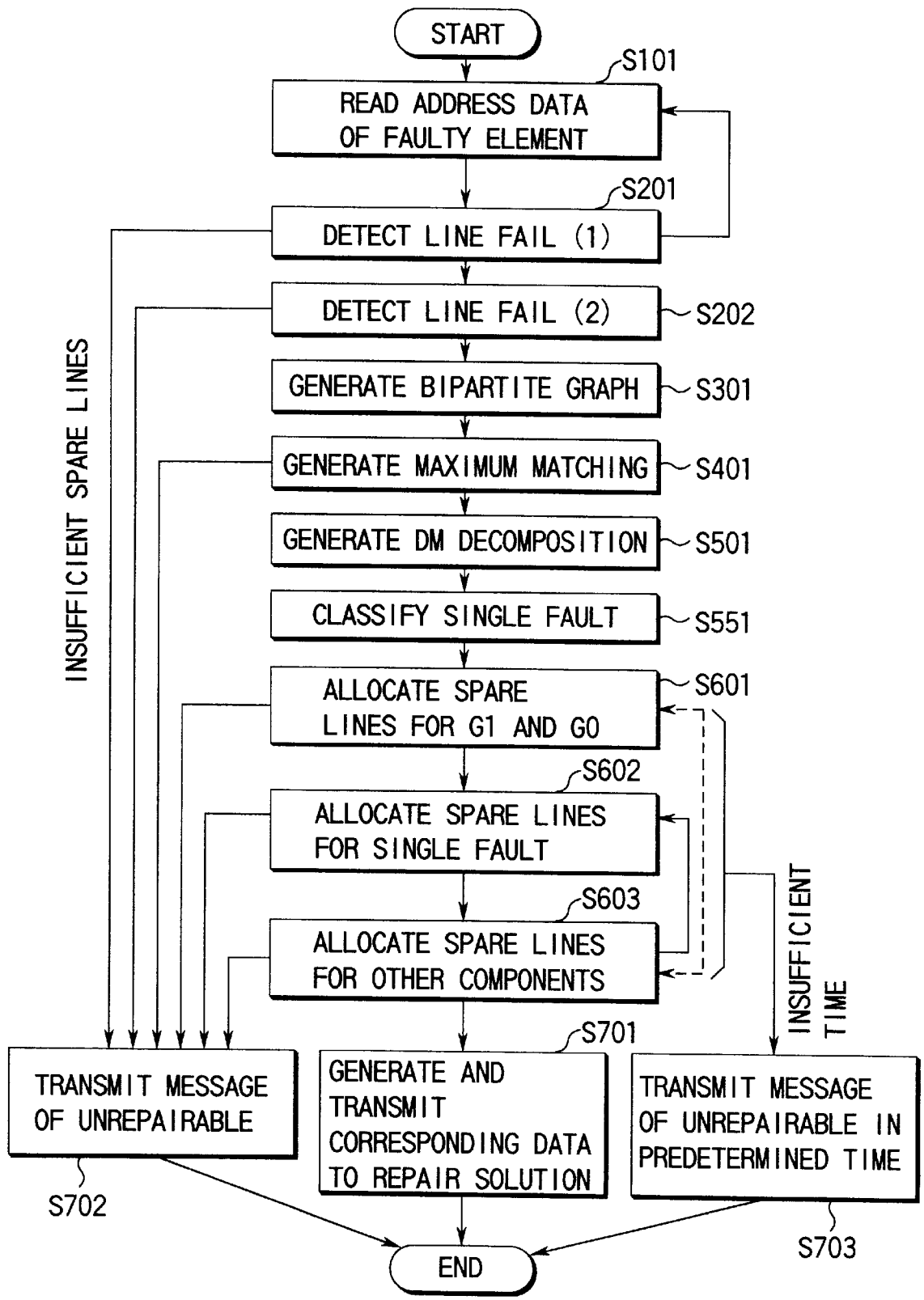
FIG. 15 is a flowchart showing an example of the processing procedure of the fault repair device according to the first embodiment of the present invention.

Next, the processing procedure of the fault repair device according to this first embodiment will be described in detail. FIG. 15 is a flowchart showing an example of the processing procedure of the fault repair device according to the present embodiment.

Here, the case where the data of the faulty elements is inputted concerning such faulty elements as shown in the matrix B (memory block, spare lines and limbos) shown in FIG. 16, as a result of the memory test conducted of one memory block provided within a RAM having the structure described in connection with FIG. 1 is taken up as an example and described below.

As shown in FIG. 16, the memory block of the RAM according to this concrete example is including 24 rows×24 columns (the part excluding the row addresses 1 to 3, and 28 to 30, and the column addresses 1 to 3 and 28 to 30), three upper spare rows (corresponding to the row addresses 1 to 3), three lower horizontal address 28 to 30), three left spare columns (corresponding to the column addresses 1 to 3), and three right spare columns (corresponding to the column addresses 28 to 30), and the total number of 36 limbos corresponding to the above-mentioned spare lines and provided at the four corners. Further, it is to be understood that a constraint pertaining to the spare lines as mentioned already is provided; that is, the constraint that the left upper quarter of the memory block is repairable only by the upper spare rows or the left spare columns, similarly the left lower, the right upper and the right lower quarters of the memory block are repairable only by the lower spare rows or the left spare columns, the upper spare rows or the right spare columns, and the lower spare rows or the right spare columns, respectively. Further, there is imposed a constraint pertaining to the limbos as also mentioned above. In FIG. 16, "1" indicates faulty elements, while "0" indicates normal elements.

As mentioned above, according to this embodiment, first the repair solution for the repair of faulty elements in the matrix B (the memory block, the spare lines and the limbos) is evaluated, in which case a constraint similar to the constraint in the case of the repair of the matrix A is imposed. That is, with reference to the matrix B, three virtual upper spare rows having no faulty elements, three virtual lower spare rows having no faulty elements, three virtual left spare columns having no faulty elements, and three virtual right spare columns having no faulty elements can be used. Further, it is to be understood that there is imposed the constraint that the left upper, left lower, right upper and right lower quarters of the matrix B are respectively repairable only by virtual upper spare rows or virtual left spare columns, virtual lower spare rows or virtual left spare columns, virtual upper spare rows or virtual right spare columns, and virtual lower spare lines or virtual right spare columns. As mentioned above, virtual limbos corresponding to the virtual spare lines are not be used in the following processing.

(1) First, the process, at Step S101, of reading in the address data of the faulty elements through the data input unit 10 and expanding this to the matrix B will be described.

At Step S101, data comprising the set of pairs of the row addresses and the column addresses which indicate the positions of the faulty elements in the memory block, the spare lines and the limbos of the RAM are successively inputted. The above-mentioned data are to be described in the form of row: integer, column: integer.

For instance, in case a faulty elements exists at the cell positioned at the row address 120 and the column address 45, this is described in the form of row: 120, column: 45. It is to be understood that this data is previously sorted incrementally according to the row address or the column address. FIG. 17 shows an example of the input data corresponding to the matrix B shown in FIG. 16.

The form of the input data may be a form other than the above-mentioned one. For instance, the whole bit map data of the matrix B (the row addresses, the column addresses, bits indicative of normal or faulty, etc.) may be inputted.

Further, at Step S101, the various data held within are initialized. For instance, in the case of the example shown in FIG. 16, the remainders of the upper spare rows, the lower spare rows, the left spare columns, and the right spare columns are each set to three as shown in FIG. 18A.

In this embodiment, it is to be understood that it is previously designated whether the spare columns be preferentially used or the spare rows be preferentially used. At Steps S602 and S603 to be described later, the operation somewhat differs in the case where the spare columns are preferentially used and in the case where the spare rows are preferentially used.

By the way, the processing of this Step S101 may be performed in such a manner that the inputting of data at this step S101 is performed all put together, and, after all the data are stored, the line fail processing is executed, but in the case of this embodiment, at Step 101, every time one faulty element data is inputted, the next line fail processing (including data storage) is performed. Accordingly, the following Step S201 is described on this premise.

(2) Next, the first line fail detection processing, at Step S201, by the line fail detection unit 20 will be described.

As explained before, the "line fail" means the state in which, due to the fact that many faulty elements exist, the allocation of the spare lines is inevitably determined. For instance, in FIG. 16, in case faulty elements exceeding in number the remainder of the left spare columns exist in the components belonging to the left columns of some row (say R) belonging to the upper rows of the matrix B, these faulty elements cannot be wholly repaired by the left spare columns, so that the row R cannot but be repaired by an upper spare row in order to repair the RAM concerned. Such a state is line fail. A line in the state of line fail is called a line fail for short (For instance, the row R above is a line fail). If, in the case of this example, the remainder of the upper spare rows is zero, the RAM turns out to be unrepairable.

At Step S201, the addresses of the faulty elements inputted in the order in accordance with which they are sorted by the row addresses or the column addresses are checked in the inputting order, and, in case the same row address or the same column address successively appears, the number of appearances thereof is counted, so that the number at which the same address successively has appeared is compared with the remainder of spare lines corresponding to the row address or column address, whereby whether it is a line fail or not is detected.

In case it is not a line fail, the data is written into an input data storage file.

In case a line fail is detected, the faulty elements belonging to the row or column are all deleted from the input data storage file, and at the same time, the faulty elements belonging to the line are not written into the input data storage file. Further, the row or column is stored and, at the same time, the remainder of the corresponding spare lines is decremented by 1 in order to allocate it to the line fail (that is, it is construed that one spare line has been allocated).

For instance, in the case of the input data shown in FIG. 17, it is decided that row: 1, column: 2 to row: 7, column: 17 do not constitute a line fail, so that these data are written into the input data storage file, and further, row: 10, column: 7
  row: 10, column 24
  row: 10, column 25
  row: 10, column 26 are read in this order and written into the input data storage file, and thereafter, when row: 10, column: 27.

is written in, whereby it is detected, at this point of time, that the row at the address 10 is a line fail (since there are provided only three right spare columns). Accordingly, the above-mentioned four address data pertaining to the row 10 are deleted from the input data storage file; and row: 10, column: 27 is not written into the input data storage file.

Further, it follows that the data to be read in next, row: 10, column: 28 is not written into the input data storage file, either.

As a result, to the line file of the row address 10, an upper spare row is allocated, so that the remainder of the upper spare rows is decremented by 1 into 2. Further, as a line fail, the row address 10 is stored.

Figure 19:
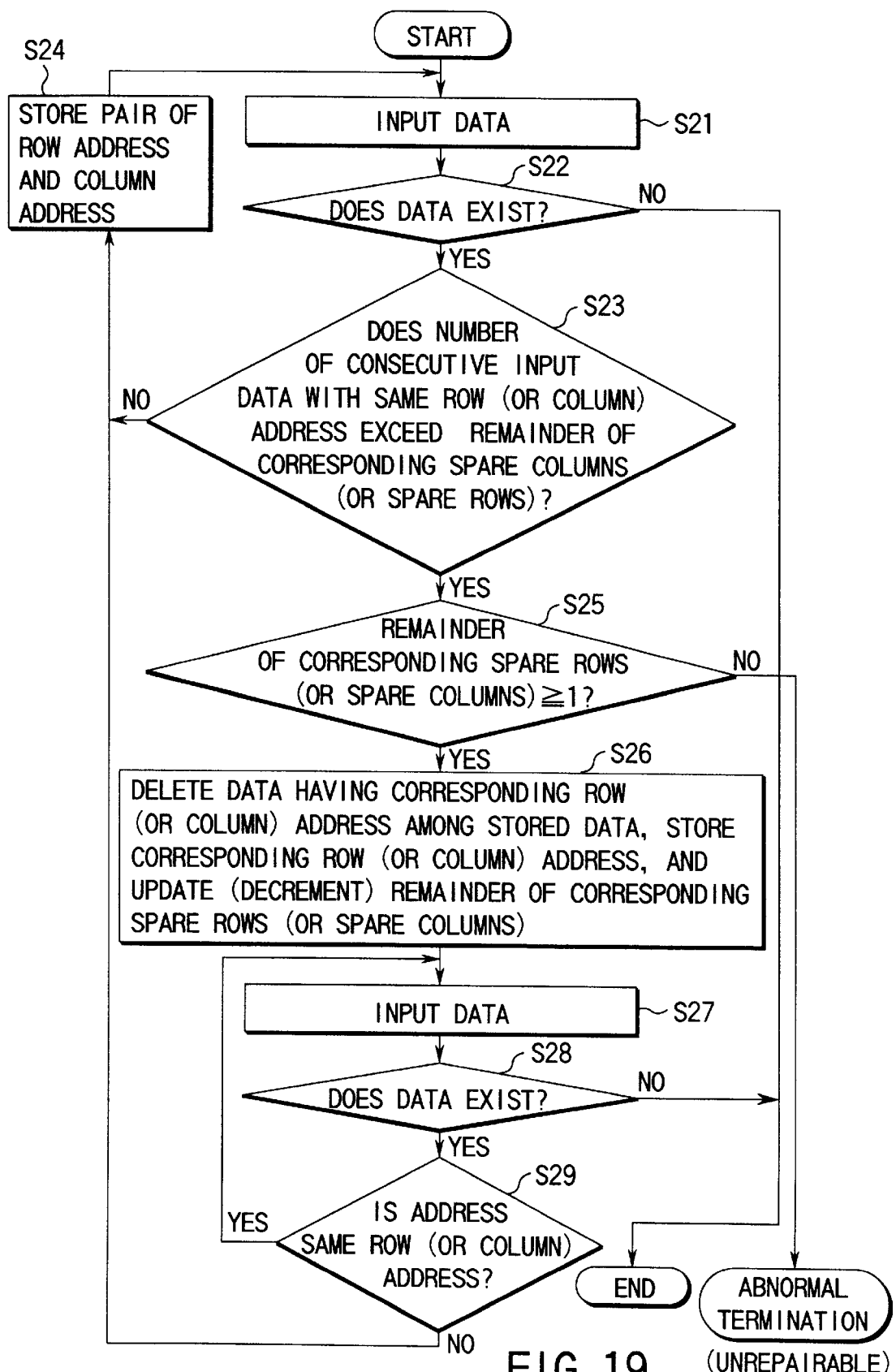
FIG. 19 is a flowchart showing an example of a more detailed processing procedure of Steps S101 and S201 in the flowchart shown in FIG. 15.

Now, as mentioned above, Steps S101 and S201 are to be executed every time one faulty elements data is written in. An example of the processing procedure of Steps S101 and S201 in this case is shown in FIG. 19.

Further, in case, in this line fail processing, the corresponding spare lines are not sufficient in number, so that some line fail is unrepairable, the RAM is unrepairable, and therefore, at this point of time, the processing is brought into an abnormal termination; and the operation proceeds to Step 702.

Here, if the cycle of Steps S101 and S201 is applied to FIG. 17, then the address data of the total number of 22 faulty elements other than the six faulty elements belonging to the line of the row address 10 which has been decided as a line fail are written into the input data storage file. Further, as shown in FIG. 18B, the remainder numbers of the upper spare rows, the lower spare rows, the left spare columns, and the right spare columns are updated into 2, 3, 3 and 3, respectively, and, as shown in FIG. 18C, the row address 10 is stored as a line fail. In FIG. 18, rn stands for the row address n, and cm stands for the column address m. Further, the line at the row address 10 in the matrix B to be repaired by a virtual upper spare row is shown as "line fail (1)" in FIG. 20.

(3) Next, the detection processing of a second line fail by the line fail detection unit 20 at Step S202 will be described.

At Step S202, the total sum of the faulty elements having the same address is calculated with reference to the respective addresses, by reference to the data written in the input data storage file, after the cycle of Steps S101 and S201, and compares the total sums thus obtained with the remainder numbers of the corresponding spare lines, respectively, whereby a line fail detection is performed again. In case a line fail is detected, the faulty elements belonging to the line concerned are all deleted from the input data storage file, and the number of the remainders of the corresponding spare lines is decremented by 1 so as to allocated one to the line fail, and moreover, the address of the row or column detected as a line fail is stored.

Step S202 is repeatedly carried out until no new line fail comes to be detected any more.

Here, it is noted that, at Step S201, only in case the same row address or the same column address successively appeared during the process of successively reading in the faulty elements data, the operation was performed to detect a line fail. Every time a line fail is detected, the remainder of the corresponding spare lines is decremented to allocate one to the line fail. Accordingly, there can be the case where, after the cycle of Steps S101 and S201 is terminated, a line fail can be detected again.

In the case of the example shown in FIG. 17, if, after Steps S101 and S102 are applied thereto, Step S202 is applied to the address data of the 22 faulty elements written in the input data storage file, then the column of the column address 17 is detected as a line fail. It is because there are four faulty elements data having the column address 17, of which three belong to the upper rows of the matrix B, but the remainder number of the upper spare rows is two (since one was used for the repair of the line fail at the row address 10) as shown in FIG. 18B, these three faulty elements cannot but be repaired by a right spare column.

Thus, the four faulty elements belonging to the column address 17 are all deleted from the input data storage file. FIG. 21 shows an example of the contents of the input data storage file at this point of time. The number of faulty elements yet to be repaired is decreased to 18 as shown in FIG. 21.

Further, the remainder number of the right spare columns is decremented by 1 into 2. At this point of time, the remainder number of the spare lines in the concrete example shown in FIG. 17 become two upper spare rows, three lower spare rows, three left spare columns, and two right spare columns as shown in FIG. 18D. Further, as shown in FIG. 18E, the column address 17 is stored. The line at the column address 17 in the matrix B to be repaired by a virtual right spare column is shown at "line fail (2)" in FIG. 20.

Although, in the example shown in FIG. 21, the numbers of the subblocks (the value of i of BKLi) to which the faulty elements belong are registered in the respective entries, but the numbers may not be registered, in which case provisions are made so that the numbers are derived when required.

In this processing, in case the spare lines become insufficient in number, so that a line fail is unrepairable, the RAM concerned is unrepairable, and therefore, the operation proceeds to Step S702.

Here, for the subsequent processing, the remainder of the upper spare rows when the line fails at Steps S 201 and S 202 are all detected is described as res_u. Similarly, the remainder number of the lower spare rows is described as res_d, the remainder number of the left spare columns is described as res_l, and the remainder number of the right spare columns is described as res_r.

In the case of the concrete example shown in FIG. 17,
res_u=2
res_d=3
res_l=3
res_r=2.

(4) Next, the bipartite graph generating process by the bipartite graph generating unit 30 at Step S301 will be described.

At Step S301, the bipartite graph data is generated on the basis of the address data written in the input data storage file.

The respective components of the matrix B are either normal elements or faulty elements and, therefore, can be equivalently realized by the bipartite graph $G=(V_1, V_2, E)$. In fact, the subscripted symbol set in the rows and the subscripted symbol set in the columns of the matrix B correspond to the left vertex set $V_1$ and the right vertex set $V_2$, respectively, and the faulty elements in the matrix B correspond to the edges of G (the elements of E). Here, the matrix B is in a substantially contracted state in case line fails have been detected through Steps S101, 201 and S202.

Figures 23, 24A, 24B:
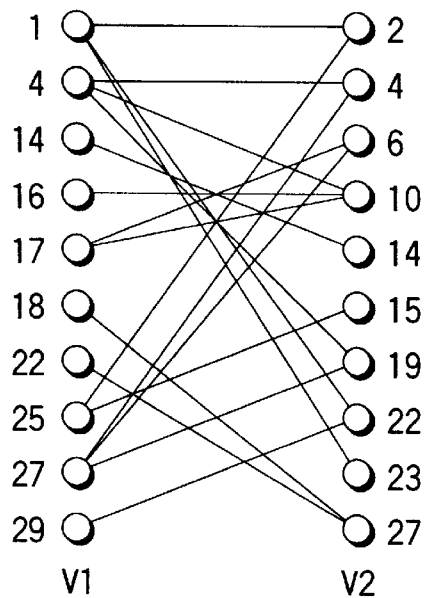
FIG. 23 is a diagram showing a bipartite graph corresponding to the matrix B shown in FIG. 22.
FIGS. 24A and 24B are diagrams showing an example of the table in which the link information in the bipartite graph shown in FIG. 22.

For instance, concerning this concrete example, to show the contracted matrix B on the basis of the address data written in the input data storage file after going through Steps S101, S201, and S202, the contracted matrix B becomes as shown in FIG. 22. FIG. 23 shows the bipartite graph corresponding to the matrix B shown in this FIG. 22.

In the actual program (in the computer), this data of the matrix B need not be held in its actual form by a two-dimensional arrangement but may be directly brought down into the bipartite graph data.

In this example, the data of the matrix B are held as the bipartite graph as shown in FIG. 23 from the beginning. In this case, in the present processing, a table of the adjacent vertices (column addresses) with respect to the respective row addresses as shown in FIG. 24A and a table of the adjacent vertices (row addresses) with respect to the respective column addresses as shown in FIG. 24B are formed. Further, as the processing performed within the computer, in the case of exclusively re-numbering the row addresses and the column addresses successively, starting from 1, distinction can be made between the rows and the columns by the numbers, so that what are shown in FIG. 24A and FIG. 24 can be realized as one table. Further, FIG. 24A and FIG. 24B can be provided in a state combined with FIG. 21.

Further, in case the address data of the fault data is held in the form of a bit map at the point of time when Step S202 is terminated, according to this processing the tables shown in FIG. 21 and FIG. 24 are formed.

(5) Next, the maximum matching generating process by the maximum matching generating unit 40 at Step S401 will be described.

At Step S401, with respect to the bipartite graph formed at Step S301, a maximum matching thereof is calculated. When, in a subset X of edge set E of a bipartite graph G, any two edges included in X have no common end point, X is called a "matching". A matching of maximum cardinality is called a "maximum matching". In the case of obtaining a maximum matching of a bipartite graph, for instance the algorithm of Hopcroft & Karp can be used. This algorithm is disclosed in detail in the literature, Takao Asano: "Structure of Information", published by Nippon Criticism Inc. and also in other many literatures in the field of graph theory. The maximum matching obtained is used for making decisions on "unrepairable" in this processing and also used for generating the DM decomposition at subsequent Step S501.

Now, when, with respect to subsets $U_1$, $U_2$ (wherein $U_1$ stands for a subset of $V_1$, and $U_2$ stands for a subset of $V_2$) of the vertices in a bipartite graph $G=(V_1, V_2, E)$, if [u, v] is an edge of the bipartite graph, "u is an element of $U_1$" or "v is an element of $U_2$". holds, the set represented by the expression (2) is called a vertex cover of the bipartite graph G. A vertex cover of minimum cordinairty is called a "minimum vertex cover". A minimum vertex cover corresponds to an optimum repair solution in case no limit is placed on the number of spare lines (and accordingly, as for a repair solution obtained through a minimum vertex cover mentioned here, there are the case where it is feasible and the case where it is infeasible).

$$U_1 \cup U_2 \qquad (2)$$

In this processing, in accordance with the Konig-Egervary theorem (disclosed in the above-mentioned literature, "Structure of Information"), that "the number of edges contained in a maximum matching is equal to the number of vertices contained in a minimum vertex cover", no repair solution for the RAM concerned can exist in case the number of edges contained in a maximum matching is larger than the total sum of the remainders of the spare lines; and thus, the operation proceeds to Step S701.

Figures 25, 26:
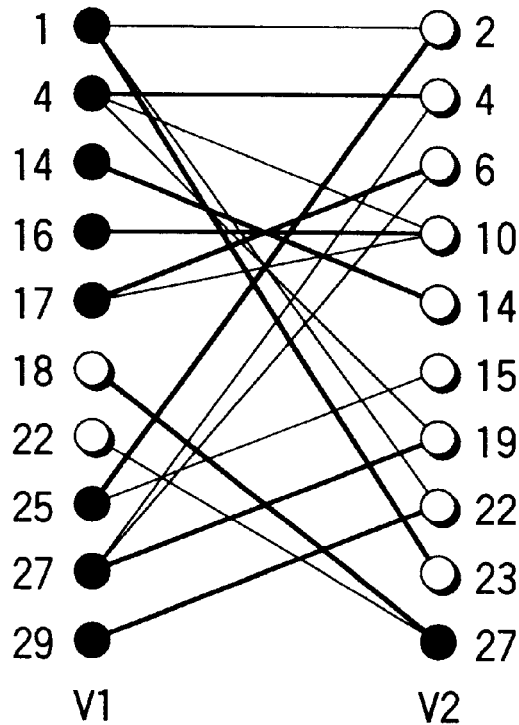
FIG. 25 is a diagram showing an example of the maximum matching and an example of the minimum vertex cover for the bipartite graph shown in FIG. 23.
FIG. 26 is a diagram showing an example of the table in which the maximum matching is stored.

An example of a maximum matching and an example of a minimum vertex covering with respect to the bipartite graph shown in FIG. 23 are shown in FIG. 25. Referring to FIG. 25, the set of the edges shown in thick lines is one maximum matching, and the set of blackened vertices is one minimum vertex cover. A maximum matching is stored by, for instance as shown in FIG. 26, or flags showing the maximum matching in FIG. 24A and 24B.

In this case, the number of sides contained in the maximum matching is 9, which is smaller than the total sum 10 of the remainders of spare lines (two upper spare rows, three lower spare rows, three left spare columns and two right spare columns as shown in FIG. 18D), and therefore, a decision is not made on "unrepairable", so that the operation does not proceed to Step S701 but to subsequent Step S501.

(6) Next, the DM decomposition generating process by the DM decomposition generating unit 50 at Step S501 will be described.

At Step S501, the DM decomposition of the bipartite graph G is evaluated on the basis of a maximum matching obtained at Step S401. The DM decomposition of a matrix is known as one of the block triangularizations (hierarchical decompositions) (disclosed in, e.g., the literature "Linear Calculation", Iwanami Lectures On Applied Mathematics "Method 2", written by Mori et al.). The DM decomposition is, intuitively speaking, that the rows and columns of a given matrix are re-arranged so that some submatrixes are arranged in a diagonal line, and in addition, the components in the left lower half of the diagonal line portion may all become zero. (The strict definition of the DM (A. L, Dulmage & N. S. Mendelsohn) decomposition is described in detail in the literature, "Structure of Information" etc.). The DM decomposition is quickly evaluated by the use of an algorithm for strongly connected component decomposition (disclosed in, e.g., the literature "Structure of Information"), on the basis of the data of the maximum matching obtained at Step S401. The DM decomposition thus obtained is utilized in the process of classifying the faulty elements left after the line fail processing are classified into three types of faulty elements and successively allocating the B spare lines from type to type.

FIG. 27A shows an example of the matrix before the rearrangement thereof, and FIG. 27B shows the DM decomposition of the matrix after the rearrangement thereof (FIGS. 27A to 27C are diagrams shown for a general explanation but does not correspond to the example shown in FIG. 16). Referring to FIGS. 27A and 27B, the numerical figures given at the left-hand sides thereof denote the row numbers, and the upper-side numerical figures denote the column numbers. To the respective submatrixes, ordinarily the names $G_1, G_2, G_3, \ldots, G_n, G_0$ are given in this order, starting from the left upper part. Here, $G_1$ and $G_0$ are special submatrixes; there is the case where they do not exist depending on the matrixes. $G_2, G_3, \ldots, G_n$ are always square matrixes; they are such submatrixes as contain a perfect matching when viewed as bipartite graphs.

In the DB decomposition, in the components in the right upper half of the diagonal portion, 1's (that is, faulty element) may be contained. 1 in the components stands for the relationship of adjacency between the submatrixes. The relationship of adjacency which is expressed in the form of a graph is a directed graph as shown in FIG. 27C. In this embodiment, this directed graph is called the contracted graph of the DM decomposition and represented by the symbol $G_{DM}$.

Figures 28, 29, 30:
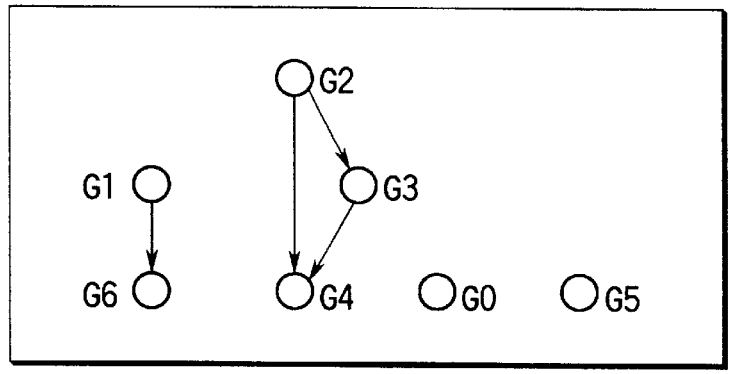
FIG. 28 is a diagram showing the DM decomposition evaluated from the bipartite graph shown in FIG. 23.
FIG. 29 is a diagram showing the contracted graph of the DM decomposition with reference to FIG. 28.
FIG. 30 is a diagram showing an example of the DM decomposition and the method of holding the contracted graph thereof with reference to FIG. 28.

If, on the basis of the maximum matching shown in FIG. 25, the DM decomposition of the bipartite graph shown in FIG. 23 is evaluated, then the DM decomposition shown in FIG. 28 is obtained. The contracted graph $G_{DM}$ of the DM decomposition is shown in FIG. 29.

Within a computer, for instance the DM decomposition and the contracted graph $G_{DM}$ thereof can be held as shown in FIG. 30.

(7) Next, the classifying process of single faults by the repair solution generating unit 60 at Step S551 will be described.

At Step S551, on the basis of the DM decomposition data, the single faults are classified into several sets corresponding to the structure of the memory block.

For instance, in the case of such a structure as shown in FIG. 1, the single faults are classified into four sets. Further, in case there is no constraint on the application of the spare lines to the subblocks, one set is formed.

In the DM decomposition matrix, 1×1 component (submatrix) is formed, and components which are not adjacent to any vertex other than $G_0$ and $G_1$ are called single faults. Ordinarily, in case, with reference to a certain faulty element, no other faulty element exists in the row and column including the faulty element, the faulty element is called a single fault, but, in this embodiment, in principle spare columns are allocated to $G_0$, and spare rows are allocated to $G_1$, so that the expression, "single fault" is used in a sense wider than the above-mentioned definition.

In the case of such a structure as shown in FIG. 1, the single faults can be classified into four sets in dependence to which of the BLK1, BLK2, BLK3 and BLK4 the single faults belong. The set of single faults belonging to the BLK1 is represented by I1. Similarly, the sets of single faults which belong to the BLK2, BLK3 and BLK4, respectively, are represented by I2, I3 and I4, respectively.

To the respective sets, the upper limit numbers of allocatable spare rows are set and represented by sup_I1, sup_I2, sup_I3 and sup_I4, respectively. If the remainder numbers of the upper spare rows and the lower spare rows after Steps S201 and S202 are performed are set to res_u and res_d, respectively, then sup_I1 can be set as the smaller one of the number of elements of in I1 and the value res_u, and sup_I2 can be set as the smaller one of the number of elements in I2 and the value res_d. Similarly, sup_I3 can be set as the smaller one of the number of elements in I3 and the value res_u, and sup_I4 can be set as the smaller one of the number of elements in I4 and the value res_d.

In the case of the example shown in FIG. 28, the faulty element (corresponding to $G_5$) of the row label 14 and the column label 14, and the faulty element (corresponding to $G_6$) of the row label 29 and the column label 22 are both alike single faults. The former belongs to the I1, while the latter belongs to the I4. In this example, there is no other single fault, so that I3 and I4 are empty sets. After Steps S201 and S202 are executed, res_u=2, res_d=3, res_r=2, so that sup_I1=1, sup_I3=0, sup_I4=1.

In case, in the processing loop to be described later, the operation is returned as far as Step S601, the contents of the various data are reserved immediately before the operation shifts to the processing at Step S601 so as to be reproducible later.

By the way, in general in the case of the actual RAM data, faulty elements take place successively in a certain row or column or uniformly (at random) in any row and column in many cases. In case faulty elements successively take place in a specific row or column, such a row or column is repaired as a line fail at Steps 201 and 202 (a spare line is allocated). Therefore, at Step 301 and the steps following it, faulty elements which uniformly take place in any row or column will be taken care of in many cases. In case faulty elements uniformly take place in any row or any column, the majority of the faulty elements become single faults in many cases.

(8) Next, the process of allocating spare lines to $G_1$, $G_0$ by the repair solution generating unit 60 at Step S601 will be described.

At Step S601, spare rows or spare columns are allocated to the components $G_0$ and $G_1$ of the DM decomposition (in case they exist).

First, to all the rows of the matrix B corresponding to the row labels of G1, spare rows are allocated. In case the allocation of spare rows to all the rows of the matrix B corresponding to the row labels of $G_1$ is impossible due to the fact that the remainder number of spare rows is insufficient, spare rows are allocated to such rows of the matrix B corresponding to the row label of $G_1$, that at least one (faulty element) exists at the right side of $G_1$ in the DM decomposition matrix, and, to the other rows, spare rows or spare columns are allocated within the range of the number of usable spare lines.

Next, to all the columns of B corresponding to the column labels of $G_0$, spare columns are allocated. In case the allocation of spare columns to all the columns of B corresponding to the column labels of $G_0$ is impossible due to the fact that the remainder number of spare columns is insufficient, then spare columns are allocated to such columns that at least one (faulty element) exists at the upper side of $G_0$ in the DM decomposition matrix, while, to the other columns, spare columns or spare rows are allocated within the range of the number of usable spare lines.

Depending on the allocation of spare lines to $G_1$, $G_0$, the remainder number of spare lines is changed; and the remainder numbers of the upper spare rows, the lower spare rows, the left spare columns and the right spare columns after the change are again set to res_u, res_d, res_1 and res_r, respectively. Further, the lines of the rows or columns are stored.

In case the remainder number of spare lines is insufficient, and thus, the allocation of spare lines to $G_0$, $G_1$ is not evaluated (in case $G_0$, $G_1$ are unrepairable by any means), it is decided that the spare lines are insufficient, and the operation proceeds to Step S702.

In the example shown in FIG. 28, an upper spare row is allocated to the row having the row label 1, a lower spare row is allocated to the row having the row label 25, and a right spare column is allocated to the column having the column label 27, respectively. Therefore, the remainder numbers of spare lines become res_u=1, res_d=2, ref_1=3, and res_r=1 as shown in FIG. 18F. Further, as shown in FIG. 18G, the row label 1, the row label 25 and the column label 27 are stored. The result of the allocation of spare lines in this processing in the DM decomposition shown in FIG. 28 is shown in FIG. 31A. Further, the lines of the row label 1, the row label 25 and the column label 27 are shown as $G_1(1)$, $G_1(2)$, $G_0$ in FIG. 20.

Figure 32:
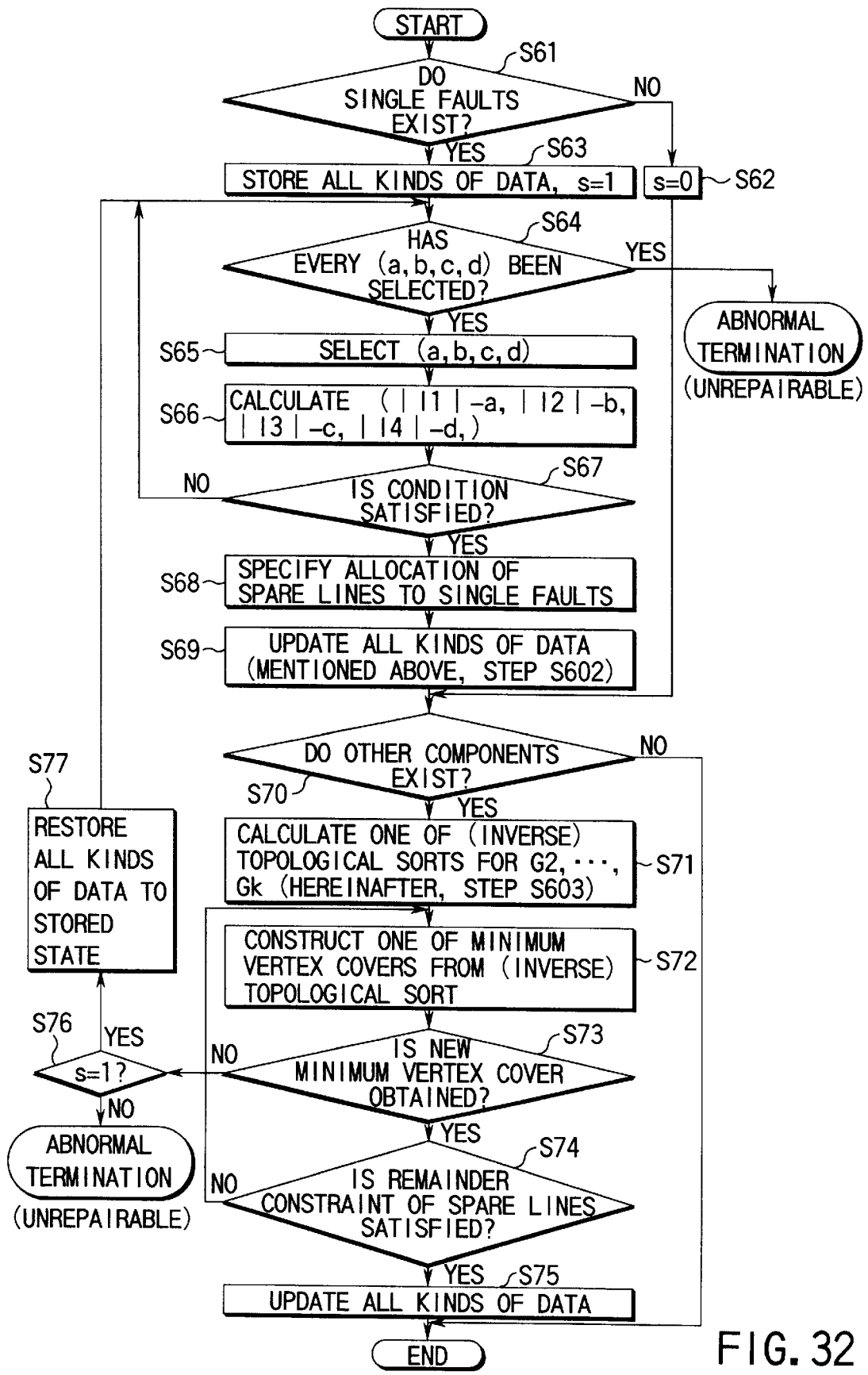
FIG. 32 is a flowchart showing an example of a more detailed processing procedure of Steps S602 and S603 in the flowchart shown in FIG. 15.

Here, it is to be understood that, for the case where the operation is returned as far as the next Step S602 in a processing loop to be described later, the contents of the various data immediately before the operation shifts to the process at Step S602 are stored. (9) Next, the process of allocating spare lines to the single faults by the repair solution generating unit 60 at Step S602 will be described. FIG. 32 shows an example of the processing procedure at Steps S602 and S603.

At Step S602, in case single faults exist, spare lines are allocated to the respective single faults I1, I2, I3 and I4, wherein the element numbers of the single fault groups Il, I2, I3 and I4 are to be represented by |I1|, |I2|, |I3| and |I4|.

One of the combinations (a, b, c and d) of numbers of allocated spare rows to the respective single fault groups I1, I2, I3 and I4 is selected, wherein an integer a can assume a value in the range of 0 to the upper limit number sup_I1, an integer b can assume a value in the range of 0 to the upper limit number sup_I2, an integer c can assume a value in the range of 0 to the upper limit number sup_I3, and an integer d can assume a value in the range of 0 to the upper limit number sup_I4.

Therefore, such combinations exist in the total number of (sup_I1+1)×(sup_I2+1)×(supI3+1)×(sup_I4+1).

As for the method of selecting a combination (a, b, c and d), there are considered to be various methods. In case the spare columns are preferential, a preferred method is that a, b, c and d are selected in this order in such a form as to form quadruple loops in such a manner that first it is set that a=b=c=d=0, and, hereafter, a is continuously increased from 0 up to sup_I1, and then it is set that b=1, and a is increased by 1 from 0 up to sup_I1. In case the spare rows are preferential, a preferred method is that first it is set that a=sup_I1, b=sup_I2, c=sup_I3 and d=sup_I4, and quadruple loops are formed in the order of a, b, c an d so as to decrease the value by 1 successively. Besides the above, there are various other methods such as the method according to which a combination is formed at random each time so that the combination may not become the same with other combinations.

Next, the combination of the numbers of spare columns allocated to the respective single fault groups I1, I2, I3 and I4 is calculated as (|I1|−a, |I2|−b, |I3|−c and |I4|−d) from the above-mentioned combination (a, b, c and d) of the numbers of allocated spare rows and the element numbers of the single faults (|I1|, |2I|, |I3|and |I4|).

Next, with reference to the above-mentioned combinations (a, b, c and d) of allocated spare row numbers, it is decided whether or not the following four conditions are satisfied:

a+c≦res_u, b+d≦res_d, (|I1|−a)+(|I2|−b)≦res_1, and (|I3|−c)+(|41|−d)≦res_r.

In case even one of the four conditions is not satisfied, the combination of the allocated spare row numbers (a, b, c and d) is selected again from the beginning. In connection with this, further, the combination of the numbers of spare columns allocated to the respective single faults is calculated again. Then, decision is made again with reference to the four conditions.

The above-mentioned operation is repeated to obtain (a, b, c and d), (|I1|−a, |I2|−b, |I3|−c, and |I4|−d) which satisfy the four conditions are evaluated.

In case the combination which satisfies the four conditions is obtained, by the use of the combination of the allocated spare numbers (a, b, c and d) and (|I1|−a, |I2|−b, |I3|−c, and |I4|−d), upper spare rows are allocated to the a +c rows, lower spare rows are allocated to the b+d rows, left spare columns are allocated to the (|I1|−a)+(|I2|−b) rows, and right spare columns are allocated to the (|I3|−c)+(|I4|−d) columns.

Following the above-mentioned allocation, the remainder number of the spare lines is calculated again, wherein, in case two more single faults are contained in a certain single fault group, it is decided to which single fault a spare row is to be used and to which single fault a spare column is to be used if the number of the spare rows and the number of the spare columns used concerning the group are each not zero. As the method of making the above-mentioned decision, there are considered to be various methods such as, e.g., the method of allocating spare lines at random, the method according to which first spare rows are allocated in the incremental order of the addresses and then spare columns are allocated, etc.

Then, the addresses of the respective rows and columns are stored. Further, since the remainder numbers of the spare lines are changed as a result of the allocation of spare lines to the single faults, the remainder numbers of the upper spare rows, the lower spare rows, the left spare columns and the right spare columns are again set to res__,u, res__d, res__1, and res__r.

In case, as a result of repeatedly performing the above-mentioned process with reference to every combination (a, b, c and d), what satisfies the four conditions has not been obtained, it is decided that the spare lines are insufficient in number, and the operation shifts to Step S702. Further, in case time was up during the repeated performance of the processing, the operation shifts to Step S703.

In the case of the example shown in FIG. 28, sup__I1=1, sup__I2=sup__I3=0, sup__I4=1, |I1|=1, |I2|=|I3|=0. |I4|=1, and the remainder numbers of spare lines after the execution of Step S601 are res__u=1, res__d=2, res__1=3 and res__r=1.

Here, if it is assumed that, for instance, (a, b, c, d)=(0, 0, 0, 1) is selected, then it follows that (|I1|−a, |I2|−b, |I3|−c, |I4|−d)=(1, 0, 0, 0).

Further, it becomes clear that the above-mentioned four conditions are all satisfied as follows:

a+c (=0)≦res$_u$(=1)

b+d (=1)≦res$_d$(=2)

(|I1|−a)+(|I2|−b) (=1)≦res__1 (=3)

(|I3|−c)+(|I4|−d) (=0)≦res__r (=1)

In the case of this example, it turns out that a lower spare row is allocated to the row having the row label 29, and a left spare column is allocated to the column having the column label 14. The remainder numbers of the spare lines become one upper spare row, one lower spare row, two left spare columns, and one right spare column as shown in FIG. 18H. Further, as shown in FIG. 18I, the row label 29 and the column label 14 are stored. The result of the allocation of spare lines by this processing in the DM decomposition shown in FIG. 28 is shown by thick lines in FIG. 31B. Further, the lines, in the original matrix B, of the row label 29 and the column label 14 are shown as $G_6$ and $G_5$, respectively, in FIG. 20.

(10) Next, the process of allocating spare lines to other components by the repair solution generating unit 60 at Step S603 will be described.

At Step S603, in case components of the DM decomposition other than $G_1$, $G_0$ and the single faults exist, spare lines are allocated to the respective components, respectively. Of the components contained in the DM decomposition, the components other than $G_1$, $G_0$ and the single faults will hereinafter be referred to merely as other components. Here, in the description to follow, $G_2$, $G_3$, ..., $G_k$ stand for the other components without losing generality.

As for the other components $G_2$, $G_3$, ..., $G_k$, the repair solution is evaluated from among the minimum vertex covers obtained from one of topological sorts (in case the spare columns are preferential) of $G_2$, $G_3$, ..., $G_k$ on the contracted graph $G_{DM}$ of the DM decomposition or the antitopological sorts (in case the spare rows are preferential).

In the description to follow, the topological sorts are referred to in case the spare columns are preferential, while the antitopological sorts are referred to in case the spare rows are preferential.

A topological sort is a kind of labeling to the vertex set of an acyclic graph (a directed graph containing no directed cycle), that is, such a labeling that the label at the starting point u becomes smaller than the label at the end point v with respect to any directed side (u, v). Similarly, a antitopoligical sort is a kind of labeling to the point set of an acyclic graph, that is, such a labeling that the label at the end point v becomes smaller than the label at the starting point u with respect to any directed side (u, v). The contracted graph $G_{DM}$ of the DM decomposition is always an acyclic graph, so that topological sorts and antitopological sorts are possible. With respect to one acyclic graph, a plurality of topological sorts and antitopological sorts are possible. One of the topological sorts or antitopological sorts can be evaluated by the depth-first search (disclosed in, e.g., the above-mentioned literature, "Structure of Information").

In case the spare columns are preferential, the minimum vertex cover of $G_2$, $G_3$, ..., $G_k$ can be evaluated by first evaluating one of the topological sorts with respect to $C_2$, $C_3$, ..., $C_k$, and then, allocating spare rows or spare columns so as not to oppose the topological order thereof. Here, the expression, "so as not to oppose the topological order, means that, if a spare row has been allocated to a certain $G_j$ (j>1), then a spare row must also be allocated to every component $G_j$ (1<i<j) which has a label smaller than the topological sort label of $G_j$.

Similarly, in case the spare row are preferential, a minimum vertex cover of $G_2$, $G_3$, ..., $G_k$ can be obtained by first obtaining one of the antitopoligical sorts with respect to $G_2$, $G_3$, ..., $G_k$ and then allocating spare rows or spare columns so as not to oppose the antitopological order thereof. Here, the expression so as not to oppose the antitopological order means that, if a spare column has been allocated to a certain $G_j$ (j>1), then a spare column must also be allocated to every component $G_j$ (1<i<j) which has a label smaller than the antitopological sort label of $G_j$.

The above-mentioned constraint prescribes the repair method of faulty elements which are not contained in any component of the DM decomposition.

From one topological sort or antitopological sort, a plurality of minimum vertex covers can be constituted one after another (as disclosed in, e.g., the above-mentioned literature, "Structure of Information"). Therefore, these minimum vertex covers are generated one by one and compared with the spare remainder constraint, whereby a minimum vertex cover which satisfies the spare remainder constraint is expected to be obtained.

In case the minimum vertex cover which satisfies the remainder constraint to spare lines has not been evaluated, the operation is returned to Step S602, so that the combination (a, b, c, d) of the numbers of spare rows allocated to the respective sets of single faults is selected again, the allocation of spare lines to the single faults is determined, and again search is made for minimum vertex covers for $G_2$, $G_3$, ... $G_k$ again.

In the case shown in FIG. 28, $G_2$, $G_3$, and $G_4$ are other components. If $G_2$, $G_3$ and $G_4$ are topologically sorted, $G_2$, $G_3$ and $G_4$ result. If $G_2$, $G_3$ and $G_4$ are antitopologically sorted, $G_4$, $G_3$ and $G_2$ result. In accordance with this order, for instance, a spare row can be allocated to $G_2$, and spare columns can be allocated to $G_3$ and $G_4$. That is, an upper spare row is allocated to the row having the row label 4, a lower spare row is allocated to the row having the row label 27, a left spare column is allocated to the column having the column label 6, and a left spare column is allocated to the column having the column label 10.

The remainders of spare lines at this point of time are zero upper spare row, zero lower spare row, zero left spare column, and one right spare column as shown in FIG. 18J. Further, as shown in FIG. 18K, the row label 4, the row label 27, the column label 6 and the column label 10 are stored. In this connection, the result of spare allocation by this processing in the DM decomposition shown in FIG. 28 is shown by thick lines in FIG. 31C. Further, the lines having the row label 4, the row label 27, the column label 6 and the column label 10 in the original matrix B are shown as $G_2(1)$, $G_2(2)$, $G_3$ and $G_4$ in FIG. 20, respectively.

In this way, the allocation of spare lines to the other components could be achieved within the range of remainders of spare lines; and thus, it turns out that one repair solution of the matrix B has been evaluated.

In case, even if the processes of Steps S602 and S603 are repeatedly performed, no minimum vertex cover for the other components could be found, it is decided that the spare lines are insufficient in number, and the operation shifts to Step S702. Further, in case the time limit was exceeded by carrying out the above-mentioned series of procedures, it is decided that time is insufficient, and the operation shifts to Step S703 (The above-mentioned series of procedures are effected at a very high speed, so that it is considered that the time limit is very rarely exceeded).

As an alternative, in the above-mentioned processing operation, before returning to Step S602 with no repair solution obtained, a similar processing may be repeatedly carried out with respect to some topological sorts or antitopological sorts, but, if no repair solution cannot be obtained notwithstanding, the operation is returned to Step S602. Further, it is also possible to loop-process such topological sorts or antitopological sorts only in case no single fault exists.

(11) Next, the process of forming and outputting (or transmitting) the correspondence data of the repair by the repair solution output unit 70 will be described.

At Step S701, on the basis of the repair solution (the relationship of correspondence between the faulty lines of the matrix B and the spare lines of B) obtained through the process of Steps S601 to S603, the relationship of correspondence between the faulty lines of the original memory block (matrix A) and the original spare lines is evaluated.

In case, in the repair solution of the matrix B, a spare line of B repairs (corresponds to) a spare line of A, the A spare line is not used for the repair of a faulty line of A. In case a spare line of B repairs a faulty line of A, an A spare line other than the A spare lines which have been determined not to use is allocated. This method of allocation can be arbitrarily preformed as mentioned in the proof of the above-mentioned theorem.

The correspondence data of repair which has been determined by the above-mentioned method is outputted.

Figure 20:
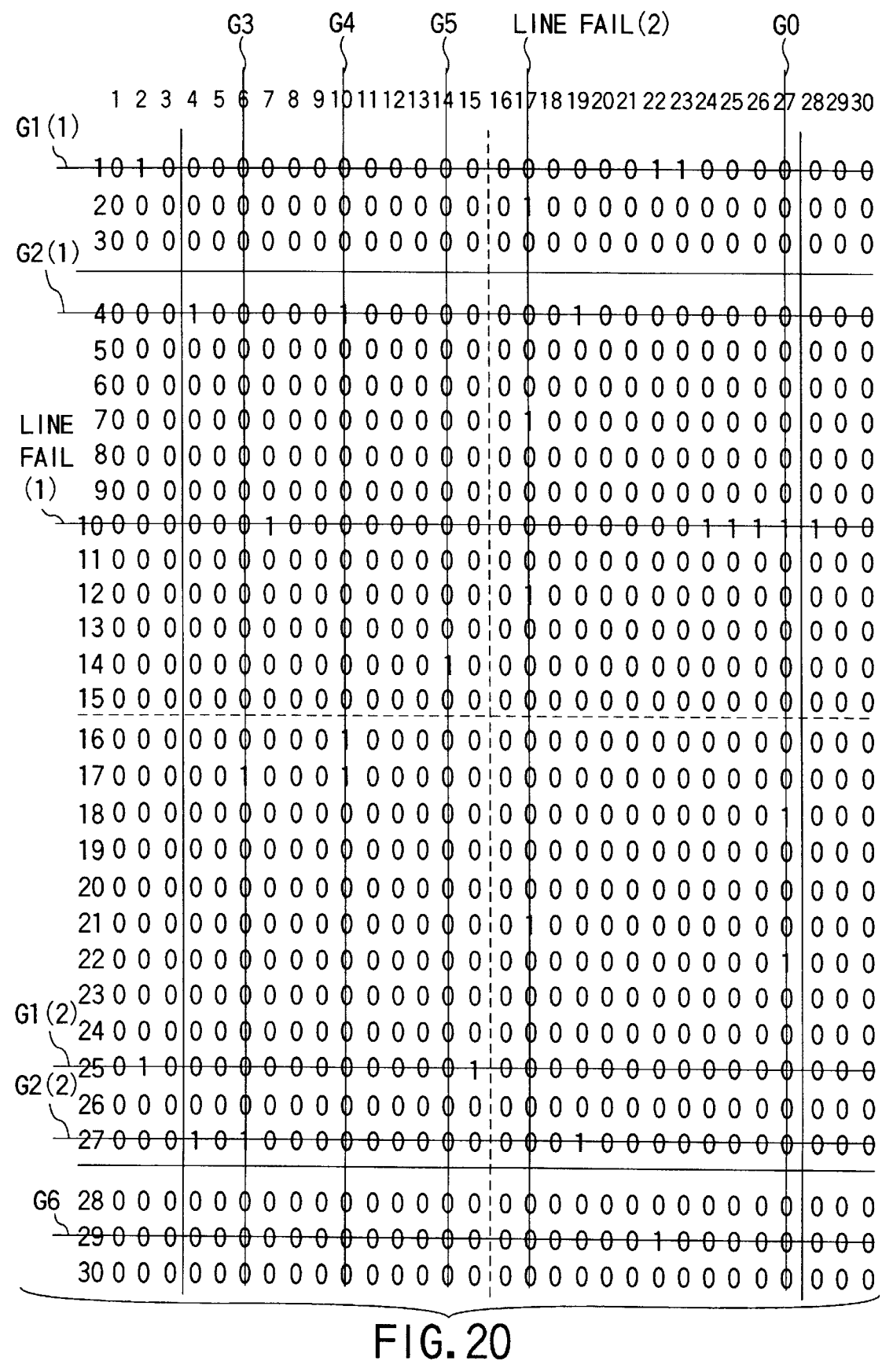

In the case of the example shown in FIG. 16, the row having the row label 10 and the column having the column label 17 are detected as line fails, the rows having the row labels 1, 4, 25, 27 and 29 and the columns having the column labels 6, 10, 14, and 27 are detected as faulty lines to be repaired, in the process of Steps S601 to S603, as shown in FIG. 20. That is, the repair solution of the matrix B is the allocation of the B spare lines (virtual spare lines) to these rows and columns. On the basis of this repair solution, the relationship of correspondence between the faulty lines of the matrix A and the A spare lines is evaluated.

In this case, with reference to the matrix A, the rows having the row labels 10 and 25 and the columns having the column labels 14, 17 and 27 are the lines to be repaired. Further, the row labels 1 and 29 turn out to be the spare lines unusable for the repair, and thus, of the rows having the row labels 2, 3, 28 and 29 and the columns having the column labels 1 to 3, and 28 to 30, the spare lines which are usable for the repair are allocated.

A concrete example of the relationship of correspondence is as follows. First, the rows having the row labels 1 and 29 are both A spare lines, so that neither one of the rows having the row labels 1 and 29 is used for the repair of faulty lines in A. Next, to the faulty rows of the row labels 4 and 10 in A, the upper spare rows 2 and 3 of A are allocated, respectively, and, to the faulty rows having the row labels 25 and 27 in A, the lower spare rows 28 and 30 are allocated. Finally, to the faulty lines having the column labels 6, 10 and 14 in A, the left spare columns 1, 2 and 3 of A are allocated, respectively, and to the faulty lines having the column labels 17 and 27 in A, the right spare columns 28 and 29 are allocated.

It is also possible to output the repair solution in a wider sense may be outputted as mentioned before.

(12) Next, the process of outputting (or transmitting) an "unrepairable" by the repair solution output unit 70 at Step S702 will be described.

At Step S702, it is decided that faults are unrepairable in case the spare lines are insufficient in number and outputs a message to that effect.

(13) Next, the process of outputting (or transmitting) the decision "that the faults are unrepairable within the time limit" by the repair solution output unit 70 at Step S703 will be described.

At Step S703, in case the time limit for the repair is exceeded, it is decided that the faults are unrepairable within the time limit, and a message to that effect is outputted.

The embodiment described above is an example for carrying out the present invention and can be variously modified.

For instance, the calculation of a line fail is executed by the hardware or the memory-tester side, and the data inputted as input data at Step S101 may be the address data of the line fail previously calculated and the information of the faulty elements after the line fails are all calculated. In this case, Steps S201 and S202 can be omitted.

Further, the following is also alternatively possible: After Step S202, with reference to each of the BLK1, BLK2, BLK3 and BLK4, the total number of mutually different row addresses of the faulty elements contained therein and the total number of mutually different column addresses of the faulty elements contained therein are counted, so that, if the total number of the row addresses or the total number of the column addresses exceeds certain threshold values, it is decided that the spare lines are insufficient in number, and the operation proceeds to Step S702. What is referred to as the threshold values here are determined depending on the number of A spare lines. That is, when the number of the upper spare rows in A is assumed to be n, and the number of the left spare columns in A is assumed to be m, the threshold value with respect to the total number of the row addresses in BLK1 is represented as n+m×n, and the threshold value with respect to the total number of the column addresses is represented as m+n×m. That is, these threshold values correspond to the maximum size of the BLK1 in case the BLK1 turns out to be repairable if the upper spare rows and the left spare columns are all used.

Further, as for the processes of the Step S101 and S201, it is not that they are performed by turns repeatedly as mentioned above, but it is also possible to execute each of the Steps in a batch processing manner. Further, in case such a batch process is performed, after the termination of S101, Step S201 may be omitted, so that the following Step S202 may be executed. Further, as the line fail process, it is also possible to use a different algorithm. For instance, it is possible to use the algorithm disclosed in "Efficient spare allocation for reconfigurable arrays", by Sy-Yen Kuo and W. Kent Fuchs, IEEE Design and Test, pp. 24–31, 1987 (For more details, see FIG. 5).

Further, the decision "no repair solution exits" due to the number of edges in the maximum matching at Step S401 can also be effected limitatively with respect to each of the upper part, the lower part, the left part and the right part of the matrix B and the shared parts thereof (the left upper part, the right upper part, the left lower part and the right lower part). For instance, the following is also possible. Of the subgraphs of the bipartite graph G, the maximum matching is evaluated with respect to the subgraph comprising only the vertices corresponding to the rows and columns in the upper part of the matrix B, and the set of the sides among the vertices, the number of the edges and the total number of the usable spare lines in the upper part of the matrix B are compared with each other, so that, if the former is larger than the latter, it is decided that "no repair solution exits", and the operation can proceed to Step S720.

As for the range of this decision, there are considered to be cases where the decision is made by combinations of various methods. For instance, the case where the whole memory block mentioned above is used as the range of object, and, besides this, (1) the method according to which the decision is made concerning each of the upper part, the lower part, the left part and the right part, (2) the method according to which the decision is made cornering each of the left upper part, the right upper part, the left lower part and the right lower part; the combination of the whole memory block and (1), the combination of the whole memory block and (2), the combination of the whole memory block and (1) and (2), etc. are considered to be employable. In case a plurality of decisions are to be made, if it is decided that "no repair solution exits" by any one decision, then the RAM concerned turns to be unrepairable, so that the operation proceeds to Step S702 at the point of time when the decision is given.

Further, the following is also possible. After Step S551, such single faults as belong to the original spare lines (A spare lines) of the matrix A are previously extracted from within the single fault groups I1, I2, I3 and I4; at Step S602, first such single faults are repaired by the B spare lines in such a manner not to cross the interior of A. In other words, the A spare lines including single faults can be made not to be used for the repair of the faulty elements in A, as a result of which the finally total number of spare lines used can be reduced in some cases.

Further, it is also possible to change the order of Step S602 and Step S603 therebetween. In other words, after the allocation of spare lines to the other components, the allocation of spare lines to the single faults can be performed by the use of the remainders of the spare lines at this point of time.

Moreover, at Step S603, the method of evaluating the minimum vertex covers of the $G_2, G_3, \ldots, G_k$ is limited only to the minimum vertex covers obtained from one of the topological sorts or the antitopological sorts, but it is also possible to use the method disclosed in the literature, "Generation linear extensions fast", by G. Pruesse and F. Ruskey, SIAM J. Computing, Vol. 23, pp. 373–386, 1994, whereby all the topological sorts or antitopological sorts are evaluated to check the other minimum vertex covers (In this case, however, attention should be paid to the fact that, from the different topological sorts or antitopological sorts, the same minimum vertex cover is obtained in many cases). Or, the method disclosed in the literature, "Generation of maximum independent sets of a bipartite graph and maximum cliques of a circular-arc graph", by T. Kashiwabara, et al., J. Algorithms, Vol. 13, pp. 161–174, 1992, can be used to enumerate all the minimum vertex covers.

Further, if, at Step S603, components large in size exists among the components $G_2, G_3, \ldots, G_k$, the components are repaired by a gathering of spare lines comprising a mixture of spare rows and spare columns, and thereafter, the minimum vertex covers of the remaining components can be evaluated.

Further, in case, in spite of repeatedly performing the process of Step S602 and S603, no minimum vertex cover has been found for the other components, the operation may be returned to Step S601 to change the method of allocating spare lines to the components $G_1$, $G_0$. In this case, the allocation of spare lines to $G_1$, $G_0$ is performed by the use of the gathering of spare lines comprising a mixture of spare rows and spare columns. It has been explained above in connection with Step S601 that, to such a line that 1 exists at the right side of $G_1$, a spare row is allocated, and, to such a line that 1 exists at the upper side of $G_0$, a spare column is allocated, but, by interpreting the definition on single faults in the original narrow sense, a spare column can be allocated to a line containing 1 at the right side of $G_1$, or a spare row can be allocated to a line containing 1 at the upper side of $G_0$. In this case, when for instance the contents of the various data immediately after the termination of the line fail detection are reserved to change the method of spare allocation, the contents of the various data are restored to the state thereof at the time when they were reserved.

Figure 33:
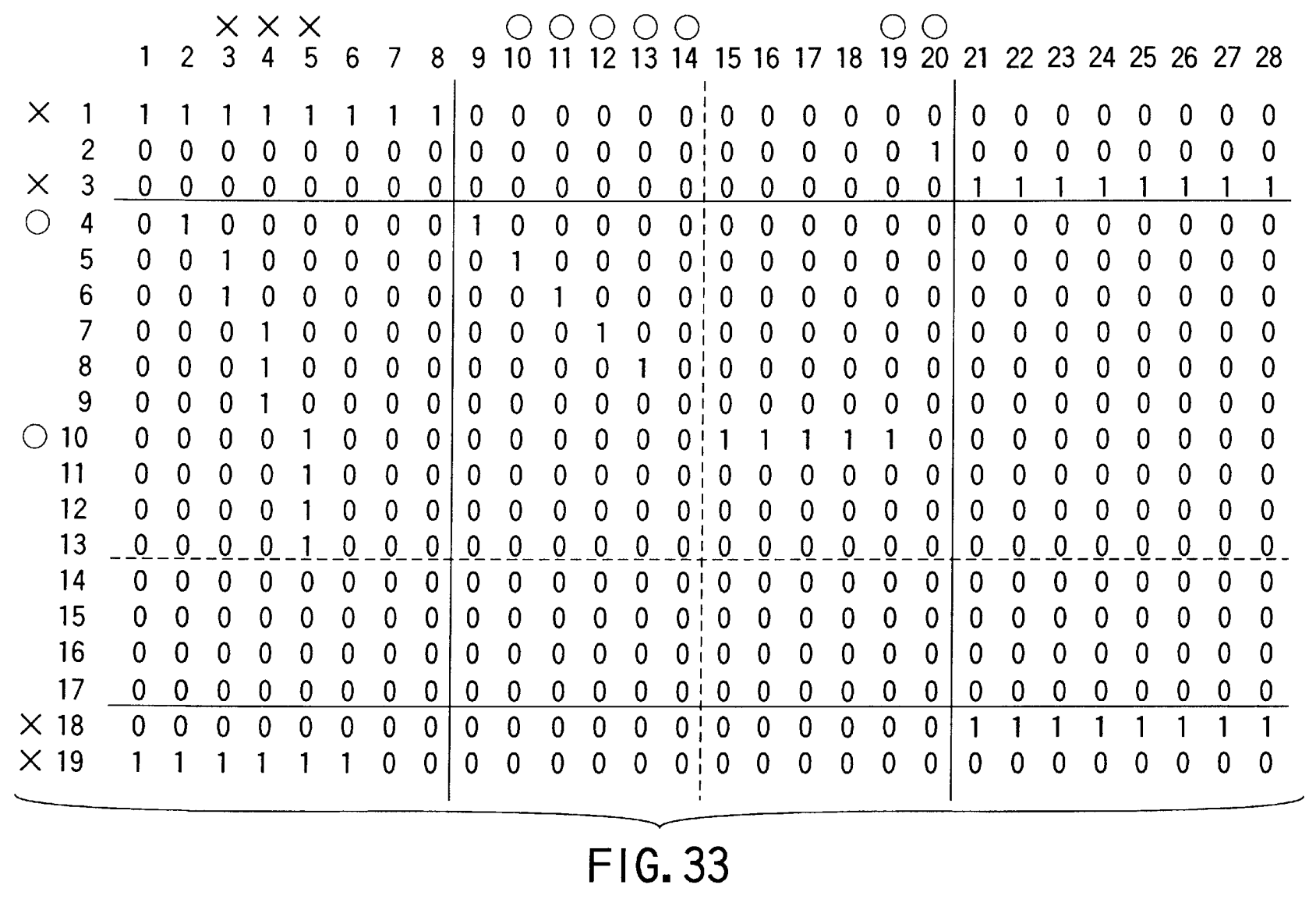

Here, an example of the case where, to the rows and columns corresponding to the row labels and the column labels of G1, the allocation of spare lines must be performed by the use of a gathering of spare lines comprising a mixture of spare rows and spare columns is shown in FIG. 33. FIG. 33 is depicted by deleting the rows without any faults and the columns without any faults from the matrix B when input is given. In this example, it is to be understood that there are four upper spare rows and four lower spare rows, eight left spare columns and eight right spare columns. In FIG. 33, the addresses of the rows and columns are changed to serial number.

Figure 34:
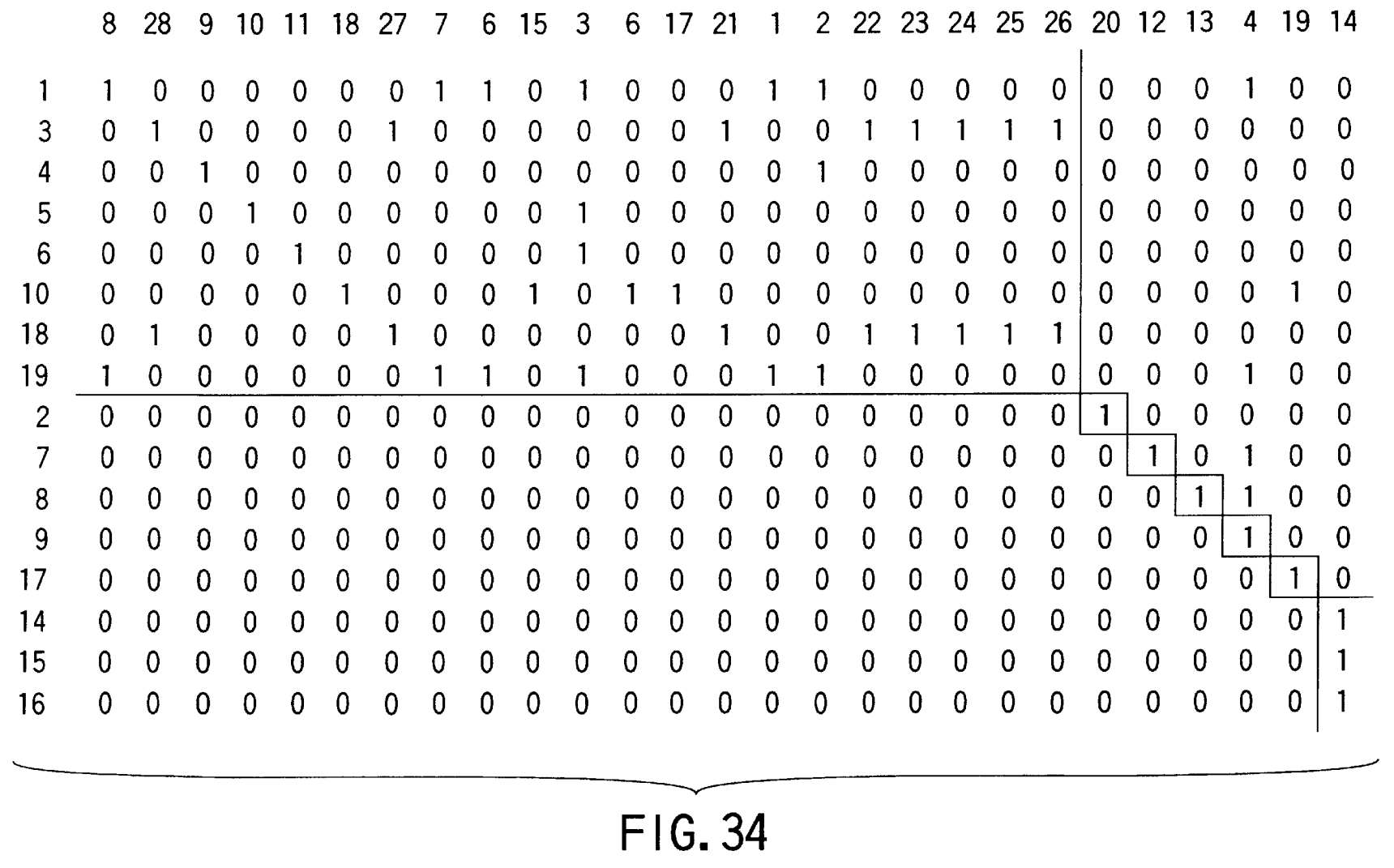

FIG. 34 shows the DM decomposition matrix with respect to the matrix B after, in FIG. 33, a line fail (the column having the column label 5) is detected. In FIG. 33, the rows and columns having those row labels and column labels to which the mark ○ or the mark X are put are repair solution of B. Of them, the rows and columns having the ○ marked row labels and column labels indicate the faulty lines to be repaired in A, while the rows and columns having the X marked row labels and column labels are the A spare lines which have been determined not to use for the repair of the faulty lines in A.

In the case of the repair solution method according to this embodiment, the spare lines (faulty spare lines) containing faulty elements are not specially treated but treated equally to the lines in the memory block. Due to this, even if there is such a repair solution without the use of faulty spare lines, such a repair solution is not always outputted. This is unfavorable in view of the minimization of the number of spare lines usable for a repair solution. Thus, the following improvement can be made.

First, a repair solution is evaluated by regarding all spare lines containing faulty elements as line fails. That is, as Step 203, the process of "regarding all the faulty spare lines as line fails" is added as Step S203 to follow Step S202. Then, in case the operation proceeds to Step S702 from Step S401, S601, S602 or S603, the process of returning the operation to Step S301 is added instead of the step of transmitting a message to the effect of "unrepairable" (However, the process of returning to Step S301 is performed only once here). In case the operation is returned to Step S301, the data of the faulty spare lines are removed from the data of the line fails, and the gathering of faulty elements data to which the faulty elements data on the faulty spare lines are added is made to be the repair target.

Next, the fault repair device according to a second embodiment of the present invention will be described.

Figure 35:
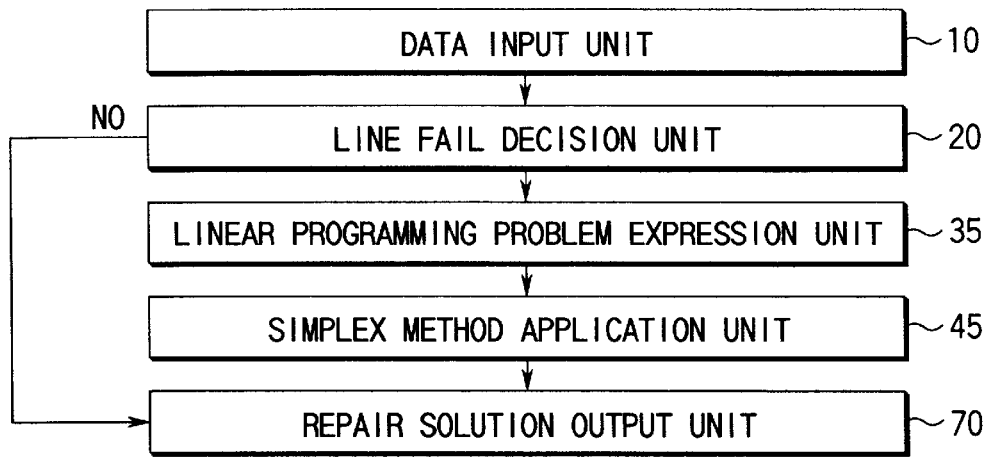
FIG. 35 is a diagram showing an outline of the constitution of the fault repair device according to a second embodiment of the present invention.

FIG. 35 is a block diagram showing an outline of the constitution of the fault repair device according to this second embodiment together with the flow of data. This fault repair device comprises a data input unit 10, a line fail detection unit 20, a linear programming problem expression unit 35, a simplex method application unit 45, and a repair solution output unit 70.

The data input unit 10, the line fail detection unit 20, and the repair solution output unit 70 are the same as those according to the first embodiment.

The linear programming problem expression unit 35 expresses the fail bit data reduced through the line fail detection unit 20 and the range of application and the number limit of the spare lines.

The simplex method application unit 45 applies the simplex method to the linear programming problem to determine the relationship of correspondence between the faulty lines and the spare lines.

Figure 36:
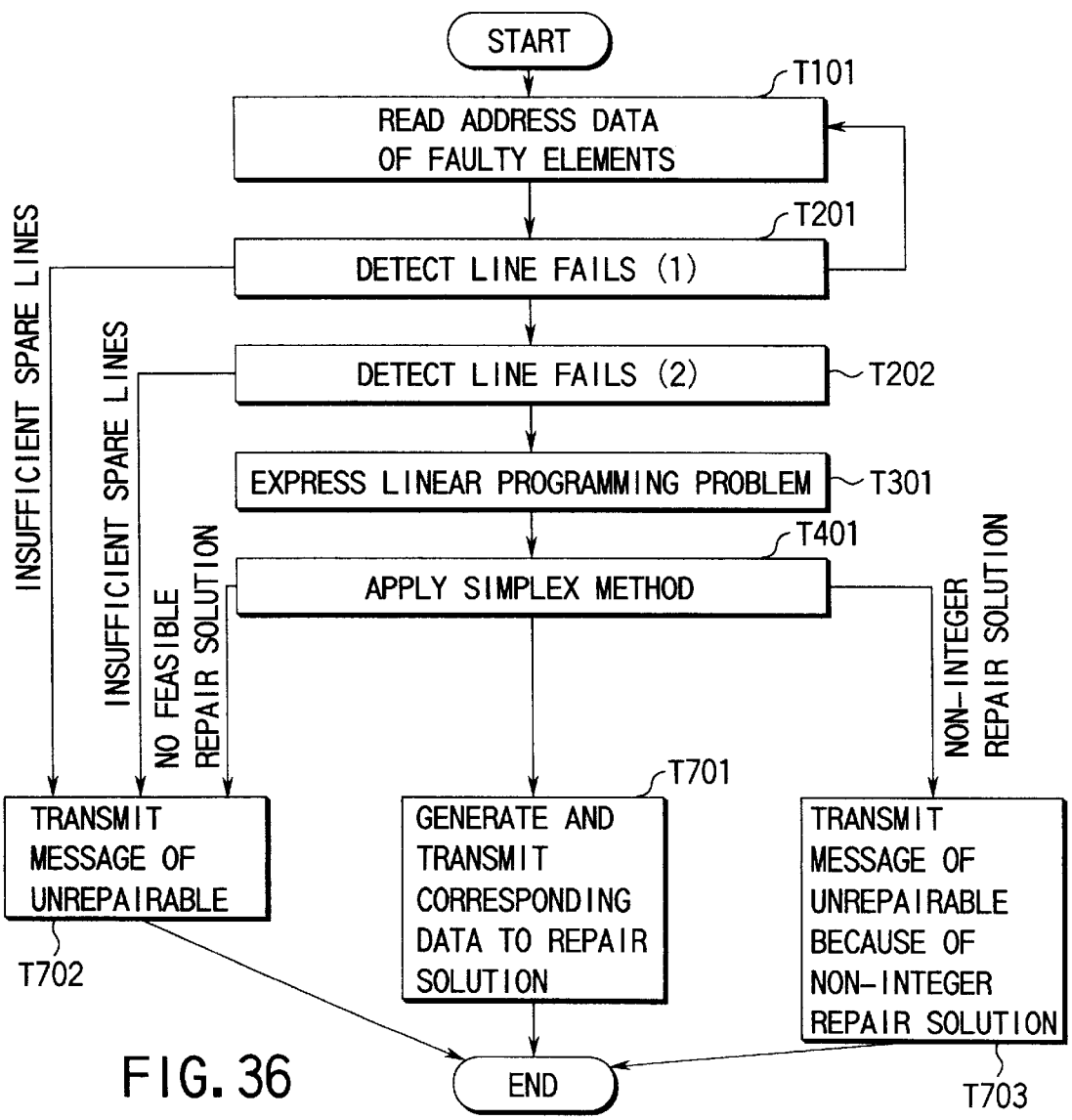
FIG. 36 is a flowchart showing an example of the processing procedure of the fault repair device according to the second embodiment of the present invention.

Next, the processing procedure of the fault repair device according to this embodiment is described by the use of the flowchart shown in FIG. 36. However, Step T101, Step T201 and Step T202 are identical with Step S101, Step S201 and Step S202, and therefore, the process after Steps T301, will be described.

(1) At first the process of forming an expression of the linear programming problem performed by the linear programming problem expression unit 35 at Step T301 will be described.

At Step T301, the position information of faulty elements in the input data storage file generated throughout steps T101, T201 and T202 and the application range and the number limit of spare lines are expressed through the linear programming problem.

In general, the minimum vertex cover problem of the bipartite graph G can be formulated as an integer programming problem (IP) as follows (This is disclosed in, e.g., the above-mentioned literature "Structure of Information").

$$(IP) \text{ Minimize } \sum_{i=1}^{n} x_i$$

Subject to: $(x_1, x_2, \ldots, X_n) K \geq I_m$ $x_i \in \{0, 1\} (1 \leq i \leq n)$ Here, n and m stand for the number of vertices and the number of edges of G, respectively (that is, the total number of the faulty elements after the completion of the line fail processing). K stands for the incidence matrix of G, and $I_m$ stands for the row vector size m such that all the elements are 1.

Figure 37:
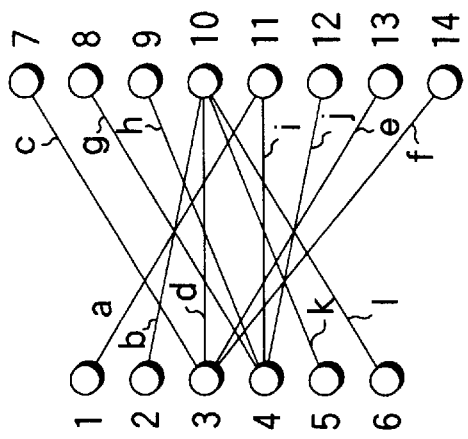
FIGS. 37A to 37C are diagrams for explaining the matrix B, the bipartite graph and the incidence matrix.

FIG. 37A shows an example of the matrix B contracted through Steps T101, T201 and T202, FIG. 37B shows a bipartite graph corresponding to the matrix B, and FIG. 37C shows the incidence matrix K of the bipartite graph G equivalently expressing the matrix B. The numbers (indexes) of the rows and columns of the matrix B correspond to the vertex numbers of the bipartite graph G. Here, as the numbers of the rows or columns of the matrix B, serial numbers starting from 1 are used in order to make it easy to see the vertex numbers of the bipartite graph. The labels a, b, c, etc. of the sides in the bipartite graph G correspond to the faulty elements in the matrix B. The incidence matrix K is a matrix representing the incidence relation between the vertices and the sides of the bipartite graph G.

The minimum vertex cover problem of a bipartite graph and the maximum matching problem are problems of a bipartite graph dual to each other in view of the linear programming problem, so that the second condition part of the above-mentioned expression is replaced by the real number condition, $x_i \geq 0$ $(1 \leq i \leq n)$, whereby they can be treated as a linear programming problem (as disclosed in, e.g., in the above-mentioned literature, "Structure of Information"). That is, the following linear programming problem (LP) has an integer solution as an optimum solution.

$$(IP) \text{ Minimize } \sum_{i=1}^{N} x_i$$

Subject to: $(x_i, x_2, \ldots, X_n) K \geq I_m$.

$X_i \in 0 (1 \leq i \leq n)$

As mentioned above, a minimum vertex cover corresponds to an optimum repair solution in case no constraint is imposed on the number of spare lines.

In the case of the original fault repair problem which has a constraint on the number of spare lines, first on the position information of the faulty elements in the input data storage file, the coefficient matrix K is formed. Next, the application range and the number constraint to spare lines are expressed by linear inequalities, whereby they can be expressed by the following integer programming problem (RIP). However, the following one is an example of the case where the structure exemplarily shown in FIG. 1 is used as the repair target; but in actuality, it varies in accordance with the various limiting conditions.

$$(RIP) \text{ Minimization } \sum_{i \in idx(A)} xi$$

Condition: $(x_1, x_2, \ldots X_n) K \geq I_m$, $x_1 + x_2 + \ldots + x_u \leq 3$, $x_{u+1} + x_{u+2} + \ldots + x_{u+d} \leq 3$, $x_{u+d+1} + x_{u+d+2} + \ldots + x_{u+d+l} \leq 6$, $x_{u+d+l+1} + x_{u+d+l+2} + \ldots + x_{u+d+l+r} \leq 6$ $x_i \in \{0, 1\} (1 \leq i \leq n)$ Here, the matrix B is the contracted matrix B after it has gone through the Step T202, and the rows and columns thereof are given the serial numbers 1, 2, 3, . . . u, d, l and r stand for the numbers of the upper rows, the lower rows, the left columns, and the right columns, and u+d+l+r=n. An idx(A) stands for the set comprising the numbers (indexes) of rows and columns corresponding to the rows and columns of the original memory block matrix A.

For instance, in the case of the matrix B shown in FIG. 37A, n=14, m=12, u=d=3, L=r=4, idx(A)={2, 3, 4, 5, 9, 10, 11, 12}.

If the integer condition $x_i$ ($x_i$ equal to 0 or 1) for all i $(1 \leq i \leq n)$ of this integer programming problem (RIP) is replaced by the real number condition $x_i \geq 0$ $(1 \leq i \leq n)$, then the following linear programming problem (RLP) is obtained:

$$(RIP) \text{ Minimize} \sum_{i \in idx(A)} x_i$$

Subject to: $(x_1, x_2, \ldots X_n) K \geq I_m$, $x_1 + x_2 + \ldots + x_u \leq 3$, $x_{u+1} + x_{u+2} + \ldots + x_{u+d} \leq 3$, $x_{u+d+1} + x_{u+d+2} + \ldots + x_{u+d+1} \leq 6$, $x_{u+d+1+1} + x_{u+d+1+2} + \ldots + x_{u+d+1+r} \leq 6$ $xi \geq (1 \leq i \leq n)$ (2) Next, the process of obtaining a repair solution by the application of the simplex method performed by the simplex method application unit 45 at Step T401 will be described.

At Step T401, the simplex method is applied to the above-mentioned linear programming problem (RLP). The simplex method is a well known algorithm for a linear programming problem (LP) and is disclosed in detail in, e.g., the literature, "Linear Programming Method", written by Hiroshi Konno, published by Japan Science and Technology Association.

This linear programming problem (RLP) is not guaranteed for having an integer solution as a optimum repair solution unlike the above-mentioned linear programming problem (LP), but, in the case of this linear programming problem (RLP), in the actual RAM data in which the faulty elements after the repair of the line fails tend to take place uniformly in any row and any column, integer solutions can be obtain in so many cases. Further, the integer programming problem (RIP), which is obtained by equivalently formulating the original fault repair problem which has a constraint on the number of spare lines, always turns out to be an optimum repair solution in case the linear programming problem (RLP) has an integer repair solution.

In case, in the phase I (first stage) of the simplex method, it has proved that no feasible solution exists in the linear programming problem (RLP), the operation shifts to Step T702. Further, in case the output result of the simplex method is a non-integer solution, the operation shifts to Step T703.

If the simplex method is applied to the matrix B shown in FIG. 37A, then the result obtained is $x_1 = x_4 = x_7 = x_{10} = x\_ = x_{14} = 1$, and $x_i = 0$ for all other i. The value of the target function in that case is 2. However, it is determined that, in the original matrix A, there are three upper spare rows, three lower spare rows, three left spare columns, and three right spare columns (As mentioned above, the matrix B shown in FIG. 37A is the matrix contracted by deleting the line fails, the rows without any faults and columns without any faults).

(3) Next, the process of forming and outputting (or transmitting) the correspondence data of repair by the repair solution output unit 70 at Step T701 will be described.

At Step T701, on the basis of the repair solution (the relationship of correspondence between the faulty lines in the matrix B and the B spare lines) obtained at Step T401, the relationship of correspondence between the faulty lines of the original memory block (the matrix A) and the original spare lines is evaluated.

As mentioned in connection with Step S701 of the first embodiment, in case, in the repair solution of the matrix B, a spare line of B repairs (corresponds to) a spare line of A, the A spare line is not used for the repair of a faulty line of A. In case a spare line of B repairs a faulty line of A, any one of the A spare lines other than the A spare lines which have been determined not to use is allocated.

The correspondence data for repair which has been determined in the above-mentioned manner is outputted.

In the case of the example shown in FIG. 37A, the row having the row label 4 and the column having the column label 10 are detected as faulty lines to be repaired. The row having the row label 1 and the columns having the column labels 7, 13 and 14 are all alike A spare lines, so that these spare lines are not used for the repair of faulty lines in A.

The relationship of correspondence between the faulty lines in the matrix A and the original spare lines is obtained in such a manner that, to the row having row label 4, any lower spare row is allocated, and, to the column having the column label 10, a left spare column other than "the left spare column" having column label 7" is allocated.

It is alternatively possible to output a repair solution in a wider sense as mentioned above.

(4) Next, the process of outputting (or transmitting) unrepairable by the repair solution output unit 70 at Step T702 will be described.

At Step T702, in case the spare lines turns out to be insufficient in number, it is decided that fault is unrepairable and outputs a message to the effect.

(5) Next, the process of outputting (or transmitting) unrepairable due to the non-integer solution performed by the repair solution output unit 70 at Step T703 will be described.

At Step T703, in case a non-integer solution has been obtained at Step T401, it is decided that the memory block is unrepairable and outputs a message to the effect.

By the way, in the above, it is decided that the memory block is unrepairable in case a non-integer solution has been obtained, but, instead, even in case a non-integer solution has been obtained at Step T401, there is the possibility that there exists a repair solution which can repair all the faulty elements, so that further procedure for obtaining an integer solution may be executed or tried.

In the above, the method of obtaining a repair solution by relaxing the integer programming problem into a linear programming problem has been described, but it is also possible to use methods such as a branch and bound method disclosed in, e.g., the literature, "Integer Programming Method and Optimization of Combination" (written by Hiroshi Imai, published by Japan Science and Technology Association).

Figure 38:
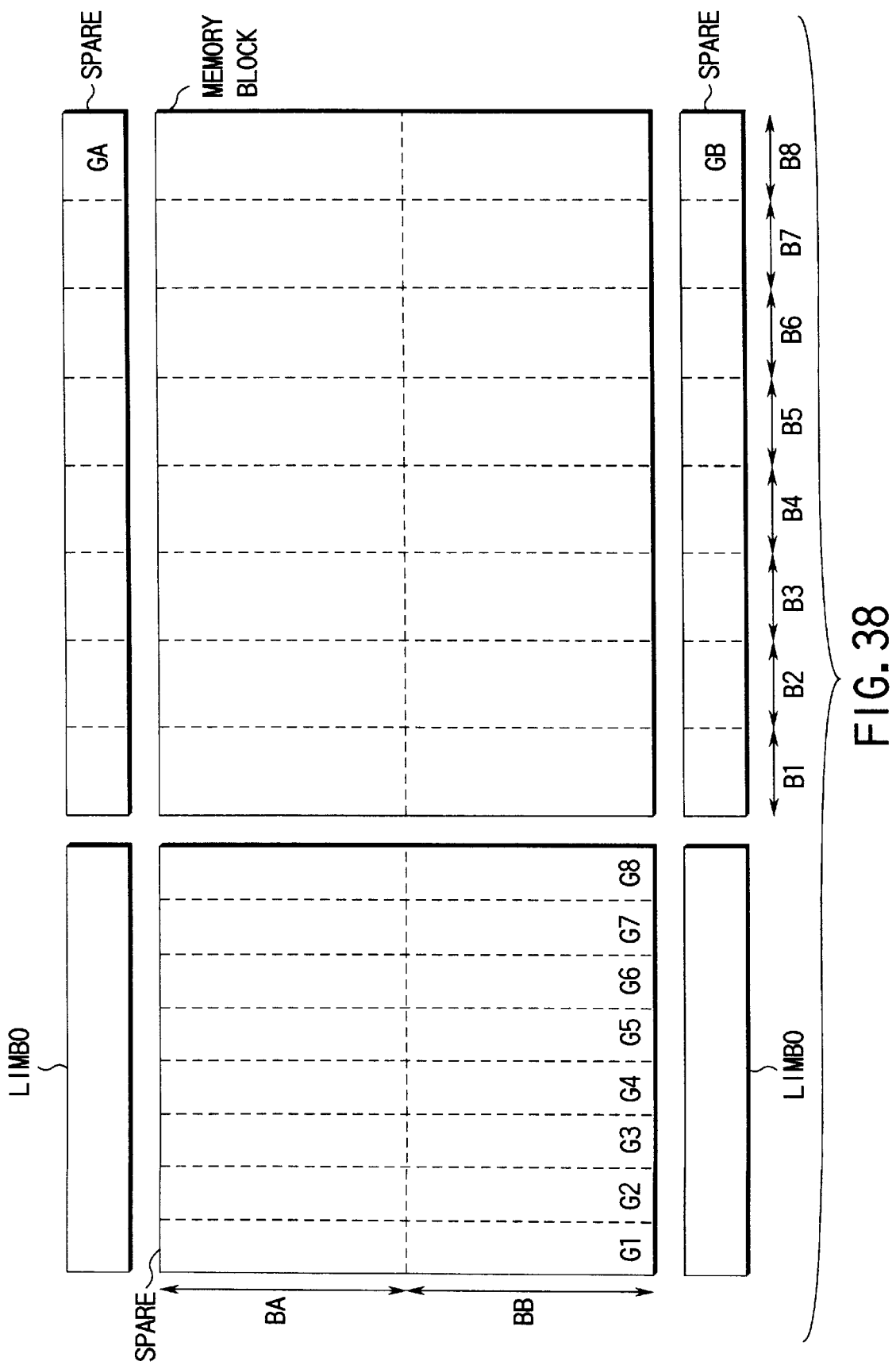
FIG. 38 is a diagram showing an example of the constitution of the memory block, the spare lines and the limbos.

In the above, the respective embodiments have been described by the use of the arrangement model of a memory block and spare lines shown in FIG. 1, but the present invention is not limited only to the model. For instance, a model as shown in FIG. 38 can be treated through a natural expansion. In the case of the model shown in FIG. 38, for any i ($1 \leq i \leq 8$) a spare column set $G_i$ comprising one or a plurality of spare lines is used for the repair of a block $B_i$ of columns, and spare row sets $G_A$ and $G_B$ each comprise one or a plurality of spare lines are used for the repair of row blocks $B_A$ and $B_B$, respectively. Further, there are set limbos which impose a constraint on the use of the spare lines orthogonal to each other. To this model, the above-mentioned theorem is also applicable, so that the present invention can be applied to the model.

Further, in these models, the spare lines and the limbos are disposed in a state positioned outside the memory block, but the spare lines and the limbos may be disposed, for instance, between the two small blocks within the memory block or within the small blocks. For instance, in the case shown in FIG. 1, it is possible to arrange the model in such a manner that, in the middle of the left column portion (the portion comprising BLK1 and BLK2) of the matrix A, C1, . . . , C6 are inserted in a state put together; in the middle of the right column portion (the portion comprising BLK3 and BLK4), C7, ..., C12 are inserted in a state put together; at the lower side of the upper row portion (the portion comprising BLK1 and BLK3), R1, R2 and R3 are inserted in a state put together; and, at the lower side of the lower row portion (the portion comprising BLK2 and BLK4), R4, R5 and R6 are inserted in a state put together. In this case, the limbos are disposed at positions at which the spare lines orthogonal to each other apparently intersect each other. Such a modified form can be obtained, by a simple re-addressing, from original arrangement shown in FIG. 1.

Further, in the above-mentioned model, on the spare lines, there is imposed merely constraints pertaining to the number of the spare lines and the allocatable range thereof, but there can be cases where other constraints are provided. For instance, there are constraints pertaining to the inhibition of the allocation of spare lines to the same numbered columns to be described later, the difference between the bit strings in the binary expression of two addresses, etc. These are related to techniques such as the so-called address compressing technique for treating, in a compact state, faulty element detection and repair on a large scale.

For instance, in case the serial numbers 1, 2, 3, ... are put to each of the left columns and the right columns of the matrix A shown in FIG. 1, there is the case where it is inhibited to allocate spare columns to the two columns having the same column numbers (Such as, for instance, the right column having the column No. 10 and the left column having the column No. 10).

Even in case such a constraint pertaining to the use of the spare lines is provided, the present embodiments can be application. For instance, in the case of the first embodiment, the following is possible. The cycle of Steps S602 and S603 (or the cycle of Steps S601 to S603 including Step S601) is repeated a plurality of times to obtain a plurality of candidate repair solutions, and it is checked whether or not each of the candidate solutions satisfies the constraint pertaining to the use of spare lines, so that a plurality of candidate solutions which satisfy the constraint are outputted. In the case of the second embodiment, it is sufficient only to express the constraints in the form of an equation or an inequality and add it to the condition of (RIP). In general, however, the more the number of conditions is increased, the smaller the possibility of evaluating an integer solution becomes. For executing of the processes at Steps S601 to S603, the method disclosed in C. H. Low et al., "Minimum Fault Coverage in Memory Arrays: A fast Algorithm and Probabilistic Analysis", IEEE Translation on Computer-aided Design of Integrated Circuits and Systems, Vol. 15, No. 6, 1996, pp. 681–690 may be employed.

Further, the present invention is also applicable to the case where the memory block is not divided into subblocks, and no constraint pertaining to the memory block is placed on the use of the spare lines. In this case, merely the process pertaining to the subblock and the internal data are altered in such a manner that, as for the spare lines, they are seted into two types, spare rows and spare columns, and as for the single faults, the sets become one. Of course, the present invention is also applicable to the case where there exist subblocks resulting from dividing the memory block in only one direction of the rows or the columns.

Besides the above, the present invention is directly or partially applicable to various models.

Further, the present embodiments have been described in such a manner that the method according to which the fault repair problem of the memory block matrix A is considered by expanding it to the fault repair problem of the matrix B resulting from expanding the matrix A by attaching spare lines and limbos to the matrix A is connected to the DM decomposition and the linear programming method, but this conception of expansion can also be coupled to other conventional techniques. For instance, the "branch-and-bound algorithm" or the "heuristic algorithm" proposed in the literature, "Efficient spare allocation for reconfigurable arrays", by Sy-Yen Kuo and W. Kent Fuchs, IEEE Design and Test, pp. 24–31, 1987 can be applied to the matrix B to evaluate the repair solution of B, so that, on the basis of the thus obtained repair solution, the relationship of correspondence between the faulty lines of the matrix A and the original spare lines (of the matrix A) can be obtained (That is, the above-mentioned algorithm is used as the repair process according to the present embodiments).

Further, in the respective embodiments, the method according to which, after the fault repair problem of the matrix B, the repair solution of the matrix A is evaluated has been set forth, but it is possible to employ the method according to which, conversely, after a candidate repair solution of the matrix A is evaluated, the candidate solutions expanded to a repair Asolution of the matrix B, whereby it is checked whether or not the above-mentioned candidate can actually become a repair solution of the matrix A. That is, in a method similar to the method set forth in the proof of the theorem (necessity) mentioned above, the set of the faulty lines of A which are repaired by the candidate repair line set of the matrix A is expanded to the set of the faulty lines of B repaired by the repair line set of the matrix B.

A candidate repair solution (set as α) of the matrix A is evaluated by assuming that no faulty element exists in the spare lines and the limbos of the matrix A. In case of expanding the candidate repair solution α to a repair solution of the matrix B, first the rows and columns obtained, by extending the rows and columns of the candidate repair solution of the matrix A to the matrix B are deleted from the matrix B. The fault repair problem of the matrix (set to B/α) contracted by this deletion is solved. The fault repair problem of the matrix B/α is solved by the use of the remainder of the number of spare lines (some of which are used in the candidate α) and under the assumption that no faulty element exists in the spare lines and the limbos.

If a repair solution of the matrix B/α, the candidate α can become the repair solution of matrix A, so that it is sufficient to determine the relationship of correspondence between the faulty lines of the matrix A and the original spare lines. If the candidate α could not be expanded to a repair solution of the matrix B, other candidate repair solution of the matrix A is evaluated to try an expansion again.

FIGS. 39A to 39D show an example. First, a candidate repair solution α of the matrix A (the two lines surrounded by ovals in FIG. 39A) is formed, and the respective lines repaired by the repair lines are extended to the size of B and deleted (FIG. 39B). Next, the zero row and zero column resulting from the deletion are deleted, and a repair solution of the resulting contracted matrix B/α is evaluated by the use of the remainder of the number of spare lines some of which are used in the candidate α (FIG. 39C). The repair solution thus obtained is combined with α, whereby a repair solution of the original matrix B is obtained (FIG. 39D). The relationship of correspondence between faulty lines of the matrix A and the original spare lines is self-evident from FIG. 39D (It is sufficient to allocate, to the two lines of α, the two spare lines which are not surrounded by ovals).

In the above, description has been given mainly concerning the process for one memory block within one chip of one semiconductor device, but here, a structure related to the process of one chip unit, the process of one wafer unit, and the process of one lot unit will be described.

Ordinarily, in the case of a memory-tester, tests are carried out in the state of a wafer (semiconductor) substrate), and in the case of a repair apparatus, repair is effected in the state of a wafer. Therefore, in the fault repair device at the step positioned therebetween, process is effected using, as the unit, one wafer as the minimum. Further, ordinarily, in the manufacturing steps, the process is carried out by the use of a lot, as the unit, in which 25 wafers are used as one set in many cases. Further, in the case of a multi-type manufacturing line, a certain fault repair device takes care, in some cases, of semiconductor devices related to a plurality of types.

Accordingly, to the fault repair device, for instance, a lot ID linked with an overall manufacture-aiding system, the wafer numbers within the lot, the chip numbers within the wafer, the subblock numbers within the chip are given together with the information on the faulty elements of each in the subblocks in some cases. Further, there is also a case where, with every lot, the type ID of the lot is given.

To such cases, in the fault repair device, the data are given in a form as shown in FIG. 40A. In case the line fail process is carried out at the memory-tester side, a form as shown in, e.g., FIG. 40B is used. Then, the fault repair device outputs the data in a similar form. As for the unrepairable chips, the data such as the block ID etc. become unnecessary.

Further, depending on the types of semiconductor devices, the number of the upper spare rows etc. varies, or the way of dividing the memory block into subblocks, the constraint pertaining to the spare lines, etc. vary in some cases, and therefore, the fault repair device includes a table in which with type ID as key, data pertaining to the wafers, data pertaining to the chips, data pertaining to the block, etc. are registered, searches the information necessary for the process from the lot ID given, and has necessary settings effected prior to the process. For instance, referring to the example shown in FIG. 16, the remainders of the four types of spare lines are set to three, respectively, from the numerical values obtained by search. The fault repair device can be constituted in such a manner that it has not table as mentioned above, the necessary information can be obtained, when necessary, with the lot ID as key, from a server or the like connected through a network or the like.

In manufacturing line, ordinarily, it is important to repair for each chip, therefore, when at least one unrepairable memory block is found, it is preferable to terminating the repair processing of the corresponding chip at that time.

Ordinarily, since a plurality of memory blocks are included in a chip, a plurality of fault repair devices (or CPUs) according to the invention are provided in parallel, repair solutions for a plurality of memory blocks may be simultaneously evaluated.

Next, the system arrangement of the fault repair device according to this embodiment will be described.

Figure 41A:
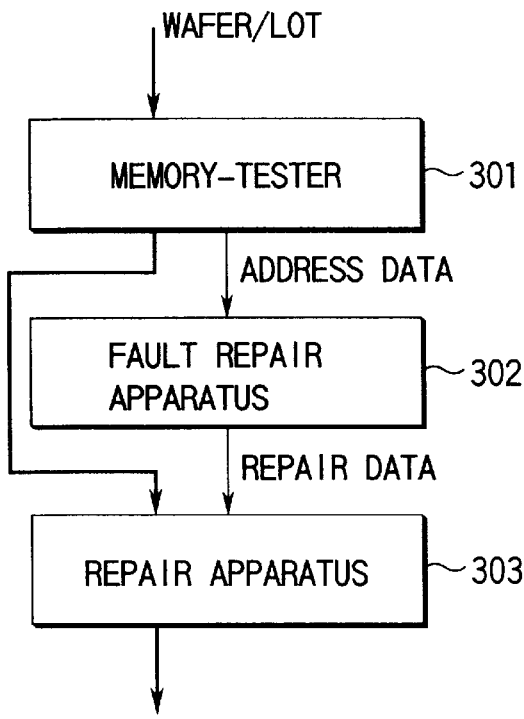
FIGS. 41A and 41B are diagrams showing an exemplary system constitution of the fault repair device.
Figure 41B:
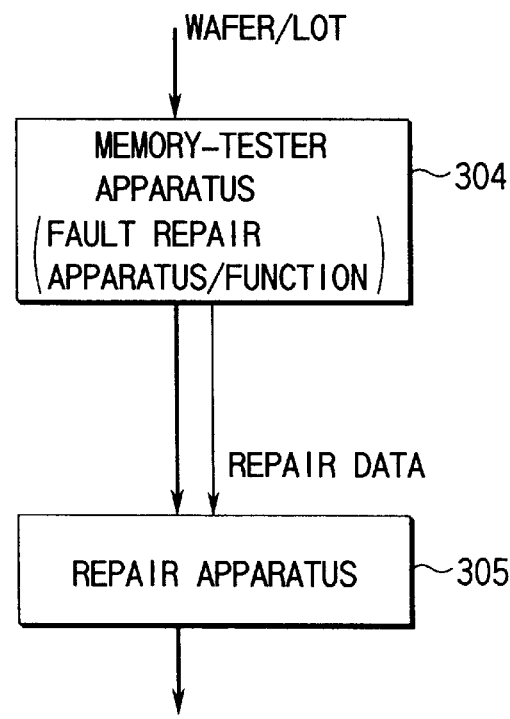
Figure 42A:
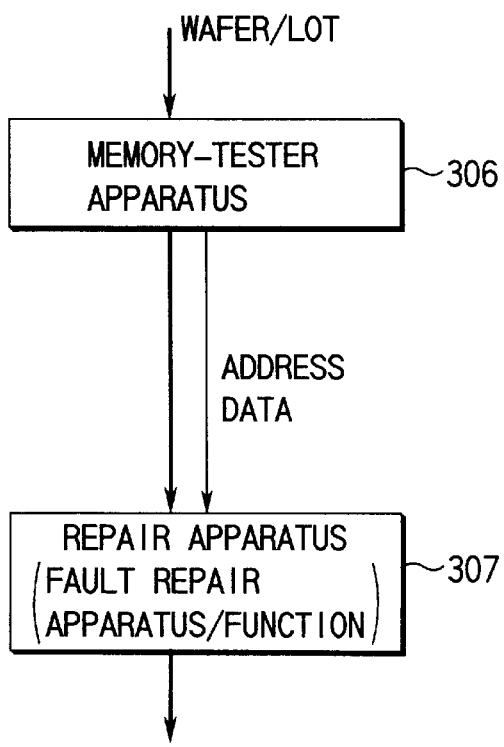
FIGS. 42A and 42B are diagrams showing examples of the system constitution of the fault repair device.
Figure 42B:
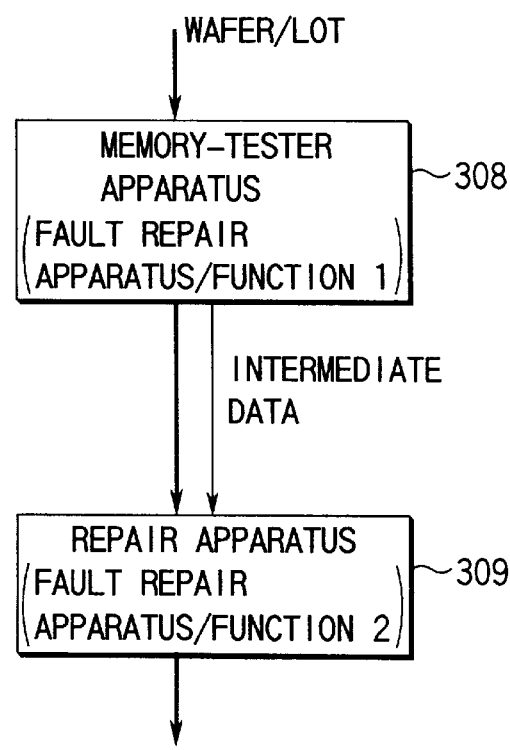

The fault repair device can be realized through software; and there are many methods of realizing the fault repair device such as the method of realizing the device as one device 302 independent of a memory-tester 301 and a repair apparatus 303 as shown in FIG. 41A, the method of realizing the fault repair device on a memory-tester 304 as shown in FIG. 41B, the method of realizing it on a repair apparatus 307 as shown in FIG. 42A, the method of realizing it by dispersing its functions to a memory-tester 308 and a repair apparatus 309 as shown in FIG. 42B (for instance, at the memory-tester side, the repair solution for the matrix B is evaluated, and the thus obtained repair solution is given to the repair apparatus as an intermediate information, so that, at the repair apparatus side, the information is converted into the repair solution for the matrix A), the method of realizing the device by dispersing part of its functions, etc.

Further, it is also possible to make an arrangement in which the memory-tester and the fault repair device are provided at a rate of one to the plural, the plural to one, or the plural to the plural, the repair apparatus and the fault repair device are provided at a rate of one to the plural, the plural to one, or the plural to the plural. In this case, to the information exchanged, necessary device ID is attached.

Figure 43:
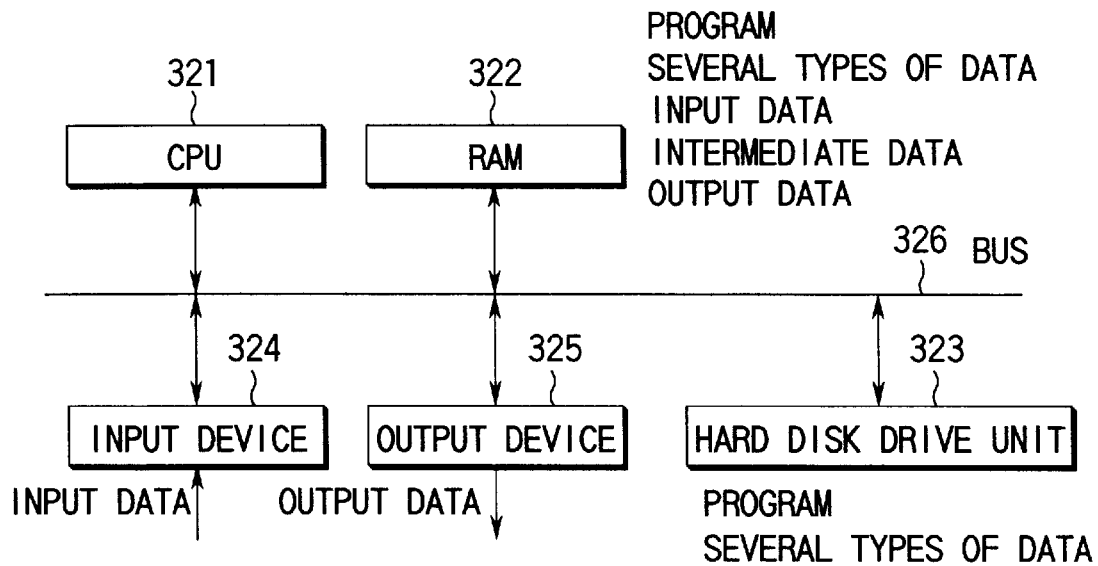
FIG. 43 is a diagram showing an example of the system constitution of the fault repair device.

FIG. 43 shows an example the case where the fault repair device is realized by software.

The program for making a CPU 321 execute the process of the fault repair device is installed in a hard disk device 323, for instance, through a read device from a recording medium in which the program is stored, or through a communication circuit from another computer or the like; and the thus installed program is suitably written into a RAM 322 when executed and executed by a CPU 321.

In the case of FIG. 41A or FIG. 42A, the input device 324 comprises, for instance, a communication means or the like, and in the case of FIG. 41B or FIG. 42B, an inter-process communication is effected with the memory-tester function in place of the input means 324. Similarly, in the case of FIG. 41A or 41B, for instance the output apparatus 325 comprises a communication means or the like, and in the case of FIG. 42A or FIG. 42B, an inter-process communication is effected with the repair function in place of the output apparatus 325.

Various information as described to in connection with FIG. 40C are stored in the hard disk device 323 and referred to as required or obtained through a network by a communication system as required.

There is known a system arranged in such a manner that, in case, by a memory-test apparatus, function test is performed a plurality of times (such as for instance several times or more than 20 times), a repair process is performed between the functions tests, so that the chips which have turned out to be unrepairable are not subjected to the function test any more. The present invention is also applicable to such a system.

Next, a third embodiment of the present invention will be described.

This embodiment comprises both of the structure of the first embodiment and the structure of the second embodiment, so that the repair process (that is, the repair process through which an optimum repair solution or an approximately optimum repair solution can be obtained at high speed) by the DM decomposition etc. according to the first embodiment is backed up by the repair process (that is, such a repair process that, once a repair solution is obtained, it is an optimum repair solution) by the integer programming problem or the linear programming problem according to the second embodiment.

That is, in case the repair solution is evaluated on the basis of the DM decomposition and the contracted graph thereof as according to the first embodiment, when the repair solution is not obtained within the time limit, the process is once stopped, and the repair solution is evaluated as an integer/linear programming method as according to the second embodiment. In this case, if this third embodiment is realized by the use of software, the calculation process of the integer/linear programming method should desirably be performed not by a processor (CPU) prepared to be used for the first repair process or the like but specially processed by a different processor. By so doing, when the cases where the repair solution cannot be evaluated on the basis of the DM decomposition and the contracted graph thereof within the time limit are small in number, the "unrepairable" cases can be decreased in number by evaluating the repair solution by spending time as an integer/linear programming method. Or, when the cases where the repair solution is not evaluated on the basis of the DM decomposition and the contracted graph thereof within the time limit are rare, it can be utilized also for evaluating an optimum repair solution as an integer/linear programming method or for verifying the optimization of the repair solution obtained on the basis of the DM decomposition and the contracted graph thereof.

Figure 44:
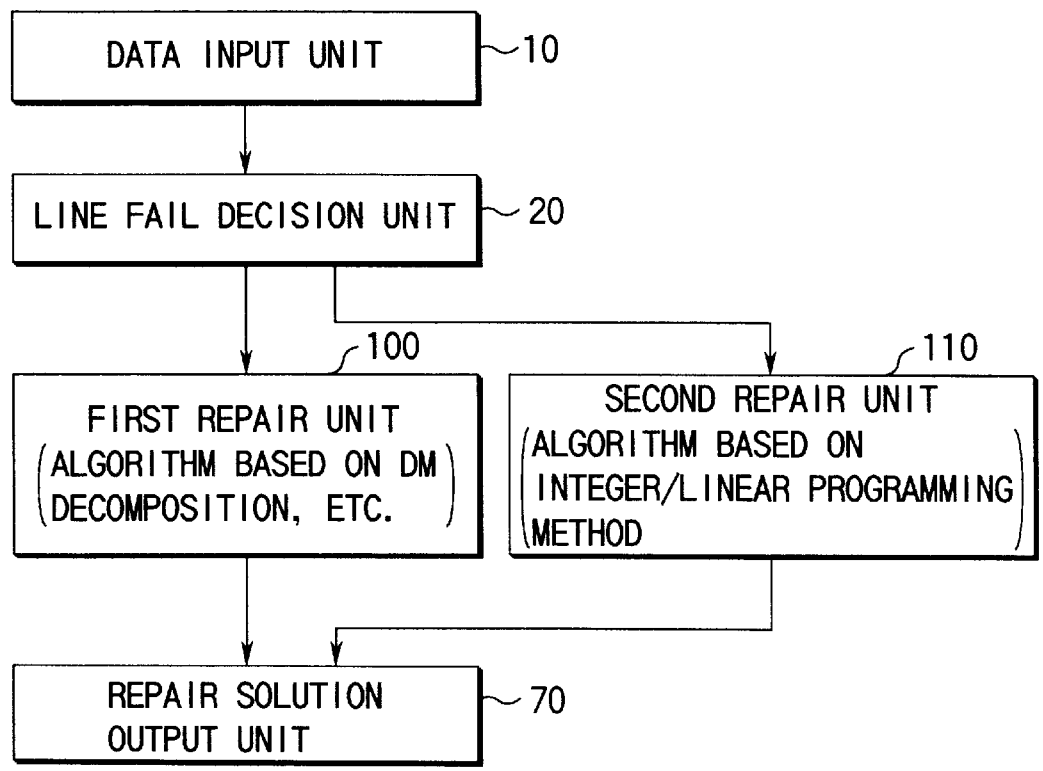
FIG. 44 is a diagram showing an outline of the constitution of the fault repair device according to a third embodiment of the present invention.

FIG. 44 shows an outline of the constitution of the fault repair device according to this embodiment together with the flow of data.

The fault repair device comprises a data input unit 10, a line fail detection unit 20, a first repair unit 100, a second repair unit 110, and a repair solution output unit 70.

The data input unit 10, the line fail detection unit 20 and the repair solution output unit 70 are identical with those according to the first embodiment. Although there is a form in which the line fail detection unit 20 is not provided as in the case of the first embodiment and the second embodiment, but the description will be made under the assumption that the line fail detection unit 20 is provided.

First repair unit 100 performs processes corresponding to the processes of the bipartite graph generating unit 30, the maximum matching generating unit 40, the DM decomposition generating unit 50 and the repair solution generating unit 60 according to the first invention.

The second repair unit 110 performs processes corresponding to the processes of the linear programming problem expression unit 35, and the simplex method application unit 45 according to the second embodiment.

This embodiment can be realized by the use of software. The CPU allocated to the first repair unit 100 and the CPU allocated to the second repair unit 110 may be made to have the same performance, the CPU allocated to the second repair unit 110 may be made higher in performance than the CPU allocated to the second repair unit 110.

In this embodiment, on the process of the first repair unit 100, a time limit (t1) is provided for one unit of the process. As for the process of the second repair unit 110, there are the method according to which a time limit (t2) is provided, and the method according to which no time limit is provided. Further, in connection with the case of the former, there are considered the method according to which the time limit t2 is set so as to be longer than the time limit t1 (for instance, in case the CPU allocated to the first repair unit 100 and the CPU allocated to the second repair unit 110 are made to have the same performance) and the method according to which the time limit t1 and the time limit t2 are set to the same value (for instance, in case the CPU allocated to the second repair unit 110 is made to have a higher performance in respect of the speed than the CPU allocated to the first repair unit 100).

Further, in respect of the case where the repair process is repeatedly carried out, there are the method according to which the start and the termination of the process of the first unit 100 and those of the second repair unit 110 are effected in synchronism, and the method according to which the first repair unit 100 periodically execute them, but the second repair unit 110 is not synchronized therewith.

Figure 45:
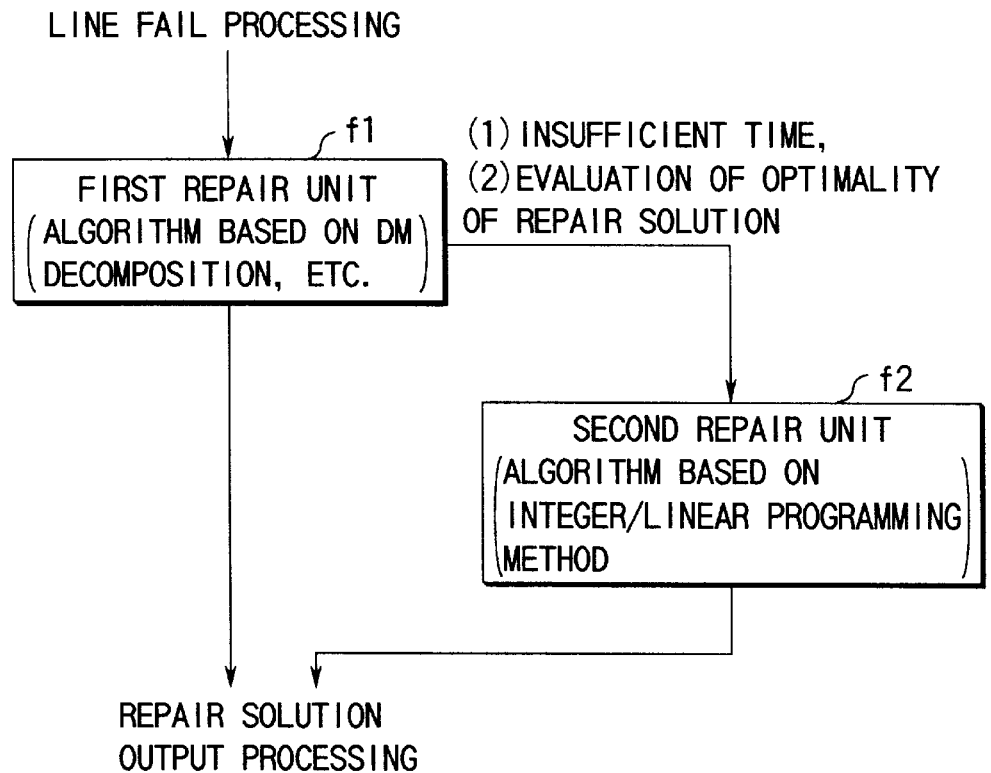
FIG. 45 is a flowchart showing an example of the processing procedure of the fault repair device according to the third embodiment of the present invention.

FIG. 45 shows an example of the processing procedure of the fault repair device. In FIG. 45, however, only the portion of the device which differs from those of the first embodiment and the second embodiment.

First, processes such as the read-in of the address data of the faulty elements, the detection of the line fails, etc. are performed as in the cases of the first embodiment and the second embodiment.

Next, by the first repair unit 100, the process for evaluating the repair solution is performed as in the case of the first embodiment.

Next, in this embodiment, in case predetermined conditions are satisfied, the process for evaluating a repair solution is performed by the second repair processing unit 110 in the manner as in the case of the second embodiment.

As the predetermined conditions, there are various conditions.

A first form is that, in case the repair solution could be obtained even by the first repair unit 100, the second repair unit 110 is started.

A second form is that, when the case where the repair solution cannot be obtained by the first repair unit 100 within a prescribed time limit rarely happens, the second repair unit 110 is started if the repair solution could not be obtained within a prescribed time limit.

A third form is that, in order to verify the optimality of the repair solution obtained by the first repair unit 100, the process for obtaining the optimum repair solution is performed by the second repair unit 110.

A fourth form is that, when the case where any repair solution cannot be obtained by the first repair unit 110 within the prescribed time limit rarely happens, the process for obtaining the optimum repair solution is performed by the second repair unit 100 in order to verify the optimality of the repair solution obtained by the first repair unit 100.

The expression, "any repair solution could not be obtained within the prescribed time limit" means that the time limit has been exceeded during the process, but does not include the case where, within the time limit, it has turned out to be clear that the spare lines are insufficient, and thus, it has become clear that the no repair solution exists.

In the case of any of the above-mentioned forms, when only the first repair unit 100 was executed, whereby a repair solution was obtained, the repair solution thus obtained is outputted, and, in case the first repair unit 100 and the second repair unit 110 were both executed, whereby repair solutions were obtained, the repair solution of the second repair unit 110 is outputted, while, in case no repair solution was obtained, a message to the effect that the memory block is unrepairable is outputted. Further, in case a plurality of repair processes were executed in parallel, the identification information of the repair target is outputted together with the above-mentioned repair solution and the above-mentioned message.

In case the processes of the first repair unit 100 and the second repair processing unit 110 were both executed, whereby repair solutions were obtained, information indicating whether or not the repair solution of the first repair unit 100 was an optimum repair solution may also be outputted jointly.

In case no repair solution was not obtained, information indicating whether or not the second repair processing unit 110 was executed, whether or not the reason why it was decided that no repair solution existed was that the spare lines were insufficient in number or time was insufficient, or the repair solution obtained was a non-integer solution, etc. may be outputted.

The various structures constituted from various view points can be suitably selected depending on the purpose of the fault repair device such as, e.g., where or not the fault repair device is to be installed on a manufacturing line, whether or not the fault repair device is to be installed at an off-line site for researches or for detailed analysis of defective ICs, etc.

Next, an example of the case where the fault repair device according to this embodiment is assumed to be installed on a manufacturing line will be described.

Figure 46:
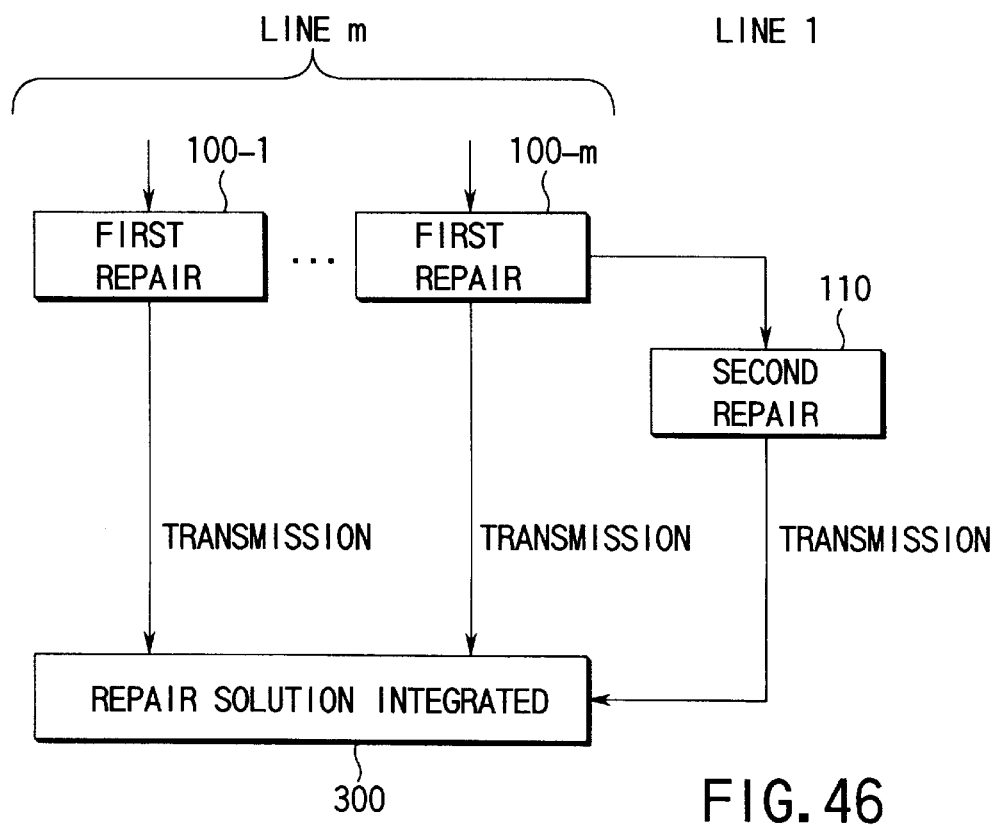
FIG. 46 is a diagram for explaining an example of the application of the same embodiment.

FIG. 46 shows an example of the fault repair device provided with m-systems of first repair units 100-1 to 100-m which execute their processes in parallel and one-system second repair unit 110. Here, the data input unit 10, the line fail processing unit 20 and the repair solution output unit 70 are not shown.

Here, it is to be understood that dedicated CPUs are allocated to the first repair processing units 100-1 to 100-m and to the second repair unit 110.

The first repair processes of the first repair processing units 100-1 to 100-m are started simultaneously and terminated, in a batch, when a predetermined time limit is reached. Those first repair processing units which have obtained repair solutions within the time limit are kept in a waiting state until the time limit is reached, while those first repair units which could obtain no repair solution within the time limit stops their processes at the time limit.

Then, from those first repair units which could obtain repair solutions within the time limit, the repair solutions are outputted, while, from those other first repair units which have proved to obtain no repair solution within the time limit, a message to the effect that reservation is to be made for waiting for the result of the second repair process. In case the plurality of repair processes are executed in parallel, an identification information of the repair target is outputted together with the repair solution and the message.

In case there are more than m-sets of data on the repair target, the first repair processes of the first repair units 100-1 to 100-m are repeatedly executed.

Here, in case there is a first repair unit which could not obtain the repair solution within the time limit, the second repair process of the second repair unit 110 is tried for the data of the repair target.

Then, from the second repair unit, if the repair solution was obtained within the time limit, the repair solution was outputted, but, in case it has become clear within the time limit that there was no repair solution and in case no repair solution was obtained within the time limit, a message indicative of "unrepairable" is outputted.

In a repair solution integrated processing unit 300, concerning the target (identification information) on which the message indicating "reservation is made" from the first repair processing units is received, the result received from the second repair unit thereafter is determined as a final result.

As for this repair solution integrated processing unit 300, there are considered to be two cases, that is, the case where the unit 300 is provided within the fault repair device and the case where the unit 300 is provided at the repair apparatus side.

Next, an example of the flow of processes will be described, referring to FIG. 47.

Here, as shown in FIG. 47, CPU 1 to 8 are allocated to the first repair units 100-1 to 100-8, respectively, and, to the second repair unit 110, a CPU 9 is allocated, so that they push forwards their processes from one unit of repair target in synchronism and at a fixed cyclic period. Further, it is to be understood that, to the process of the second unit, a cyclic period corresponding to two units of the first repair units is allocated (It is to be understood that the calculation is terminated within this time).

First, in the first period, the first repair processes are executed for the respective repair targets #1 to #8 in the CPU1 to CPU8.

Here, in case, in the CPU3 which has executed the first repair process for the repair target #3, the time limit was reached in the course of the process, the second repair process for the repair target #3 is executed by the CPU9.

In the second period, the first repair processes for the repair targets #9 to #16 are executed in the CPU1 to CPU8; and, in the third period, the first repair processes for the repair targets #17 to #24 are executed in the CPU1 to CPU8, respectively, and at the same time, over the second and third periods, the second repair process for the repair target #3 is executed in the CPU9.

In the fourth period, the first repair processes for the repair targets #25 to #32 are executed in the CPU1 to CPU8, respectively, and at the same time, if there is any repair target for which the repair solution was not obtained because the time limit was reached in the course of the process, then the second repair process for the repair target is executed in the CPU9.

In the above-mentioned operation, for instance when the case where no repair solution is obtained by the first repair process rarely happens, and thus, the CPU9 seldom operates, the second repair process is executed by the use of the CPU9 concerning one of the repair targets for which the repair solutions have been obtained by the first repair processes, whereby the optimum repair solution obtained by the second repair process and the repair solution obtained by the first repair process are compared with each other, whereby the optimality of the repair solution evaluated by the first repair process is verified.

Next, a fourth embodiment of the present invention will be described.

The fault repair method for such a memory block in which each spare is allocated as one line has so far been described. That is, the respective spare columns and the respective spare rows have the same bit length as the row direction and the column direction of the memory block, and each spare is used as a unit (that is, the same number of bits as in the row direction or the column direction thereof is used as a unit).

Through this embodiment, a faulty element repair process for a memory block which has such a degree of freedom as each spare line need not be allocated as one line will be described.

First, prior to the description thereof, the structure of memory block, spare lines and limbos to which the various repair processes which have been described will be referred to.

Ordinarily, the main block (memory block) is divided into a plurality of subblocks, and several spare lines are usable for each of the subblocks. In fact, the spare lines are buried in arbitrary portions of each subblock in many cases. The main block is divided in the vertical direction, the resulting portions are each called column block, while, when the main is divided in the horizontal direction, the resulting blocks are each called row block.

FIG. 48 shows an example of the arrangement of the memory block, the spare lines and the limbos. In this example, BLK-1 and BLK-2 are each a column block, and BLK-A and BLK-B are each an row block. The spare column (1) is a spare column set for the repair of faulty elements in the BLK-1, and the spare column (2) is a spare column set for the repair of faulty elements in the BLK-2. The spare row (A) is a spare row set for the repair of faulty elements in the BLK-A, and the spare row (B) is a spare row set for the repair of faulty elements in the BLK-B. In FIG. 48, the spare column groups are written at the right sides of the column blocks, and the spare row groups are written at the lower sides of the row blocks, but there is also an example in which spare columns are buried in the interior of a column block, the spare rows are buried in the interior of a row block.

As mentioned above, the spare lines are buried between the rows and between the columns of the main block in many cases, but by an address conversion, they can be expressed in such a manner as to be provided outside the main block as shown in FIG. 49. In that case, the limbos appear outside the main block as a portion where the spare columns and the spare rows intersect each other.

Here, in case the processing unit which is the object for which the process for evaluating the repair solution satisfies the following condition, this processing unit is defined as "fundamental form".

Condition: "Each spare is allocated as one line"

This condition can be, more concretely, put as follows: "The spare columns can each be allocated, as one line having the length in the vertical direction of the memory block, to faulty columns belonging to given one block or a plurality of blocks in the vertical direction, and the spare rows can each be allocated, as one line having the length in the horizontal direction of the memory block, to faulty rows belonging to given one block or a plurality of blocks".

To described the spare lines and the limbos outside as in the example shown in FIG. 49 is merely for an easier understanding of the structure, such a description itself has nothing to do with the intrinsic qualities of the basic form.

Now, the theorem previously proved, that is, the theorem that "The condition necessary and sufficient for a repair solution of the matrix A to exist is that a repair solution of the matrix B exists", always holds with respect to a processing unit which can be converted into the basic form (In the case of example referred to above, the theorem has been proved with reference to the case where the number of column blocks is 2, and the number of row blocks is 2, but it is clear that this theorem holds without depending on the number of blocks). Accordingly, the various repair processes so far described can be utilized for any processing unit which can be converted into the basic form.

The repair program for realizing the repair process may be generalized so as to become applicable to any processing unit which can be converted into the basic form. In that case, parameters, such as the size of the block, the number of spare lines, etc., peculiar to the device may be delivered, for instance in a file format, from the outside.

Of the processing units, there is some which does not satisfies the above-mentioned condition and cannot be directly rendered into the basic form. The fact that "the processing unit cannot be rendered into the basic form" means that, to the processing unit, the various repair processes which have been described above cannot directly be applied.

Figure 50:
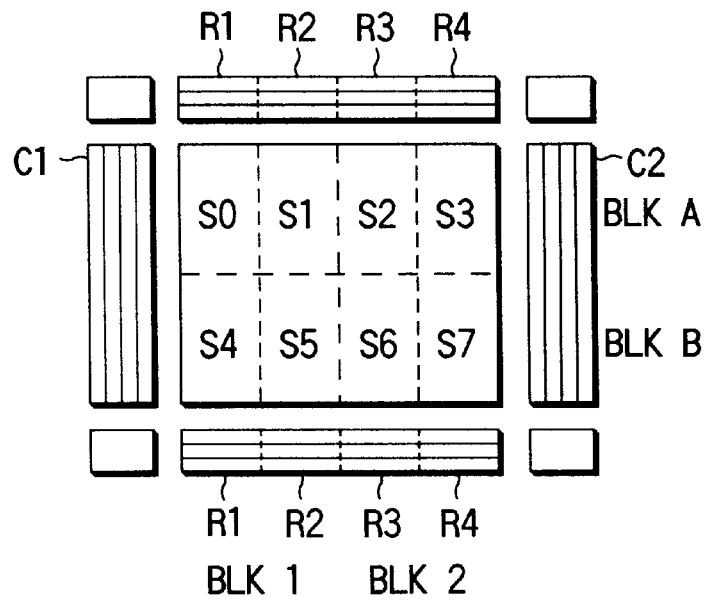
FIG. 50 is a diagram for explaining the processing unit which is not in the basic form.

For instance, the arrangement of the memory block, the spare lines and the limbos exemplarily shown in FIG. 50 is an example of the processing unit of a device which has such a high degree of freedom that the spare rows can be applied in a subdivided state. That is, this is the case where only the spare columns satisfy the above-mentioned condition, but the spare rows do not satisfy the condition.

On the basis of an example of the case where the spare rows can be allocated in a subdivided state, description will be made below, but the same thing applies to an example in which the spare columns can be allocated in a subdivided state. As for the case where the spare rows and the spare columns both can be allocated in a subdivided, a description will be given in detail later.

In the example shown in FIG. 50, surrounding the main block comprising eight subblocks S0 to S7, four spare columns are disposed at each of the right and left sides, and three spare rows are disposed at each of the upper and lower sides (This example may be constituted as actually shown in FIG. 50 or the arrangement thereof after address conversion may become as shown in FIG. 50) The BLK-1 which is a column block comprises subblocks S0, S1, S4 and S5. The BLK-2 which is a column block comprises subblocks S2, S3, S6 and S7. The BLK-A which is a row block comprises subblocks S0, S1, S2 and S3. The BLK-B which is a row block comprises subblocks S4, S5, S6 and S7.

The four spare columns (designated as C1) at the left are for the BLK-1, and the four spare columns (designated as C2) at the right side are for the BLK-2. Further, the three spare rows at the upper side are for the BLK-A, and the four spare rows at the lower side are for the BLK-B (wherein, as for the spare rows at the upper and lower sides, the portion corresponding to S0 and S4 will be referred to as R1, the portion corresponding to S1 and S5 will be referred to as R2, the portion corresponding to S2 and S6 will be referred to as R3, and the portion corresponding to S3 and S7 will be referred to as R4).

These spare columns are each allocated as one line.

On the other hand, as for the spare rows, each spare row is divided into four equal portions, and they can be partly used. Further, there is imposed the constraint that each subdivided short spare row must be used in interlocking (in pairs) with the other short spare row; more specifically, the constraint that, for instance, in case it is assumed that {R1, R2, R3 and R4} stand for the short spare rows, {R1, R3} and {R2, R4} must repair the same address of the main block, respectively. In other words, according to the constraint, the short spare rows must be used in the state in which two pairs of short spare rows which (pair) each comprise every other one of them are each put together into one spare (Substantially, it turns out that each spare row is divided into two equal portions, and part thereof can be used).

Figures 51A, 51B:
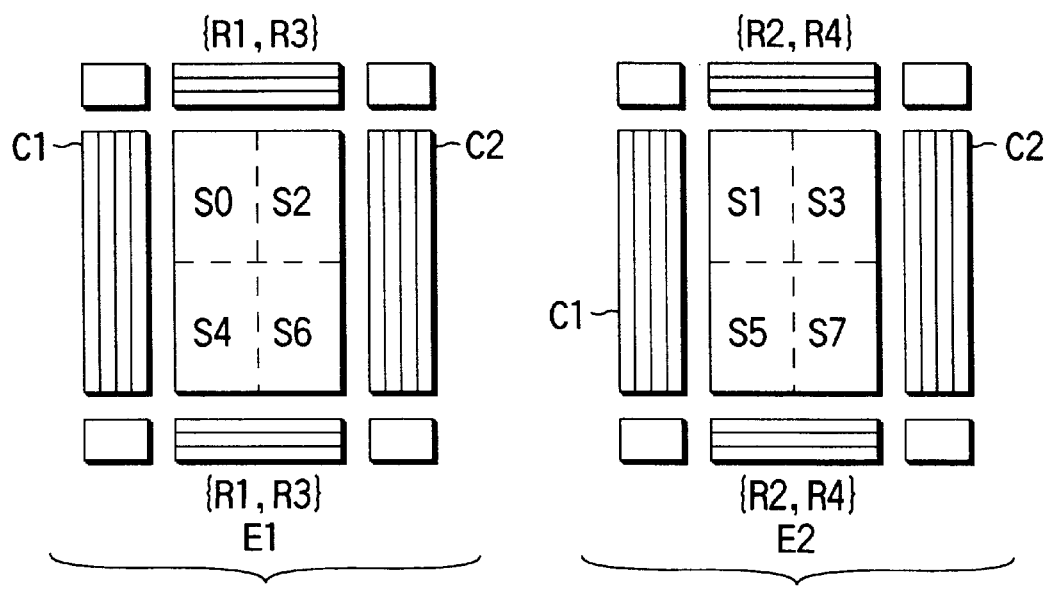
FIGS. 51A and 51B are diagrams for explaining the sub-units constituting the basic form.

In such a case, by the use of the nature of the "interlocking", the main block and the spare rows are divided in the vertical direction into two partial processing units as shown in FIG. 51A and FIG. 51B, wherein the spare columns (C1, C2) at the right and left sides are shared in both partial processing units. Since the spare columns are shared in the respective partial processing units, the partial processing unit will be referred to as "sub-unit". In each sub-unit, there is provided the relationship of correspondence that each spare line repairs as one line a line of the main block, so that it is understood that the above-mentioned condition is satisfied, and the sub-unit is rendered into the basic form.

Next, another example which does not satisfy the above-mentioned condition will be described.

Figure 52:
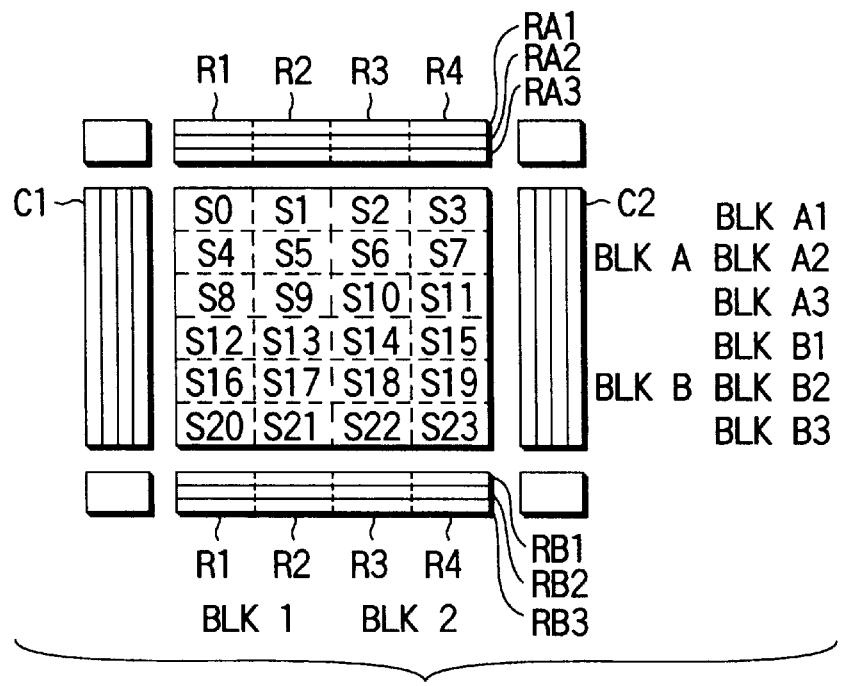
FIG. 52 is a diagram for explaining the processing unit, which is not in the basic form.

The arrangement of the memory block, the spare lines and the limbos shown in FIG. 52 is an example in which a degree of freedom is further provided to the allocation range of the spare rows.

The spare columns and the column blocks are the same as the example of FIG. 50.

BLK-A and BLK-B stand for horizontal blocks (row blocks), and BLK-1 and BLK-2 stand for vertical blocks (column blocks). Row blocks are each further divided into three row subblocks; and the row subblocks of the BLK-A are denoted by BLK-A1, BLK-A2, and BLK-A3, while the row subblocks of the BLK-B are denoted by BLK-B1, BLK-B2, and BLK-B3. The six spare rows are denoted by a RA1, RA2, RA3, RB1, RB2 and RB3 successively in the order as counted from the top.

The nature of the spare rows pertaining to subdivision and interlocking is identical with that in the case of the example shown in FIG. 50. What differs from the case of the example shown in FIG. 50 lies in the allocation range of the spare rows. The allocation range of the respective spare rows overlap one another as follows: That is, as for the BLK-A, the RA1 is usable for the repair of the BLK-A2 and BLK-A3, the RA2 is usable for the spare of the BLK-A1 and the BLK-A3, and RA3 is usable for the repair of the BLK-A1 and the BLK-A2. As for the BLK-B, likewise, RB1 is usable for the repair of BLK-B2 and BLK-B3, the RB2 is usable for the repair of the BLK-B1 and BLK-B3, and the RB3 is usable for the repair of the BLK-B1 and the BLK-B2.

Figures 53A, 53B:
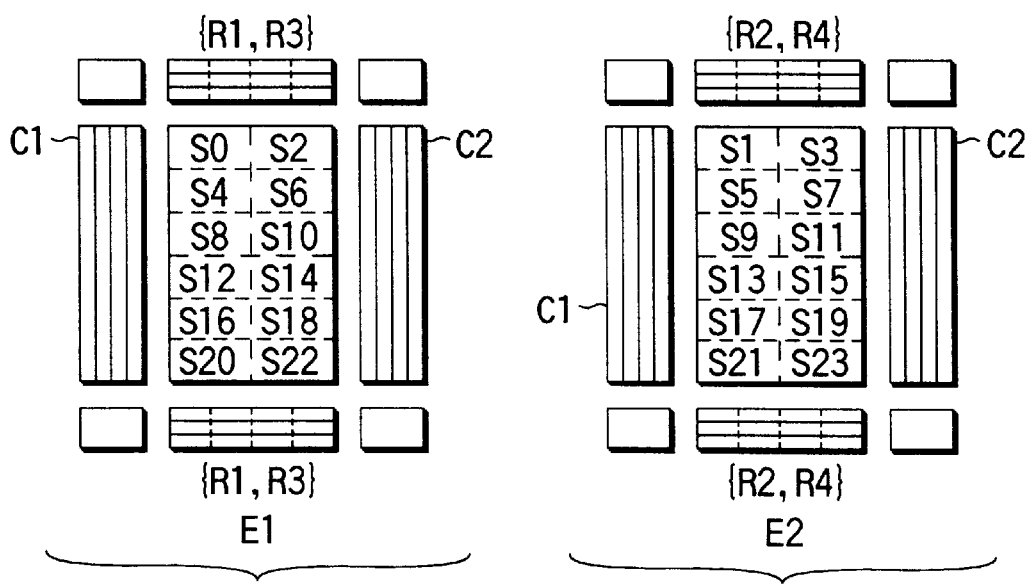
FIG. 53A and 53B are diagrams for explaining the sub-units, which constitute the basic form.

Even in such a case, if the processing unit is divided into two sub-units as in the case of FIG. 50, what are shown in FIG. 53A and FIG. 53B result. In this case, it is understood that the allocation ranges of the spare rows overlap each other, but the respective sub-units are each rendered into the basic form.

As described above, even in case the original processing unit does not satisfy the condition that "each spare is allocated as one line" and thus not rendered into the basic form, by dividing this processing unit into the sub-units, to each of the sub-units, the repair process which has been so far described can be applied.

Thus, as for the processing unit which does not satisfy the above-mentioned condition, first the repair solution is evaluated for each sub-unit (without taking the other sub-unit into consideration), and the repair solutions of the respective sub-units are composed, taking into consideration the spare set shared by the sub-units, whereby a repair solution of the processing unit concerned can be generated.

A fault repair device which performam repair process for processing units which do not satisfy the condition that "each spare is allocated as one line" will be described below. In the description to follow, one processing unit will be taken up as the object to be described.

Figure 54:
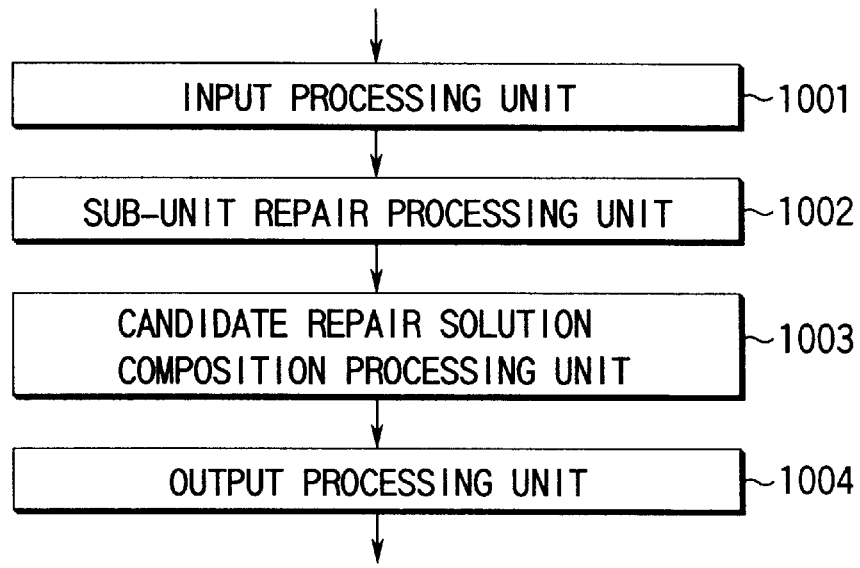
FIG. 54 is a diagram showing an outline of the constitution of the fault repair device according to a fourth embodiment of the present invention.
Figure 55:
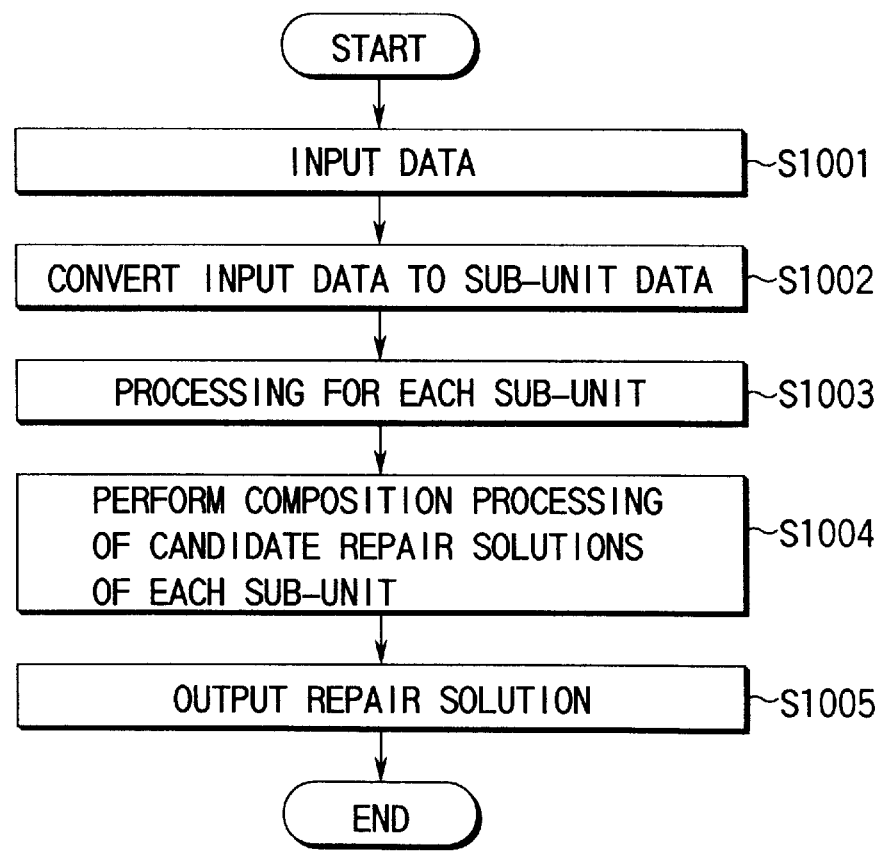
FIG. 55 is a flowchart showing an example of the processing procedure of the fault repair device according to the fourth embodiment.

FIG. 54 shows an example of the basic structure of the fault repair device in this case together with the flow of data. FIG. 55 shows an example of the procedure of the repair process in this case.

An input processing unit 1001 inputs the information peculiar to the processing unit which is the target and the address data (the pair of row address and column address) of faulty elements directed to the processing unit (for instance in FIG. 50, from the memory-tester (Step S1001)).

As the information peculiar to the processing unit, there are, for instance, the number of the sub-units, the numbers of column and row blocks of each sub-unit, the numbers of spare columns and spare rows of one block of a sub-unit, the row and column sizes of a column block and a row block of a sub-unit, etc.

Next, the input processing unit 1001 converts (distributes) the inputted address data of the faulty elements to the processing unit into address data for the respective sub-units (such as, e.g., what are shown in FIG. 51A and 51B) (Step 1002).

For instance, in the case of the example shown in FIG. 50, the faulty elements in the block S0 in the case of the example shown in FIG. 50 are allocated to the sub-unit E1 as shown in FIG. 51A and the faulty elements in the block S1 to the sub-unit E2 as shown in FIG. 51B. The same thing applies to the other blocks of the main block and the spare rows, too.

The faulty elements in the spare columns and the limbos are allocated commonly to all the sub-units.

Next, the sub-unit repair processing unit 1002 performs a repair process for each sub-unit to evaluate the repair solution (Step S1003). For this repair process, the structure described as the first embodiment or the modified example thereof can be used.

The repair solution evaluated here, is the information indicating the faulty lines and unusable spare lines in the respective sub-units (It is not practiced to allocate the address of an actual spare line to the address of a faulty line which needs a spare line).

Here, for each of the sub-units, a plurality of repair solutions are evaluated (The upper limit number is previously determined).

The repair solutions obtained for the respective sub-units are called candidate repair solutions. As the method of evaluating a plurality of repair solutions, there are considered various methods such as the method of repeatedly performing Steps S602 and S603 according to the first embodiment.

The repair processes for these respective sub-units may be performed in parallel or successively.

Further, in case there exits even one sub-unit which has turned out to be unrepairable, the processing unit concerned is decided as unrepairable.

Next, the repair solution composition processing unit 1003 composes the candidate repair solutions selected one by one from the respective sub-units, taking into consideration the spare set shared by the sub-units, and generates the repair solution of the processing unit concerned (Step S1004). Concerning this composition process of the candidate repair solutions of the sub-units will be described in detail later.

Next, the output processing unit 1004 outputs, in case the repair solution of the processing unit concerned exists, what results from converting the addresses of the repair solution; and in case no repair solution exists, the output processing unit 1004 outputs a message to the effect (Step S1005).

The repair solution outputted can be information indicating the faulty lines to be repaired in the processing unit concerned and the spare lines usable for the repair thereof or information specifying by which spare line and which faulty line is to be repaired.

Further, in case a line fail process is performed, for instance, a line fail process is performed for the inputted address data of the faulty elements of the processing unit as in the case of the first embodiment (Step S201 in FIG. 15), and, at Step S1003, a line fail process for each sub-unit (Step S202 in FIG. 15).

Several methods for composing the candidate repair solutions selected one by one from the respective sub-units will be described below. The main point of the composition of the candidate repair solutions is how to treat the spare lines shared by a plurality of sub-units. The way of selection and the search for an optimum repair solution will be described later.

A first example of the method of composing the candidate repair solutions will be described.

In this example, the spare columns are shared by the sub-units, so that the process is applied with reference to the spare columns.

First, candidate repair solutions are selected one each from the respective sub-units.

Next, the union of the spare columns which have turned out to be unusable in each of the selected candidate repair solutions (the union of the spare columns which have turned out to be unusable in at least one of the candidate repair solutions of the sub-units) is evaluated, and, from "the total number of spare columns", the number of the spare columns which have turned out to be unusable" is subtracted in each of the column blocks to evaluate the "remainder of spare columns". Further, in the selected candidate repair solutions, "the total number of faulty lines which need spare columns" is evaluated.

For instance, in case there are two sub-units, wherein the spare columns at the left side are designated as the first to the fourth (the total number is set to four), the first spare column turns out to be unusable in the first sub-unit, and in the second sub-unit, the second spare column turns out to be unusable, the union of the unusable spare columns at the left side are the first and second spare columns (that is, two spare lines), and the remainder of the usable spare columns at the left side is 4−2=2.

Further, for instance, in case there are two sub-units, wherein the spare columns at the left side are designated as the first to the fourth (the total number being four), and the first and third spare columns turn out to be unusable in the first sub-unit, while in the second sub-unit, the second and third spare columns turn out to be unusable, the union of the unusable spare columns at the left side is the first and third spare columns (that is, three spare lines), and the remainder of the usable spare columns at the left side is 4−3=1.

Next, with reference to each column block, the "remainder of spare columns" and the "total number of faulty lines which need spare columns" are compared with each other, so that, if the "remainder of spare columns" is larger than or equal to "the total number of faulty lines which need spare columns", it is decided that the compsite solution exists with respect to the combination of the candidate repair solutions concerned. On the other hand, if there is even one column block in which the "remainder of spare columns" is smaller, then it is decided that no compsite solution exists with respect to the combination of candidate repair solutions.

In generating the repair solution (in a wider sense) of the processing unit concerning from the combination of candidate repair solutions with respect to which it has been decided that the compsite solution exists, it should be noted that, as for the spare columns shared by the sub-units, the information indicating the spare columns left after the spare columns belonging to the union of unusable spare columns are excluded from all the spare columns which were made to be the repair target and the faulty lines which need spare columns becomes the solution.

As for the spare rows which are not shared by the sub-units, the contents of the candidate repair solutions of the respective sub-units can be directly used.

Further, in case, as the repair solution to be outputted, the information specifying by which spared by which faulty lines are to be repaired is outputted, it is sufficient to perform a spare allocation at the processing unit level.

Next, a second example of the method of composing the candidate repair solutions will be described.

The unused spare lines depend on the sub-units, so that there can exist such a spare line which has been determined to be unused in a certain sub-unit, but is not determined as unused in another sub-unit. The composition method according to the above-mentioned first example is advantageous in that the process is carried out fast, but there can be the case where, despite that the compsite solution exists, it cannot be evaluated.

Thus, in this example, the allocation of spare lines is performed successively with respect to each sub-unit.

First, candidate repair solutions are selected one from each of the sub-units.

Next, with respect to the first sub-unit, the faulty lines are repaired by the use of spare columns other than those spare columns which have been turned out to be unusable in the sub-unit concerned.

Next, with respect to the second sub-unit, the faulty lines are repaired by the use of spare columns other than those spare columns which have turned out to be unusable in the sub-unit concerned and those spare columns which have been used for repair in the first sub-unit and thus determined as unusable.

In case there are three or more sub-units, the faulty lines are repaired likewise in such a manner that those spare columns which have been used in the sub-unit last time or before that and those spare columns which have turned out to be unusable in the sub-unit concerned are determined as unusable.

With reference to a sub-unit in which no faulty line exists, the above-mentioned process need not be performed.

In the following description, attention is paid to only the spare columns at the left side; in case there are two sub-units, wherein the spare columns at the left side are designated as the first to the fourth (the total number being four), the first spare column turns out to be unusable in the first sub-unit, and there is one line to be repaired by the spare columns, a spare column other than the first spare column will be used. Here, it is to be assumed that the second spare column is used. Next, in case, in the second sub-unit, the third spare column turns out to be unusable, and there are two lines to be repaired by the spare columns, spare columns other than the third spare column and the second spare column which has been used in the first sub-unit are used. Here, it is assumed that the first and fourth spare columns are used. As a result, it follows that the compsite solution has been obtained with respect to the spare columns at the left side. With respect to the spare columns at the right side, a process is also performed in the same manner.

In case there is provided a constraint on the way of using the spare lines, and this constraint has not been taken into consideration at the steps preceding the evaluation of the candidate repair solutions of the sub-units, it is checked, in the composition of the candidate repair solutions, whether or not the repair solution of the processing unit satisfies this constraints.

Now, in the above, the composition process with respect to one combination of the candidate repair solutions has been described, and, in the following, the procedure of selecting one from among a plurality of combinations will be described.

Figure 56:
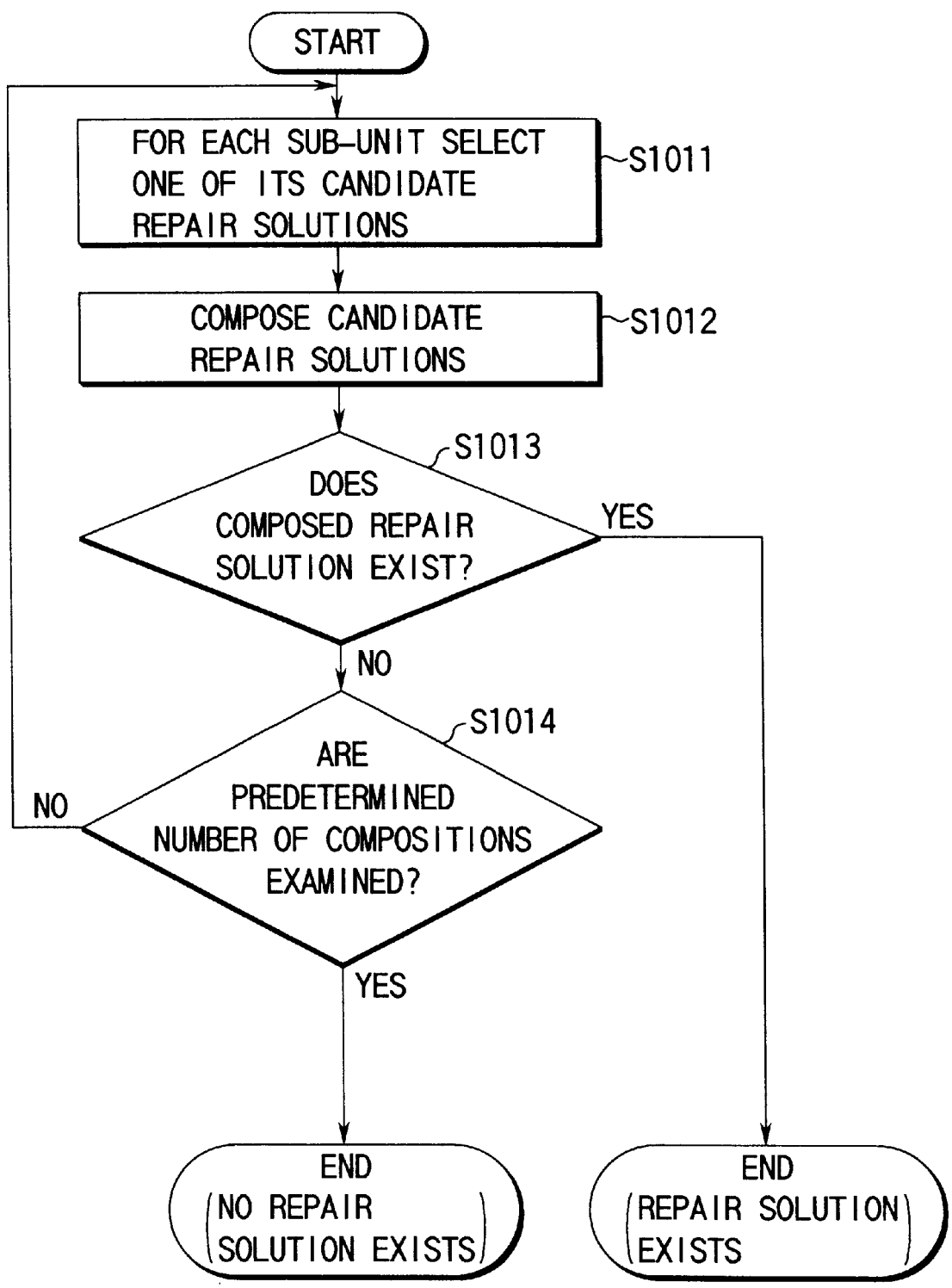
FIG. 56 is a flowchart showing an example of the procedure for the candidate repair solution composition processing according to the same embodiment.

FIG. 56 shows an example of the procedure for the composition process of the candidate repair solutions.

This procedure is composed so as to adopt, at the point of time when one repair solution of the processing unit is obtained, the combination thereof; from each of the sub-units, one candidate repair solution is selected (Step S1011), the repair solutions thus obtained are composed by such as process as mentioned above to decide whether or not the repair solution of the processing unit can be obtained (Step S1012); and, in case the repair solution is obtained (Step S1013), it is determined to adopt the repair solution, with which the process is terminated, while, in case such repair solution has not been obtained (Step S1013), the next combination is selected and the same processes are performed (Steps S1014, and S1011, S1012). In case, with reference to a prescribed number of combinations (the whole combinatorial number or a predetermined number smaller than it), the repair solution of the processing unit has not been obtained (Step 51014), it is determined that the memory block is unrepairable.

As the method for selection of candidate repair solutions, there are considered to be various methods such as, e.g., the method of selecting the candidate repair solutions at random, the method according to which those candidate repair solutions for using many spare rows respective sub-units are selected as preferentially as possible.

Figure 57:
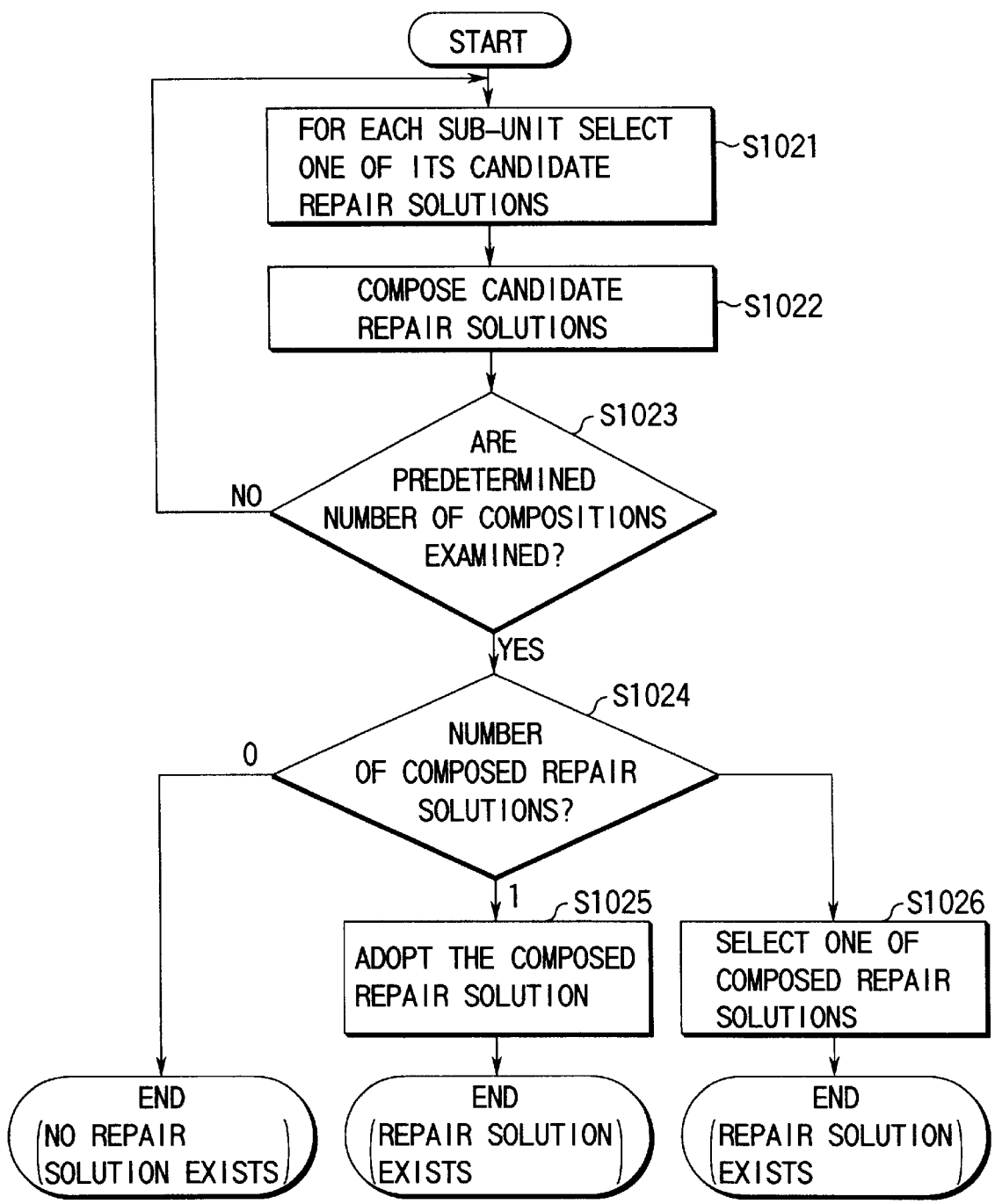
FIG. 57 is a flowchart showing a further example of the procedure of the candidate repair solution composition processing according to the same embodiment.

FIG. 57 shows an example of the procedure for the composite process of the candidate repair solutions.

This procedure is to search for the combination for bringing about an optimum solution of the processing unit from all or part of the combinations; according to this procedure, the series of processes, that is, the process of selecting one candidate repair solution from each of the sub-unit (Step S1021), and the process of composing the candidate repair solutions thus obtained to evaluate the candidate repair solution of the processing unit concerned or to decide that the memory block is unrepairable (Step S1022) are performed with reference to a prescribed number of combinations (the number of all combinations or a predetermined number smaller than the number), changing the combination of candidate repair solutions (Steps S1021, S1022 and S1023). In case one candidate which can become the repair solution of the processing unit concerned has been obtained (Step S1024), this candidate is adopted as the repair solution (Step S1025). In case two or more candidates which each can be the repair solution of the processing unit (Step S1024), the candidate which requires the least number of repair candidates is adopted as the best repair solution (Step S1026). In case there are a plurality of spare lines which each require the least number of spare lines used for the repair, one of them is selected by the use of another selection criterion or at random. In case no candidate which can become the repair solution of the processing unit could be obtained at all (Step S1024), the processing unit turns out to be unrepairable.

As the method of selecting a candidate repair solution from each sub-unit, there are considered to be various methods such as, e.g., the method according to which n candidate repair solutions are evaluated with respect to each of m sub-units to adopt all the $n^m$ types of combinations, and n candidate repair solutions are evaluated with respect to each of m sub-units, to select combinations smaller than the $n^m$ types of ones, and the method according to which n candidate repair solutions are evaluated with respect to each of m sub-units, and with respect to the portion of k (k<n) candidate repair solutions extracted in such a manner that the candidate repair solutions of the respective sub-units are extracted in the order starting from the candidate repair solution which requires the largest number of spare rows, all the combinations of the $k^m$ types are selected.

It is also possible to output a plurality of repair solutions of the processing unit and select, for instance at the repair apparatus side, one repair solution which is actually used.

In the above, an example in which the spare rows can be allocated in a sub-divided state, that is, an example in which the spare columns are shared by the sub-units, have been described, but the same applies to an example in which the spare columns are allocated in a sub-divided state, that is, an example in which the spare rows are shared by the sub-units (In the above description, it is sufficient to replace the spare rows and the spare columns by each other).

Further, to the case where the spare rows and the spare columns can be both alike allocated in a sub-divided manner, this method can be applied equally well.

Figure 58:
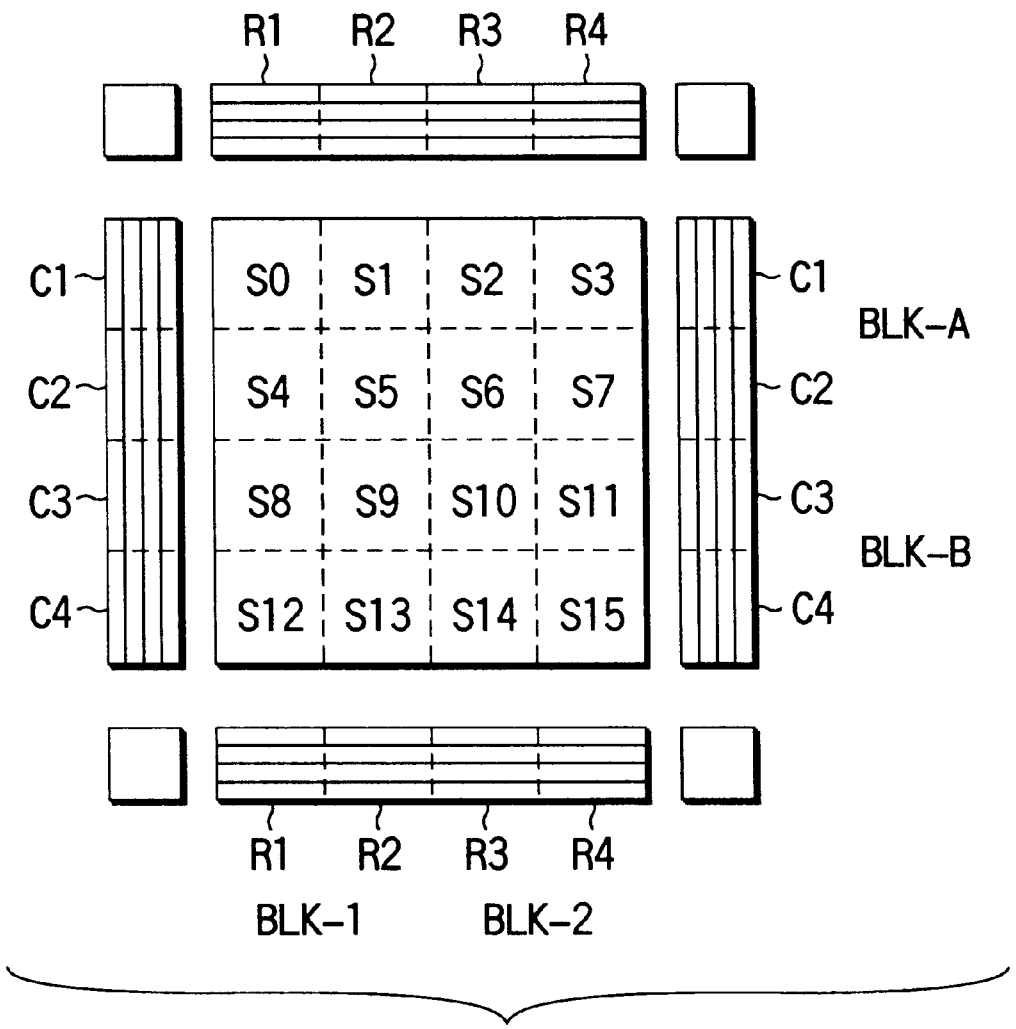
FIG. 58 is a drawing for explaining a processing unit which not in the basic form.
Figure 59A:
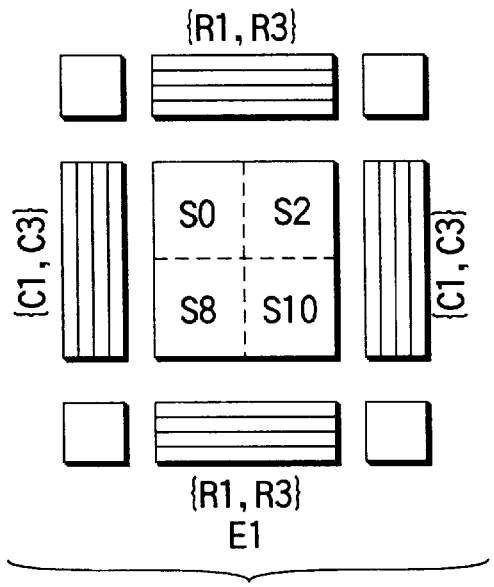
FIGS. 59A to 59D are diagrams for explaining the sub-units which are in the basic form.
Figure 59B:
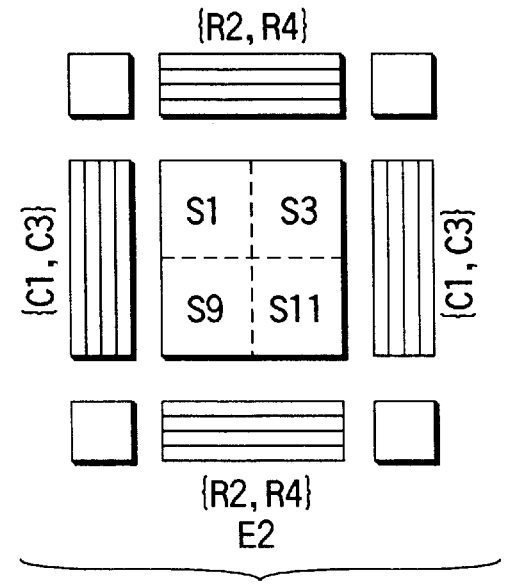
Figure 59C:
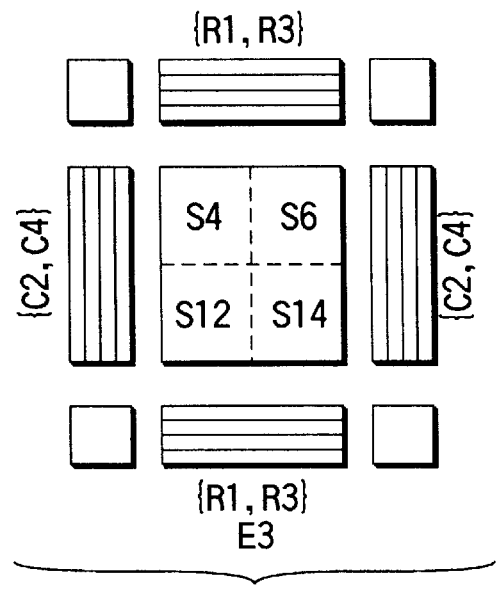
Figure 59D:
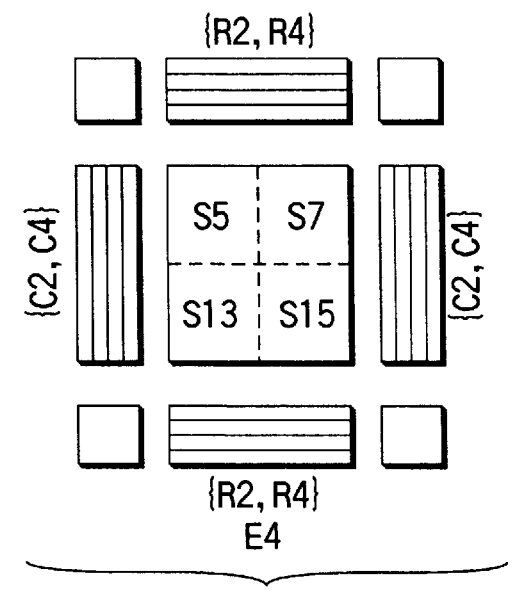

For instance, the arrangement of a memory block, spare lines and limbos shown in FIG. 58 results from applying the spare row arrangement shown in FIG. 50 to the spare columns, too. The arrangement shown in FIG. 58 is an example of the processing unit of the device in which the spare columns and the spare rows can be allocate in a sub-divided manner. That is, this example is the case where neither the spare columns nor the spare rows satisfy the condition that "each spare is allocated as one line".

In the example shown in FIG. 58, in a state surrounding the main block comprising 16 blocks S0 to S15, four spare columns are disposed at each of the right and left sides, four spare rows are disposed at each of the upper and lower sides, and necessary limbos are disposed (This example may either be actually arranged as shown in FIG. 58 or become as shown in FIG. 58 as a result of the address conversion).

The four spare columns at the left side are for the BLK-1, and the four spare columns at the right side are for the BLK-2. Further, the four spare rows at the upper side are for the BLK-A, and the four spare rows at the lower side are for the BLK-B.

Of the respective spare columns at the left and right sides, the portion corresponding to S0, S1, S2 and S3 is designated C1, the portion corresponding to S4, S5, S6 and S7 is designated as C2, the portion corresponding to S8, S9, S10 and S11 is designated as C3, and the portion corresponding to S12, S13, S14 and S15 is designated as C4. Of the respective spare rows at the upper and lower sides, the portion corresponding to S0, S4, S8 and S12 is designated as R1, the portion corresponding to S1, S5, S9 and S13 is designated as R2, the portion corresponding to S2, S6, S10 and S14 is designated as R3, and the portion corresponding to S3, S7, S11 and S15 is designated as R4.

As for the spare columns and the spare rows, it is to be understood that one spare is divided into four equal parts, and only part thereof can be used. Here, there is provided the constraint that the four sub-divided short spare lines must be used in interlocking with other short spare lines. There is the constraint that, for instance, in case {C1, C2, C3, C4} stand for the four short spare columns, {C1, C3} and {C2, C4} must each repair one and the same column address of the main block, and there is the constraint that the constraint in case {R1, R2, R3, R4} stand for the four short spare rows, {R1, R3} and {R2, R4} must each repair one and the same row address of the main block; in other words, the constraint that the short spare lines must be used in the state in which two of them which are every other one of them is put together into one spare (It substantially follows that one spare line is divided into two equal portions, and only part of them can be used).

In such a case, as in the case of the example shown in FIG. 50, the main block, the spare columns and the spare rows are divided into four portion in the vertical and horizontal directions by the use of the above-mentioned nature of "interlocking" and treated by dividing into four sub-units as shown in FIG. 59A to 59D. In this case, the short spare columns C1, C3 are shared by the sub-units E1 and E2; the short spare columns C2, C4 are shared by the sub-units E3 and E4; the short spare rows R1, R3 are shared by the sub-units E1 and E3; and the short spare rows R2, R4 are shared between the sub-units E2 and E4.

In the case of such a division, in each of the four sub-units, the relationship of correspondence that a spare repairs, as one line, a line of the main block is set, so that it is understood that the above-mentioned condition is satisfied, and the four sub-units each alike assumes the basic form.

Accordingly, even in case both of the spare columns and the spare rows do not satisfy the above-mentioned condition as in this case, the repair solution for the processing unit concerned can be obtained by dividing the processing unit into sub-units, evaluating a candidate repair solution with respect to each of the sub-units, and composing the candidate repair solutions thus obtained.

Figure 60:
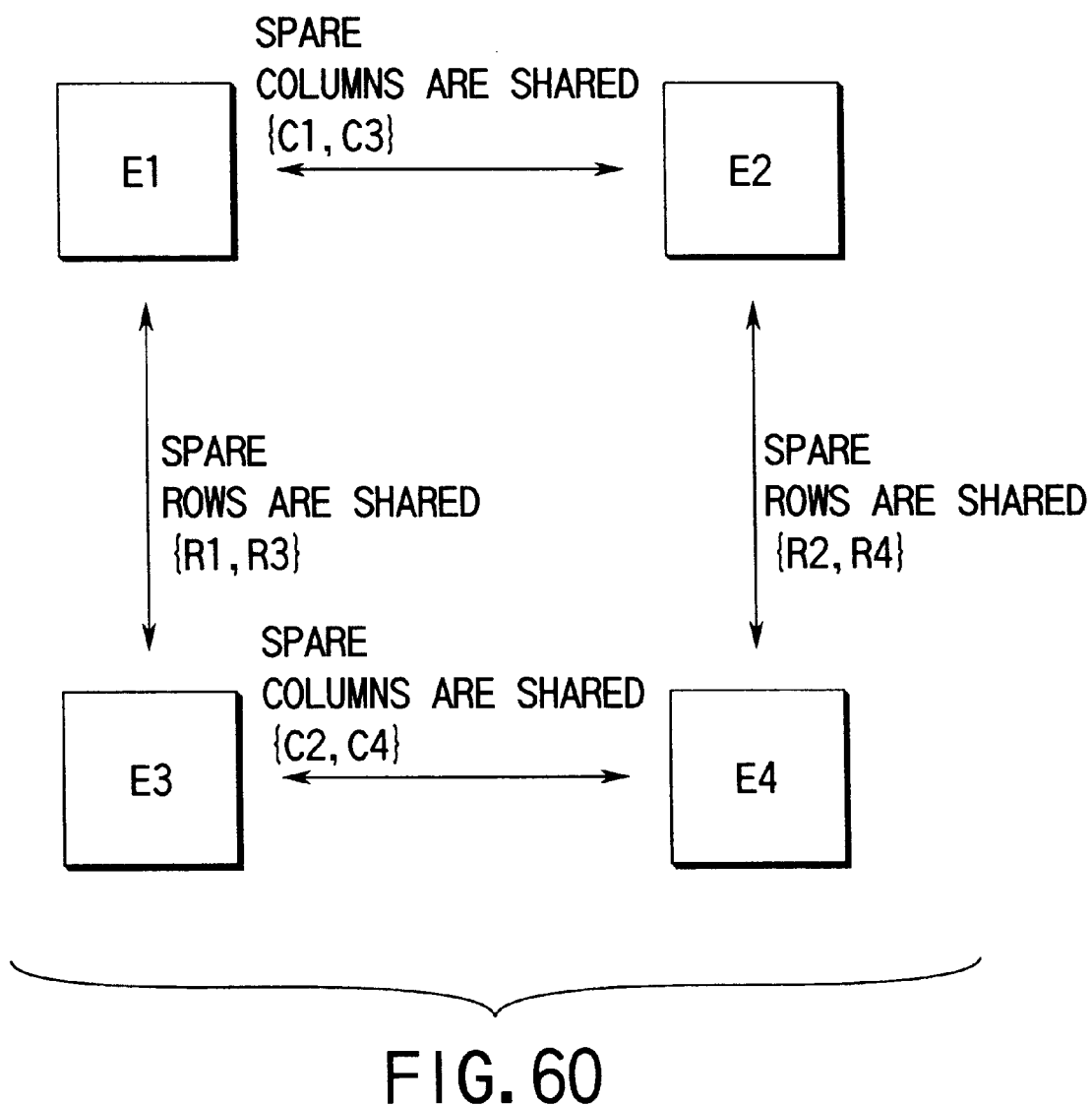
FIG. 60 is a diagram for explaining the spare set shared by the sub-units.

In this case, however, both of the spare columns and the spare rows are shared by a plurality of sub-units as shown in FIG. 60, so that, in composing the candidate repair solutions, a candidate repair solution composition as mentioned above is performed with respect to each of the spare columns and the spare rows.

The present embodiment has been described mainly concerning the process for one memory block within one chip of one semiconductor, but the structures, system arrangements, the structure for realizing the fault repair device by the use of software—which have been described above in connection with the process of one unit, the process of one wafer unit, and the process of one lot unit can be applied to the present embodiment.

The present invention is not limited to the above-mentioned embodiments, but can be variously modified.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A fault repair method comprising the steps of:
providing second memory cells as spare lines for repairing faulty elements of first memory cells for storing data therein,
setting virtual third memory cells with respect to a repair target including said first memory cells and said second memory cells; and
repairing the faulty elements of said first memory cells and said second memory cells by using said virtual third cells.

2. A fault repair method comprising the steps of:
providing spare lines and limbos for repairing faulty elements in a memory block;
setting virtual spare lines with respect to a repair target including said memory block, said spare lines, and said limbos; and
repairing the faulty elements of said memory block, said spare lines and said limbos by using said virtual spare lines.

3. A fault repair method comprising the steps of:
acquiring information indicative of the positions of faulty elements in a memory block, spare lines and limbos;
setting virtual spare lines with respect to a repair target including said memory block, said spare lines and said limbos;
evaluating through said virtual spare lines the repair solution for repairing the faulty elements in said memory, said spare lines and said limbos; and
evaluating a solution for repairing the faulty elements of said memory block by means of said spare lines and limbos on the basis of said repair solution.

4. The fault repair method according to claim 3, wherein
of said repair solution, every line of said memory block which has been repaired by said virtual spare line is set as a line to be repaired by a spare line; and
of said repair solution, the spare lines excluding said spare lines which have been repaired by said virtual spare lines are set as spare lines usable for repair.

5. The fault repair method according to claim 4, wherein the relationship of correspondence between the lines to be repaired in the memory block and the spare lines used for the repair thereof is determined on the basis of said setting.

6. The fault repair method according to claim 3, wherein, with reference to the case of evaluating said solution for repairing the repair target including said memory block, said spare lines and said limbos by the use of said virtual spare lines, the constraints corresponding to the constraints imposed on said spare lines are applied to said virtual spare lines, whereby said repair solution is evaluated.

7. The fault repair method according to claim 3, wherein, in the case of evaluating said repair solution,
a bipartite graph is formed, which expresses the position information specified by two coordinate elements of, row identifier data and column identifier data, with reference to all the faulty elements contained in said memory block, said spare lines and said limbos;
a DM decomposition of said bipartite graph is evaluated, and
on the basis of said DM decomposition, the relationship of correspondence between said virtual spare lines and the lines containing faulty elements in a repair target including said memory block, said spare lines and said limbos is evaluated.

8. The fault repair method according to claim 3, wherein, in the case of evaluating said repair solution,
a first process is performed in such a manner that a bipartite graph is formed which expresses the position information specified by two coordinate elements of, row identifier data and column identifier data, concerning all the faulty elements contained in said memory block, said spare lines and said limbos, a DM decomposition of said bipartite graph is evaluated, a contracted graph is calculated on the basis of said DM decomposition, and, on the basis of said contracted graph, said repair solution is evaluated; and
in case said repair solution has not been obtained through said first process, a second process is performed in such a manner that the position information of all the faulty elements contained in said memory block, said spare lines and said limbos, the constraints pertaining to the way of using said spare lines and the number of said spare lines, and the minimization of the number of said spare lines to be used are expressed in an integer programming problem, so that said repair solution is evaluated as an integer solution of said integer programming problem.

9. The fault repair method according to claim 8, wherein said integer programming problem is solved as a linear programming problem by relaxing the integer condition into the real number condition, and, in case an integer solution has been obtained, this is determined as the repair solution to be evaluated.

10. The fault repair method according to claim 3, wherein, in the case of evaluating said repair solution, the position information of all the faulty elements contained in said memory block, said spare lines and said limbos, the constraints pertaining to the way of using said spare lines and the number of said spare lines, and the minimization of said spare lines to be used are expressed in an integer programming problem, so that said repair solution is evaluated as an integer solution of said integer programming problem.

11. The fault repair method according to claim 10, wherein said integer programming problem is solved as a linear programming problem by relaxing the integer condition into the real number condition, and, in case an integer solution has been obtained, this is determined as the repair solution to be evaluated.

12. The fault repair method according to claim 3, wherein, in the case of evaluating said repair solution, a plurality of repair solutions are evaluated, and, of the thus evaluated repair solutions, the repair solution in which the number of spare lines to be used is minimum is determined as the repair solution to be evaluated.

13. The fault repair method comprising the steps of:

dividing a memory block into a plurality of subblocks;

dividing spare lines provided for repairing faulty elements in said memory block so as to correspond to said subblocks;

setting virtual third memory cells with respect to a repair target including first memory cells and second memory cells;

evaluating a candidate repair solution with respect to each of said subblocks; and composing said candidate repair solutions obtained with respect to each of said subblocks to generate the repair solution.

14. The fault repair method according to claim 13, wherein said subblocks each share a set of spare lines with at least one other subblock; and in the case of composing said candidate repair solutions of said respective subblocks, said repair solution is generated by taking into consideration the manner of sharing said spare line set between the plurality of subblocks.

15. The fault repair method according to claim 13, wherein, in the case of composing said candidate repair solutions, said repair solution is evaluated in such a manner that, concerning said spare line set shared between the plurality of subblocks, the sebset of lines of said spare line set determined to be unusable is determined as the set of unusable spare lines in said spare line set.

16. The fault repair method according to claim 13, wherein, in the case of composing said candidate repair solutions, said repair solution is evaluated in such a manner that the repair process of faulty elements in the memory block using spare lines other than the unusable spare lines is performed successively with respect to the respective subblocks, and further, in each of said process, the union of the spare lines which have been turned to be unusable in said candidate repair solution of the subblock concerned and the spare lines which have been used in the repair processes so far performed is determined as unusable spare lines in each of said subblocks.

* * * * *